(12) United States Patent
Yamaguchi et al.

(10) Patent No.: US 6,314,196 B1
(45) Date of Patent: *Nov. 6, 2001

(54) FINGERPRINT REGISTERING METHOD AND FINGERPRINT CHECKING DEVICE

(75) Inventors: Masahiko Yamaguchi; Yasuo Ooka; Naoya Uchida; Atsushi Ogawa; Kiyohide Taniguchi, all of Kawasaki (JP)

(73) Assignee: Fujitsu Denso Ltd., Kanagawa-Ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/813,627

(22) Filed: Mar. 7, 1997

(30) Foreign Application Priority Data

| Oct. 5, 1995 | (JP) | 7-258504 |
| Nov. 21, 1995 | (JP) | 7-302437 |
| Dec. 18, 1995 | (JP) | 7-328484 |
| Jan. 16, 1996 | (JP) | 8-004489 |
| Jan. 16, 1996 | (JP) | 8-004490 |
| Mar. 28, 1996 | (JP) | 8-073505 |

(51) Int. Cl.[7] .................................................. G06K 9/00
(52) U.S. Cl. ........................... 382/125; 382/115; 382/116; 382/119; 382/124
(58) Field of Search ............................ 382/115, 116, 382/125, 128, 124, 181, 209, 117, 118, 119

(56) References Cited

U.S. PATENT DOCUMENTS

| 4,083,035 | * | 4/1978 | Riganati et al. | 382/125 |
| 4,135,147 | * | 1/1979 | Riganati et al. | 382/125 |
| 4,817,183 | * | 3/1989 | Sparrow | 382/125 |

(List continued on next page.)

FOREIGN PATENT DOCUMENTS

| 64-26985 | 1/1989 | (JP) . |
| 1-211184 | 8/1989 | (JP) . |
| 4-320583 | 11/1992 | (JP) . |

(List continued on next page.)

OTHER PUBLICATIONS

International Search Report from Japanese Patent Office for PCT/JP96/02376 Nov. 1996 "Non–English".

Primary Examiner—Leo Boudreau
Assistant Examiner—Daniel G. Mariam
(74) Attorney, Agent, or Firm—Blackwell Sanders Peper Martin

(57) ABSTRACT

The present invention can achieve the reliability and simplicity in registering a fingerprint by indicating the quality of a fingerprint image by the number of pseudo minutiae, improve the security of an entrance/exit control system to register a fingerprint, detect the direction of ridge lines of a fingerprint accurately as much as possible, improve the security in checking a fingerprint remarkably, collect renewed registered fingerprint data by a host device and hold the registered fingerprint data of each gate as the latest fingerprint data, improve the operability by enabling to use identification numbers having the less number of digits, and register a fingerprint having a high match rate by automatically applying spatial filtering in re-registering only. A fingerprint registering method according to the present invention detects normal minutiae and pseudo minutiae in a fingerprint pictured by a fingerprint image pickup unit, counts pseudo minutiae in registering windows with normal minutiae at almost the center, determines the average number of pseudo minutiae in registering windows from a total of pseudo minutiae in all registering windows, and registers a fingerprint when the average number of pseudo minutiae is equal to or below a threshold.

3 Claims, 50 Drawing Sheets

U.S. PATENT DOCUMENTS

| | | | | |
|---|---|---|---|---|
| 4,947,442 | * | 8/1990 | Tanaka et al. | 382/125 |
| 5,109,428 | * | 4/1992 | Igaki et al. | 382/125 |
| 5,193,855 | * | 3/1993 | Shamos | 382/124 |
| 5,245,329 | * | 9/1993 | Gokcebay | 382/124 |
| 5,337,043 | * | 8/1994 | Gokcebay | 382/124 |
| 5,351,304 | * | 9/1994 | Yamamoto | 382/125 |
| 5,420,936 | * | 5/1995 | Fitzpatrick et al. | 382/124 |
| 5,493,621 | * | 2/1996 | Matsumura | 382/125 |
| 5,524,161 | * | 6/1996 | Omori et al. | 382/125 |
| 5,526,428 | * | 6/1996 | Arnold | 713/159 |
| 5,534,855 | * | 7/1996 | Shockley et al. | 340/825.3 |
| 5,552,766 | * | 9/1996 | Lee et al. | 382/124 |
| 5,555,314 | * | 9/1996 | Nakajima | 382/125 |
| 5,615,277 | * | 3/1997 | Hoffman | 382/115 |
| 5,659,626 | * | 8/1997 | Ort et al. | 382/125 |
| 5,661,451 | * | 8/1997 | Pollag | 382/124 |
| 5,680,471 | * | 10/1997 | Kanebako et al. | 382/128 |
| 5,796,857 | * | 8/1998 | Hara | 382/124 |
| 5,815,252 | * | 9/1998 | Price-Francis | 382/124 |

FOREIGN PATENT DOCUMENTS

| | | |
|---|---|---|
| 6-42242 | 2/1994 | (JP) . |
| 6-131446 | 5/1994 | (JP) . |
| 0 650 137 A2 | 4/1995 | (JP) . |
| 7-121712 | 5/1995 | (JP) . |
| 7-271981 | 10/1995 | (JP) . |
| PCT/JP96/02376 | 8/1996 | (JP) . |

* cited by examiner

FIG.21

Personal information file 81

| Item | Content |
|---|---|
| ID | ida |
| Name | OGAW |
| Post | GPRJ |
| Entrance room number | G1~Gn |

Fingerprint dictionary file 82

| ID | Registered fingerprint data | Time stamp |
|---|---|---|
| ida | RD1 | TS1 |
|  | RD2 | TS2 |

Possessed ID file 83

| Gate | ID |
|---|---|
| G1 | ida idb ide |
| G2 | ida idc |
| ⋮ | |
| Gn | ida idf |

FIG.31(A)
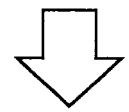
FIG.31(B)
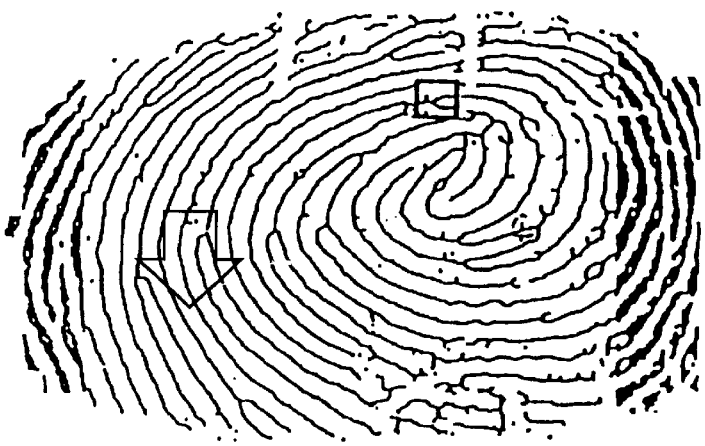
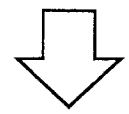
FIG.31(C)
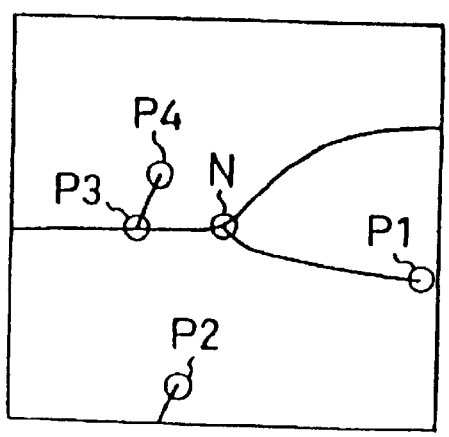

a b f

FINGERPRINT REGISTERING METHOD AND FINGERPRINT CHECKING DEVICE

BACKGROUND OF THE INVENTION

1. Field of the Invention

The present invention relates to a fingerprint registering method for registering a fingerprint by judging whether or not it has been registered and to a fingerprint checking device.

The present invention relates to a fingerprint registering method with security improved and to a fingerprint checking entrance/exit control system.

The present invention relates to a fingerprint checking method for extracting a fingerprint in the direction of ridge lines in registering and checking the fingerprint.

The present invention relates to a fingerprint checking method for checking a registered fingerprint and an affixed fingerprint to authenticate personal identification.

The present invention relates to a fingerprint checking entrance/exit control system for checking an affixed fingerprint and a registered fingerprint to control the permission or not of entrance.

The present invention relates to a fingerprint checking device for checking a registered fingerprint and an affixed fingerprint.

The present invention relates to a fingerprint registering method for a fingerprint checking device.

2. Prior Art

Fingerprint checking devices which check a registered fingerprint with an affixed fingerprint to authenticate personal identification have been put into practical use. And, the fingerprint checking devices are desired to easily register fingerprints with reliability.

As shown in FIG. 30, a conventional way of registering fingerprints judges whether or not fingerprinting for a fingerprint image pickup is for the first time (D1), if it is its first time, temporarily registers it (D2), if not its first time, judges whether or not it is the second time (D3), if it is its second time of fingerprinting, checks the temporarily registered fingerprint with the second affixed fingerprint (D4), judges whether or not they match (D5), if they match, formally registers (D6), and terminates normally. And, if they do not match, it is concluded as registration failure. In this case, registration processing can be repeated on another finger.

After binarizing a fingerprint shown in FIG. 31 (A), it is thinning-processed as shown in (B), and a registering window in a square frame is enlarged as shown in (C). In (C), N indicates a normal minutia, and P1 to P4 indicate pseudo minutiae. For example, a bifurcation point having a bifurcation length of a prescribed length of a ridge line and an ending point having a space of a prescribed length or more are determined as normal minutia, and a bifurcation point and an ending point under other conditions are determined as pseudo minutia.

In the above-described temporary registering and formal registering, registering windows each consisting of, for example, 36×30 picture elements with normal minutia N at almost the center is selected in the number of about 15 for example from a single fingerprint image and registered as shown in FIG. 31 (C).

Since fingerprints do not change, they are suitable for authenticating personal identification. And, a registered fingerprint and an affixed fingerprint are checked by a fingerprint checking device, and when they match, the pertinent fingerprint is judged as of a registered person. But, the fingerprint image pictured by a fingerprint image pickup unit changes largely depending on chaps, wrinkles, dirt and a fingerprinting pressure of a finger tip. Therefore, checking immediately after the temporary registering mostly results in matching, but there is a disadvantage that a matching rate is lowered sharply with a lapse of time.

FIG. 32 and FIG. 33 are explanatory diagrams of fingerprint images and thinning-processed images. (A) in the respective drawings shows pictured fingerprint images, and (B) shows images obtained by binarizing and thinning processing, and rectangles indicate registering windows. In FIG. 32, the fingerprint image is relatively good, and normal minutiae are easily extracted as shown in (B). But, in FIG. 33, the fingerprint has chaps and many pseudo minutiae as shown in (B), so that it is not easy to select registering windows.

The fingerprint shown in FIG. 33 is formally registered because it has a high possibility of matching when it is checked with a registered fingerprint immediately after the temporary registering. But, the states of chaps and wrinkles change with a lapse of time, and a match rate is sharply lowered accordingly. To avoid it, it is desirable to obtain a fingerprint image with good image quality as shown in FIG. 32, but it is hard to judge whether or not the fingerprint image is good at the time of registering a fingerprint excepting when the fingerprint image is heavily deteriorated such that mismatching results. Therefore, even when another finger is used to register a fingerprint in case of mismatching, it is impossible to judge which finger is best.

On the other hand, there is a known fingerprint checking entrance/exit control system which authenticates personal identification by fingerprint checking to allow the entrance or exit. It is demanded to improve the security of fingerprint registration in such a system.

FIG. 34 is an explanatory diagram of a system, in which reference numeral 261 denotes a fingerprint registering device, 262 a fingerprint checking unit consisting of a host computer, 263 a modem, 264 a private branch exchange (PBX), 265-1 to 265-n rooms such as an office, a computer room and a vault, 266-1 to 266-n fingerprint checking gates, and 267-1 to 267-n electric locks.

The electric locks 267-1 to 267-n are for unlocking the doors to the rooms 265-1 to 265-n, and the fingerprint checking gates 266-1 to 266-n are provided to correspond to the rooms 265-1 to 265-n and connected to the fingerprint checking unit through the private branch exchange 264. And, in a case of a small-scale fingerprint checking entrance/exit control system, the private branch exchange 264 and the modem 263 may be omitted, and the fingerprint checking gates 266-1 to 266-n and the fingerprint checking unit 262 can be connected by an LAN or the like.

The fingerprint checking gates 266-1 to 266-n each have a fingerprinting part, and read the affixed fingerprint to transfer to the fingerprint checking unit 262. The fingerprint checking unit 262 checks the fingers registered in the fingerprint registering device 261 with the transferred fingerprint, and transfers the checked result to the fingerprint checking gates through the private branch exchange 264. Otherwise, the fingerprint data registered in the fingerprint registering device 261 is transferred to the fingerprint checking gates 266-1 to 266-n to store in a storage device (not shown), a fingerprint checking unit similar to the fingerprint checking unit 262 is provided at the respective fingerprint checking gates 266-1 to 266-n, and the registered fingerprints can be checked with the affixed fingerprint at the respective fingerprint checking gates 266-1 to 266-n.

And, when the registered fingerprint matches with the affixed fingerprint, the fingerprint checking gate unlocks the electric lock to allow entrance, but when they do not match, the electric lock is not unlocked to prohibit the entrance. And, when the use of a computer is allowed by fingerprint checking, the computer can be used when the registered fingerprint matches with the affixed fingerprint and the electric lock is unlocked.

Therefore, a person who has registered his or her fingerprint can enter a room or use a computer without using an ordinary key when personal identification is authenticated by fingerprint checking. In such a case, by registering a fingerprint and a room as a pair, only specified persons are allowed to enter a specified room. And, it is possible to register a specified person to enter every room.

By registering the fingerprints of persons allowed to enter a room in the fingerprint registering device 261, only fingerprint registered persons can enter the room. To register a fingerprint, it is often that registering is permitted according to a password, or registering is allowed by using a registering key.

But, it is highly possible that a password is used by stealth unless its number of digits is increased, but when the number of digits is increased, it is troublesome to enter the password. And, in the case of using the registering key, there is a disadvantage that any person can register his or her fingerprint by using the registering key. Accordingly, the security of entrance to or exit from a room after registering a fingerprint can be retained fully, but the security at the time of registering a fingerprint is not sufficient. And, fingerprint checking to authenticate personal identification is to check an affixed fingerprint with a previously registered fingerprint, and it is generally configured that to register a fingerprint, minutiae of a fingerprint image obtained by picturing an affixed fingerprint are extracted as registered fingerprint data, the registered fingerprint data is stored in a file, and the affixed fingerprint image is binarized at the time of fingerprint checking and checked with the registered fingerprint data read from the file. To extract the minutiae, the fingerprint image is required to accurately show the ridge lines of the fingerprint, and various types of image processing methods have been proposed.

FIG. 35 is an explanatory view of a fingerprint checking device, in which reference 311 denotes a fingerprint image pickup unit, 312 a multivalued image capturing unit, 313 a fingerprinting judging unit, 314 a ridge line direction detecting unit, 315 a spatial filter, 316 a binarizing unit, 317 a minutia extracting unit, 318 a registering unit, and 319 a checking unit. The fingerprint image pickup unit 311 takes a picture of an affixed fingerprint by a CCD camera, the multivalued image capturing unit 312 converts an analog image into a multivalued digital image and stores in an image memory (not shown), and the fingerprinting judging unit 313 judges whether or not a fingerprint has been affixed based on the multivalued image.

At the time of registering a fingerprint, the fingerprint is affixed and pictured by the fingerprint image pickup unit 311, and captured as a multivalued image by the multivalued image capturing unit 312. Based on the multivalued image, it is judged by the fingerprinting judging unit 313 whether fingerprinting has been made or not, and when it is judged as fingerprinting, the multivalued image is binarized by the ridge line direction detecting unit 314. For example, with 16×16 picture elements as one block, division into respective blocks is made, the ridge line direction is detected for each block, and conversion into the multivalued image is made by the spatial filter 315. The spatial filter 315 determines a luminance average value of focused picture elements and multiple picture elements in the ridge line direction on a multivalued image captured by the multivalued image capturing unit 312, for example, and processing of determining the luminance of the focused picture element can be made with respect to the blocks.

The multivalued image processed by the spatial filter 315 is binarized in the binarizing unit 316, and based on the binarized image, minutiae such as bifurcation points of ridge lines are extracted in a prescribed number by the minutia extracting unit, and data containing the minutiae is stored as registered fingerprint data in the registering unit 318.

In checking a fingerprint, the fingerprint is affixed and pictured by the fingerprint image pickup unit 311, and captured as a multivalued image by the multivalued image capturing unit 312. Based on the multivalued image, it is judged by the fingerprinting judging unit 313 whether fingerprinting has been made or not, and when it is judged as fingerprinting, the multivalued image is binarized by the binarizing unit 316, the binarized image of fingerprint is checked with the registered fingerprint data read from the registering unit 318 by the checking unit 319, and a checked result output signal on matching or mismatching is sent to an unillustrated gate having an electric lock.

FIG. 36 is an explanatory diagram of dividing a pictured image into blocks, and when 512×512 picture elements are determined as one screen, division into 1024 blocks is made with 16×16 picture elements as one block, for example. And, $P_{1.1} \sim P_{1.256}$ denote the picture elements in the top left block, and $P_{1024.1} \sim P_{1024.256}$ denote the picture elements in the right bottom.

FIG. 37 is an explanatory diagram of judging the direction of picture elements. In the ridge line direction detecting unit 314 shown in FIG. 35, using a 3×3 picture element direction detecting mask and a pattern with its center as the focused picture element, the directions of the focused picture elements are determined as shown in D1 to D8. For example, pattern 1-1 and pattern 1-2 are judged as the same horizontal direction D1, and pattern 3-1 and pattern 3-2 are judged as the same 45-degree direction D3. And, if not belonging to 16 types of direction detecting mask patterns shown in FIG. 37, the direction of focused picture elements does not belong to any pattern. Therefore, the focused picture elements can be judged to belong to which of the eight directions D1 to D8 in this case, they will be one of eight directions indicated by 1 to 8 at right bottom of the drawing. And, each block is determined to have a direction that the number of picture elements in every direction in the block is maximum as the ridge line direction of the pertinent block.

FIG. 38 is a flowchart of a conventional example, in which a block number is initialized with m=1 (B-1). In other words, number m for 1 to 1024 is allocated with respect to 1024 blocks in the image shown in FIG. 36, and the block number m is determined as 1 for initialization. Then, with n=1 (B2), the picture element number n in the block is initialized. In other words, the number n for 256 picture elements in the image shown in FIG. 36 is allocated, and this picture element number n is determined as 1 for initialization.

Then, contents V1 to V8 of a totaling register for totaling the number of picture elements corresponding to respective directions 1 to 8 shown at the lower right of FIG. 37 are cleared to zero and initialized (B3). And, the direction of picture element $P_{m.n}$ (m=) 1~1024, n=1~256) is detected by using a direction detecting mask as described in connection with FIG. 37, +1 is added to Vx (x=1~8) corresponding to a matched direction (B4). And, it is judged whether or not n=256 (B5), and if n is not equal to 256, it is determined as n=n+1 (B6), then processing goes to step (B4). The above-described steps (B2) to (B6) correspond to histogram generation processing according to the direction in the block.

When n=256, processing on one block is completed, and it is determined as i=1 (B7), register No. i according to the direction is initialized, it is determined as Sm=0 (B8), and a direction component maximum value Sm is initialized. And, totaling register Vi and the maximum value Sm are compared to judge whether Sm<Vi (B9), and when Sm<Vi, it is determined as Sm=Vi (B10), and Dm=i (B11). In other words, the totaling register Vi is determined as the maximum value Sm, and direction No. i of the totaling register Vi is determined as direction No. Dm of the maximum value Sm.

When Sm is not smaller than Vi, or after step (B11), it is judged whether or not i=8 (B12). In other words, it is judged whether or not processing has been made on eight directions, and when i is not equal to 8, it is determined as i=i+1 (B14), and processing goes to step (B5). And, when i=8, it is judged whether or not m=1024 (B13). Namely, it is judged whether or not processing on all blocks has been completed, and if not completed, it is determined as m=m +1 (B15). And, block No. m is determined as an increment, and processing goes to step (B2). Therefore, at the end of processing, the maximum value Sm of the direction component of respective blocks is stored in a direction component maximum value storage register corresponding to block Nos. 1 to 1024, and direction No. Dm is stored in a direction storage register corresponding to block Nos. 1 to 1024.

FIG. 39 and FIG. 40 are explanatory diagrams of detecting a ridge line direction in a conventional example. In FIG. 39, (A) shows a schematic view of a multivalued image of a pictured fingerprint, and (B) shows a schematic view of a binarized image obtained by binarizing the multivalued image. Based on the binarized image, detection in the ridge line direction on each block described above results in (C). Based on the result detected in the ridge line direction of each block, the multivalued image shown in (A) is subject to the above-described spatial filtering, and the result is shown in FIG. 40 (D). It is apparent by comparing the multivalued image of (D) and the multivalued image of FIG. 39 (A) that chapped portions are connected. Therefore, when the multivalued image of (D) is binarized, it is changed as shown in (E). When the binarized image of (E) is compared with the binarized image of FIG. 39 (B), it is apparent that the binarized image of (E) is clear.

In detecting the direction of ridge lines of a fingerprint in the conventional example, the direction of each picture element in the block is detected, the number of picture elements corresponding to the direction in the block is determined, and the direction that the number of picture elements becomes maximum is determined as the ridge line direction in the block. And, as to the directions that the number of picture elements is same, one of them is selected. Therefore, when the number of picture elements is same in directions which are intersecting at right angles and one of them is selected, there is a disadvantage of having a possibility that the direction becomes opposite from the flow of the ridge lines. In other words, there is a disadvantage that the ridge line direction not complying with the flow of the ridge lines of the peripheral blocks is detected.

For example, as shown in FIG. 41 (A), in the ridge line direction pattern of each block, when a ridge line direction not complying with the flow of the ridge lines of the peripheral blocks is obtained like a block indicated by 321, it is changed by the spatial filtering to a multivalued image which is schematically shown in (B), then it is converted into a binarized image which is schematically shown in (C), and a bridge is produced between the ridge lines at a portion indicated by 322 which corresponds to the block 321. Therefore, there is a disadvantage that an error occurs when minutiae are extracted.

And, a system has been put into practical use which checks a registered fingerprint with an affixed fingerprint, and if they match, unlocks a door to allow the entrance or allows to operate equipment. By checking fingerprints, security can be improved as compared with the use of a physical key. In such a case, it is necessary to manage the registered fingerprints with reliability and to prevent misuse such as alteration of the registered fingerprints.

FIG. 42 is an explanatory diagram of a fingerprint checking system, in which reference numeral 411 denotes a fingerprint checking device, 412 a fingerprint reading unit, 413 a control unit, 414 a storage unit for storing registered fingerprint data, 420 a host computer, 421 a processor (CPU), 422 a bus, 423 a random access memory (RAM), 424 a read-only memory (ROM) for storing data or the like, 425 a hard disk drive (HDD) for storing a large volume of registered fingerprint data, 425*a* registered fingerprint data, 425*b* a data destruction checking code, 426 and 427 an interface (IF), 430 a card reader, and 431 an IC card for keeping registered fingerprint data.

The host computer 420 can be a personal computer, and the hard disk drive 425, which is now relatively inexpensive and small, has a large capacity and can store a large volume of fingerprint data. The storage unit 414 in the fingerprint checking device 411 is a programmable read-only memory (EEPROM, flash memory, etc.) and can store registered fingerprint data for scores of people or several hundred people. And, if necessary, the registered fingerprint data stored in the hard disk device 425 in the host computer 420 can be downloaded to the storage unit 414.

To check fingerprints in the fingerprint checking device 411, an identification number (ID) is entered. To enter the identification number, a keyboard or a ten-key which is not illustrated can be used, or a medium such as an ID card which stores an identification number (ID) can be used. And, registered fingerprint data corresponding to the identification number is read from the storage unit 414, the registered fingerprint data is compared with the fingerprint data of an affixed fingerprint read by the fingerprint reading unit 412 by the control unit 413, and if they match, control of unlocking or the like is made according to an output signal from the control unit 413.

It is also possible to store the registered fingerprint data in the IC card 431. By reading the IC card 431 by the card reader 430, the registered fingerprint data can be transferred to the fingerprint checking device 411 through the host computer 420 and checked with data of an affixed fingerprint. The registered fingerprint data is configured by taking a picture of the affixed fingerprint, binarizing it, extracting a plurality of minutiae such as bifurcation points owing to the ridge lines of the fingerprint, determining each minutia as made of multiple picture elements, and using binarized data rows of the respective minutiae.

To check that data in a file having the registered fingerprint data is not destroyed, the data destruction checking code 425*b* is added to the registered fingerprint data 425*a*. By this data destruction checking code 425*b*, a total value, exclusive-OR or scrambled value of generating polynominal is used for all data contained in the file, and if the data stored in the file is changed even by one bit, this one bit change can be detected based on the data destruction checking code 425b. But, if the contents of the file are totally exchanged, detection cannot be made.

As shown in FIG. 42, the registered fingerprint data is stored in the storage unit 414 of the fingerprint checking device 411, stored in the hard disk drive 425 in the host computer 420 connected to the fingerprint checking device 411, or stored in a medium such as the IC card 431 or an optical card using a magneto-optical record medium.

Where the registered fingerprint data is stored in the fingerprint checking device 411, and if it is exchanged with another fingerprint checking device having other fingerprints stored according to the identification number identical to the identification number (ID) stored in the formal fingerprint checking device, all operation on the system side is not different, the registered fingerprint data is exchanged, and if another fingerprint is affixed using the same identification number (ID) as before, checking results in matching.

Where the fingerprint data is stored in the hard disk derive 425 in the host computer 420, the data file in the hard disk drive can generally be operated freely. For example, the registered fingerprint data file can be replaced by another file having different data with the same file name. Therefore, if some person who is not formally registered attempts to register his or her fingerprint in another system and the registered fingerprint data is reloaded by such registered fingerprint data, a person who is not formally registered can use the system illegally.

Where the registered fingerprint data is stored in a portable medium such as an IC card or optical card, the registered fingerprint data can be reloaded, so that misuse can be made in the same way as described above.

Accordingly, it is thought to insert a key number with respect to respective registered fingerprint data. The key number is inserted at a given byte of the registered fingerprint data, the byte number and the key number are made confidential, and the key number is stored so that the formally registered persons are not revealed. Even if the registered fingerprint data is exchanged, misuse cannot be made because the key numbers of the formally registered persons are also changed. But, as shown in FIG. 43, if the same key number is used to repeatedly register fingerprints, registered fingerprint data A, B and C become different owing to the positional change of minutiae and change of data rows of minutiae.

Accordingly, when registered fingerprint data A, B and C are read from the registered fingerprint data storage file and checked, the key number at the x-th byte from the leading address of respective registered fingerprint data A, B and C matches, and other areas do not match because they have a random property. In other words, it can be identified that the x-th byte where matching is obtained is where the key number is inserted. Thus, the key number can be read from the registered fingerprint data of the formally registered persons, so that misuse can be made.

And, a fingerprint checking entrance/exit control system has been proposed to authenticate personal identification by checking fingerprints, thereby allowing the entrance to a predetermined room or the like. And, such a fingerprint checking entrance/exit control system is desired to have an improved fingerprint checking accuracy.

FIG. 44 is an explanatory diagram of a fingerprint checking entrance/exit control system, in which a host device 531, a plurality of gates 532-1 to 532-n, and a given number of fingerprint registering devices 537-1 to 537-m are connected by a line 533 of a local area network (LAN), the respective gates 532-1 to 532-n have fingerprint checking units 540-1 to 540-n and electric locks 541-1 to 541-n, an affixed fingerprint is checked with the registered fingerprints in the fingerprint checking unit, and when personal identification is authenticated, an unlocking signal is given to the electric lock to release it. And, reference numeral 534 denotes a fingerprint registering unit, 535 a control unit, 536 a printer for outputting a list of registered persons, a list of setting or the like, 538-1 to 538-m control units, and 539-1 to 539-m fingerprint registering units.

To register a fingerprint by the fingerprint registering units 534, 539-1 to 539-m, personal information containing entrance allowing information such as name, identification number, post and room number in which he or she wants to enter is entered. The personal information and registered fingerprint data are stored in a file (not shown) in the host device 531. And, the personal information and registered fingerprint data are downloaded to the gate in conformity with the entrance allowing information. In this case, desired registered fingerprint data can be downloaded according to the demand from the gate.

When personal identification is authenticated by checking the registered fingerprint data with the affixed fingerprint, it is known that the registered fingerprint data is renewed by the affixed fingerprint data, and the registered fingerprint data is controlled as if it is obtained by the latest fingerprint registering operation. And, it is known that when first and second registered fingerprint data are stored, the affixed fingerprint is checked with the first registered fingerprint data and personal identification cannot be authenticated, the affixed fingerprint is checked with the second registered fingerprint data, and if personal identification cannot be authenticated yet, it is determined as a mismatch; but if personal identification can be authenticated, the second registered fingerprint data is renewed by the affixed fingerprint data (e.g., Japanese Patent Laid-Open Publication No. Sho 63-301376). By such a method, the probability of authenticating personal identification by the second fingerprint checking is improved, and the registered fingerprint data is renewed when the personal identification is authenticated, so that the latest registered fingerprint data can be used to check fingerprints.

As described above, the fingerprint checking entrance/exit control system is generally provided with the fingerprint checking units 540-1 to 540-n in the respective gates 532-1 to 532-n to check the fingerprints in a distributed manner. Therefore, when the above-described registered fingerprint data is renewed at the respective gates 532-1 to 532-n, the registered fingerprint data at the gate with a high frequency of use becomes the latest fingerprint data, a mismatch of the renewed registered fingerprint data at the respective gates occurs depending on the frequency of use, and the accuracy of authenticating personal identification is variable depending on the gates.

And, the fingerprint data stored in the host device 531 is the first one at the time of registering the fingerprint, and when entering a room after a long period since the fingerprint was registered in a gate determined according to the entrance allowing information, the registered fingerprint data is downloaded from the host device 531. But, since the fingerprint data is not latest, it is highly possible that checking results in a mismatch. Since it is thought that the fingerprint is one and only and not variable, it is used to authenticate personal identification, but it changes to some extent, and a state of the fingerprint face or the fingerprinted position varies every time fingerprinting is made, but the fingerprint data at the time of registering fingerprints is not always optimum. Therefore, by using the affixed fingerprint data with the conditions according to which personal identification can be authenticated at every fingerprinting for the next time, the checking probability can be improved, but as described above, there is a disadvantage that the registered fingerprint data not renewed is remained in the host device 531.

And, a fingerprint checking device has been put in practical use which configures a file with the identification number entered at the registration of fingerprints and the registered fingerprint data corresponded, and checks the registered fingerprint data read from the file based on the identification number entered for checking fingerprints with the affixed fingerprint to authenticate personal identification. And, improvement of operability of such a fingerprint checking device is demanded.

A system is known to control entrance/exit by checking fingerprints, and to register a fingerprint, personal information such as identification number, name, post, attribute and desired room number is entered, and a fingerprint is affixed. And, to enter a room, identification number is entered into the fingerprint checking device, and a fingerprint is affixed. The fingerprint checking device reads the registered fingerprint data from a file according to the entered identification number, checks it with the affixed fingerprint to authenticate personal identification, and if personal identification can be authenticated, releases the electric lock of the door to allow to enter.

Identification numbers for various systems are allocated without overlapping. For example, when a single fingerprint checking device in the entrance/exit control system can register fingerprints for 480 persons, by providing 32 fingerprint checking devices, in other words, if there is 32 rooms, 15360 persons can register a fingerprint. And, to allocate the identification number to these 15360 persons without overlapping, at least five digits are required. And, a larger-scaled entrance/exit control system may need the identification number of six digits or more.

Therefore, to enter a room, an identification number of five digits or six digits must be entered into the fingerprint checking device. Even if a fingerprint can be checked in a short time, the entrance of an identification number takes a long time, and the fingerprint checking device for a room where entrance and exit are frequent is particularly poor in operability.

And, the fingerprint checking device checks the previously registered fingerprints with a newly affixed fingerprint to authenticate personal identification, and the registered fingerprint is made by storing an area containing respective minutiae corresponding to a plurality of minutiae in multivalued image data obtained from a pictured fingerprint into a registration file. And, the binarized image data obtained by picturing an affixed fingerprint at checking the fingerprint is compared with respective areas of the binarized image data containing the minutiae read from the registration file, and if areas in prescribed number or more match, it is determined as a match. Accordingly, to improve the fingerprint checking accuracy, it is demanded to register fingerprints having a desired accuracy.

The fingerprint has two minutiae of an ending point and a bifurcation point of ridge lines, and most of fingerprint checking devices store the minutiae as registration data in the registration file. For the fingerprint registration, the multivalued image data obtained by picturing an affixed fingerprint is binarized, the binarized image data is thinning-processed, the ridge lines thinning-processed are extracted with the ending points and the bifurcation points as the minutiae, the binarized image data areas are cut out according to coordinate information of the minutiae, and they are stored as the registered data in the registration file.

FIG. 45 is an explanatory diagram of a fingerprint checking device, in which reference numeral 601 denotes an affixed fingerprint image pickup unit, 602 a data processing unit, 603 a bus, 604 a processor (CPU), 605 an interface (IF), 606 a read-only memory (ROM) storing a program, 607 a multivalued image memory, 608 a binarized image memory, 609 a binarized image save memory, 610 a thinning-processed image memory, 611 a minutia list memory, and 612 a nonvolatile memory for registered data. The processor 604 controls the respective units connected through a bus 603 and has a function of processing the image data.

The affixed fingerprint image pickup unit 601 comprises a fingerprinting stand on which a fingerprint is affixed, a lighting source, a CCD camera, a display, and an input operation unit such as a ten-key which are unillustrated. To register a fingerprint, information of an ID number and a password and a fingerprint registering request are entered through the input operation unit, a fingerprint is affixed onto the fingerprinting stand, and the affixed fingerprint is pictured by the CCD camera. A signal of the fingerprint image pictured by the affixed fingerprint image pickup unit 601 is A/D converted by the interface 605 into multivalued image data.

The memories 607 to 611 in the data processing unit 607 are cleared by initializing. And, the multivalued image data which was A/D-converted by the interface 605 is written into the multivalued image memory 607, the multivalued image data in the multivalued image memory 607 is binarized by the data processing function of the processor 604 and written into the binarized image memory 608.

The binarized image data in the binarized image memory 608 is copied and saved into the binarized image data save memory 609. And, the content of the binarized image memory 608 is subjected to thinning processing. In other words, the ridge lines of the fingerprint are changed into thin lines. The thinning-processed image data is written into the thinning-processed image memory 610. Based on the thinning-processed image data in the thinning-processed image memory 610, the minutiae of the ending points and bifurcation points are extracted, and coordinate information of the minutiae is written into the minutia list memory 611. When the number of minutiae is a prescribed number or more, images of minutiae are cut out of the binarized image save memory and stored into the nonvolatile memory 612 for registration data together with an ID number and a password.

To check a fingerprint, an ID number and a password are entered through the input operation unit of the affixed fingerprint image pickup unit 601, the fingerprint is affixed, and it is pictured. The fingerprint image signal is stored in the multivalued image memory 607 as multivalued image data in the same way as registering a fingerprint. And, the processor 604 examines the entered ID number and password, and if normal, the registered fingerprints are read from the nonvolatile memory 612 for registering, and based on the registered fingerprint in an area containing the minutiae, checked with the entered fingerprint, and if the number of matched points is equal to or more than a prescribed number, it is determined that personal identification was authenticated.

FIG. 46 is an explanatory view of a binarized image of a fingerprint, which is obtained by digitizing the analog image signal of the affixed fingerprint pictured, the multivalued image data is temporarily stored in the multivalued image memory 607 as described above, and the multivalued image data is binarized. In the binarized image state, since it is not easy to extract the ending point a or the bifurcation point b, the ridge lines are changed into thin lines. FIG. 47 shows an image having thin lines, and the ending point a and the bifurcation point b can be extracted easily by processing with a processor.

If the fingerprint image in the affixed fingerprint state is not good, for example, if the ridge lines are seen in a separated form despite that the ridge lines in the binarized image are continuous as indicate by c in FIG. 48(A), when the minutiae are extracted after thinning processing, the extraction is made with such separated points as the ending points.

In this case, since the coordinates of the minutiae are close, it is known to delete the minutiae, which are close in a certain range or 0.5 mm or below, as pseudo minutiae from the minutia list. Thus, the minutiae due to the separated points of the ridge lines indicated by c in FIG. 48(A) are deleted as pseudo minutiae.

When such pseudo minutiae are deleted, normal minutiae are also deleted when they are mutually close, and the number of minutiae to be registered in the minutia list is decreased. When the binarized image of FIG. 48(A) is changed into thin lines and the minutiae are extracted, the minutiae more than the extracted number of minutiae of the relatively good binarized image as shown in FIG. 46 can be extracted, but when pseudo minutiae are deleted, the remaining minutiae are decreased, and a desired number of minutiae may not be obtained. In registering a fingerprint, a prescribed number or more of minutiae are required, so that the registering process may fail by the pseudo minutia deleting process, and registering is made again.

Accordingly, for a blurred fingerprint like the binarized image of the fingerprint as shown in FIG. 48(A), it is known to effect the spatial filtering to connect the minutiae of the ridge lines. As a result, the binarized image as shown in FIG. 48(B) is obtained. When the binarized image is changed into thin lines, the normal minutiae only remain, and minutiae in a prescribed number or more can be extracted.

For a blurred fingerprint, even when pseudo minutiae are deleted by the spatial filtering, the number of normal minutiae becomes a prescribed number or more, a failing possibility in the registering process is lowered, and as compared with a case of registering with the pseudo minutiae included, the checking rate in fingerprint checking is improved. But, when the fingerprint image has good quality and the spatial filtering is made, a possibility of converting the pseudo minutiae into the normal minutiae is high.

For example, the binarized image of the fingerprint shown in FIG. 49(A) has relatively good quality, and when the spatial filtering is made when there is a crack as indicated by d, the binarized image shown in (B) is obtained, the crack indicated by d in (A) is converted into a normal minutia as indicated by e in (B) and registered.

FIG. 50(A) shows a multivalued image of a fingerprint having large cracks, and (B) shows a multivalued image which has through the spatial filtering, and f shows a state that cracks have continued. And, when a fingerprint is checked, the spatial filtering is not applied to the fingerprint image data to check with the registered fingerprints, and the match rate of the fingerprint is high when the normal minutiae having a crack are registered than when the pseudo minutiae are registered, and it becomes higher when the normal minutiae without any crack are registered. In other words, there are cases that the match rate of fingerprints can be improved by the spatial filter processing and the match rate cannot be improved.

SUMMARY OF THE INVENTION

It is an object of the present invention to achieve the reliability and simplicity of registering a fingerprint by indicating the quality of a fingerprint image by the number of pseudo minutiae.

It is another object of the present invention is to improve security of a fingerprint checking entrance/exit control system in registering a fingerprint.

It is still another object of the present invention to detect the direction of ridge lines of a fingerprint accurately as much as possible.

It is also another object of the present invention to remarkably improve security in checking a fingerprint by remedying various disadvantages.

It is another object of the present invention to collect renewed registered fingerprint data by a host device and hold the registered fingerprint data of each gate as the latest fingerprint data.

It is another object of the present invention to improve the operability by enabling to use identification numbers having the number of less digits.

It is another object of the present invention to register a fingerprint having a high match rate by automatically applying spatial filtering in re-registering only.

A fingerprint registering method according to the present invention detects normal minutiae and pseudo minutiae of a fingerprint pictured by a fingerprint image pickup unit, counts the pseudo minutiae in registering windows with the normal minutiae at almost the center, determines the average number of pseudo minutiae in registering windows from a total of pseudo minutiae in all registering windows, and registers the fingerprint when the average number of pseudo minutiae is equal to or below a threshold.

The fingerprint registering method according to the invention, when the average number of pseudo minutiae in registering windows exceeds the threshold, instructs to register another fingerprint, and sequentially changes fingers to register until a fingerprint with the average number of pseudo minutiae in registering windows equal to or below the threshold is obtained.

The fingerprint registering method according to the invention, when the average number of pseudo minutiae in registering windows exceeds the threshold, instructs to register another fingerprint, selects a finger having the minimum average number of pseudo minutiae as the best finger, and registers the fingerprint of the best finger.

A fingerprint checking device according to the present invention comprises a fingerprint image pickup unit, an image processor unit for thinning processing a pictured image by the fingerprint image pickup unit, a minutia detecting unit for detecting normal minutiae and pseudo minutiae from the thinning-processed image from the image processor unit, an average pseudo minutia calculating unit for calculating the average number of pseudo minutiae in all registering windows by counting the pseudo minutiae in the registering windows with the normal minutiae at almost the center, a registering unit for registering a fingerprint, a judging unit for comparing the average number of pseudo minutiae from the average pseudo minutia calculating unit with a threshold to register the fingerprint in the registering unit when the average number of minutiae is equal to or below the threshold, a display unit for showing the average number of pseudo minutiae from the average minutiae calculating unit or information which corresponds to the average number of pseudo minutiae, and a checking unit for checking the fingerprint registered in the registering unit with the fingerprint pictured by the fingerprint image pickup unit.

In the fingerprint registering method according to the invention, the judging unit displays on the display unit instructions for registering another finger when the average number of pseudo minutiae exceeds the threshold, selects a finger having the minimum average number of pseudo minutiae as the best finger when the average number of pseudo minutiae of all fingers exceeds the threshold, and registers the fingerprint of the best finger in the registering unit.

In the fingerprint registering method according to the present invention, the normal minutiae and pseudo minutiae of a fingerprint are detected, and the pseudo minutiae in registering windows with the normal minutiae at almost the center are counted. And, the average number of pseudo minutiae in registering windows is determined by totaling pseudo minutiae in all registering windows and dividing the total by the number of registering windows. When the average number of pseudo minutiae is smaller, the quality of the fingerprint image is better, and when the average number of pseudo minutiae is equal to or below the threshold, it is judged that the pictured fingerprint image is good, and registering is effected. In this case, the formal registering can be effected after temporarily registering and checking by the second fingerprinting.

In the fingerprint registering method according to the invention, when the average number of pseudo minutiae in the registering windows exceeds the threshold, it is indicated that the quality of the fingerprint image is not good. Therefore, as to five fingers for example, the fingerprint image pickup is repeated with the fingers changed successively until the average number of pseudo minutiae becomes equal to or below the threshold, and a finger which has a good image quality can be registered.

In the fingerprint registering method according to the invention, when fingerprint registering is sequentially effected on all fingers and the average number of pseudo minutiae of all fingers exceeds the threshold, the fingerprint image quality of a finger which has the minimum average number of pseudo minutiae can be judged to be best, and the pertinent finger is selected as the best finger and its fingerprint is registered.

In the fingerprint checking device according to the invention, the fingerprint image pickup unit takes a picture of a fingerprint affixed on an image pickup face by a CCD camera or the like, the image processor unit binarizes the fingerprint image and thinning-processing it, and the minutiae detecting unit detects the normal minutiae such as bifurcation points and ending points and the pseudo minutiae such as pseudo bifurcation points and pseudo ending points. The average pseudo minutia calculating unit counts pseudo minutiae in the registering windows with the normal minutiae at almost the center, adds up the pseudo minutiae in all registering windows, and divides the total by the number of registering windows to determine the average number of pseudo minutiae in the registering windows.

In the fingerprint checking device according to the invention, the judging unit, when the average number of pseudo minutiae is equal to or below the threshold, judges that the fingerprint image has a good image quality and registers the pertinent fingerprint in the registering unit. And, the display unit shows the average number of pseudo minutiae or information related thereto and can indicate the fingerprint image quality in a numerical value. And, the checking unit checks the registered fingerprints with a fingerprint pictured by the fingerprint image pickup unit.

In the fingerprint checking device according to the invention, the judging unit, when the fingerprint image quality is not good and the average number of pseudo minutiae exceeds the threshold, shows the instructions for registering another finger on the display unit. Accordingly, operation is effected to register another finger and done on all fingers, and when the average number of pseudo minutiae of all fingers exceed the threshold, registering is rejected, or it is judged that the fingerprint image quality of a finger which has the minimum average number of pseudo minutiae is judged to be best, and the pertinent finger is selected as the best finger and its fingerprint can be registered in the registering unit.

A fingerprint registering method according to the invention registers fingerprints of a prescribed number of at least two supervisors in a fingerprint registering device by using a fingerprint registering key, and a person who is to register a fingerprint registers the affixed fingerprint in the fingerprint registering device by means of the fingerprint registering key and the registering permission according to the matching of the fingerprint of at least one of the prescribed number of supervisors who have registered their fingerprints.

The fingerprint registering method according to the invention, when the fingerprint is registered in the fingerprint registering device, also registers an attribute defining an accessible range of persons who register fingerprints, and can renew or delete the fingerprints or the attribute registered in the fingerprint registering device by means of the fingerprint registering key and the registration permission by matching of the fingerprints of the supervisors who have registered their fingerprints.

The fingerprint registering method according to the invention, when the registered fingerprints of the supervisors are required to be deleted or the attribute is required to be changed, rejects the deletion requirement or the attribute change requirement if the deletion or the attribute change results in that the remaining number of supervisors who have registered fingerprints becomes one or below the prescribed number.

A fingerprint checking entrance/exit control system according to the invention comprises a fingerprint registering device for registering a fingerprint and an attribute of a fingerprint-registering person, a fingerprint checking unit for checking the fingerprints registered in the fingerprint registering device with the affixed fingerprint, a fingerprinting unit, and fingerprint checking gates containing a control unit for controlling to unlock according to the attribute and the result obtained by checking the fingerprint affixed on the fingerprinting unit and the fingerprint registered in the fingerprint registering device, wherein the fingerprint registering device registers a fingerprint by fingerprint registering operation by means of a fingerprint registering key and the allowance of registering by checking of the fingerprint of at least one supervisor.

The fingerprint checking entrance/exit control system according to the invention provides the functions of the fingerprint registering device on at least one of fingerprint checking gates to share the structure of at least fingerprinting unit.

A fingerprint checking method according to the invention for binarizing a multivalued image obtained by picturing an affixed fingerprint into a binarized image, dividing the binarized image into a plurality of blocks, determining the direction of ridge lines in respective blocks, effecting spatial filtering of the multivalued image along the ridge line direction, and binarizing to extract minutiae; wherein respective picture elements in the respective blocks are detected by using a direction detecting mask made of 3×3 picture elements to find which of a plurality of directions they belong, the number of picture elements in each of the plurality of directions is determined, the number of picture elements in the respective directions is converted into a vector, the maximum value in values obtained by adding respective direction components on respective vectors is detected, and a direction corresponding to the vector showing the maximum value is judged to be the ridge line direction of the block. For example, directions which mutually intersect at right angles are converted into vectors which mutually counteract, and direction components are determined on the respective vectors and added up, so that mutual cancellation is made when the number of picture elements in the directions to intersect at right angles is same. Therefore, detection is not made in the direction of ridge lines opposite to the flow of ridge lines.

After detecting the ridge line direction of the each block, the average in the ridge line direction of a focused block and a plurality of blocks around the focused block is determined to judge as the ridge line direction of the focused block.

A fingerprint checking method according to the invention registers registering fingerprint data derived from extraction of minutiae from a fingerprint, checks the registered fingerprint data with fingerprint data for checking an affixed fingerprint, and authenticates personal identification depending on if they match, wherein a conversion key number is produced by a previously defined function from an entered key number and the content at a prescribed byte in the registered fingerprint data, the conversion key number is inserted for storing at a prescribed byte in the registered fingerprint data, and a key number entered at the time of checking the fingerprint is checked with a key number reconstructed from the conversion key number inserted at the prescribed byte of the registered fingerprint data, and the checking fingerprint data obtained from the affixed fingerprint is checked with the registered fingerprint data.

The key number entered and set in the key number setting register and the content at the n-th byte of the registered fingerprint data in the registered fingerprint data storage file are added or subtracted to produce a conversion key number, the conversion key number is inserted at the m-th byte of the registered fingerprint data to store in a file, the content at the n-th byte is subtracted or added with respect to the conversion key number inserted at the m-th byte in the registered fingerprint data at checking the fingerprint to reconstruct the key number, and the reconstructed key number is checked with the entered key number.

A fingerprint checking entrance/exit control system according to the invention comprises a host device which has a file for storing personal information containing entrance allowing information according to an identification number, name and desired room number and the registered fingerprint data in a corresponded form and a gate which has a fingerprint checking unit for storing the personal information and the registered fingerprint data downloaded from the file and checking with an affixed fingerprint, both connected through a local area network (LAN), wherein the fingerprint checking unit of the gate is provided with a control unit which renews the registered fingerprint data with a time stamp added to the affixed fingerprint data when personal identification is authenticated by checking the affixed fingerprint with the registered fingerprint data, and the host device collects the renewed registered fingerprint data with the time stamp added of the gate, renews the registered fingerprint data and sends the renewed registered fingerprint data to a gate which is in compliance with the entrance allowance information.

The host device has a file which stores first and second registered fingerprint data from a finger registering unit, and a control processing unit, when the second registered fingerprint data is renewed by the latest renewed registered fingerprint data collected from the gate, renews the first registered fingerprint data by the second registered fingerprint data, and transfers the renewed second registered fingerprint data to a gate which is in compliance with the entrance allowing information.

A fingerprint checking device according to the invention for checking an affixed fingerprint on a fingerprinting unit with registered fingerprint data in correspondence with normal identification numbers stored in a file comprises a local ID file which allocates a local identification number having the number of digits smaller than the normal identification numbers and stores the local identification number, and a control unit which reads from the fingerprint dictionary file in the file the registered fingerprint data corresponding to the local identification number entered at the time of checking with the affixed fingerprint.

The local ID file stores the local identification number and effective time information which indicates effective time of the local identification number in a corresponded form.

The control unit allocates a local identification number which does not overlap with another local identification number registered in the local ID file, and corresponds the registered fingerprint data which is corresponded with the normal identification number with the local identification number.

A fingerprint registering method according to the invention which binarizes a multivalued image signal obtained by picturing an affixed fingerprint, thinning-processing image data resulting from the binarizing process, extracts minutiae based on the thinning-processed image data, deletes pseudo minutiae from the minutiae, and when the remaining number of minutiae is equal to or above a prescribed number, registers a fingerprint having minutiae according to the binarized image data, wherein if the fingerprint registering in the process for the first time fails, spatial filtering is effected on the multivalued image data to continue in the ridge line direction in the fingerprint registering process by the process for the second time and following, the spatial filtered multivalued image data is binarized and thinning-processed, the minutiae are extracted from the thinning-processed image data, the pseudo minutiae are deleted from the minutiae, and if the remaining number of minutiae is equal to or more than a prescribed number, the fingerprint having minutiae according to the binarized image data is registered. In other words, the first fingerprint registering process, when the fingerprint image is good, does not need the spatial filtering to obtain the prescribed number or more of normal minutiae. If the first registering process fails, the fingerprint image is not good, so that the spatial filtering is effected, and minutiae are extracted.

To delete the pseudo minutiae in the fingerprint registering process, when the extracted minutiae are within a prescribed area, they are judged as pseudo minutiae, and the pseudo minutiae are deleted from a list of minutiae.

BRIEF DESCRIPTION OF THE DRAWINGS

FIG. 21 is an explanatory diagram of a file.

FIG. 31 is an explanatory diagram of normal minutiae and pseudo minutiae.

BEST MODE FOR CARRYING OUT THE INVENTION

Embodiment 1

Figure 1:
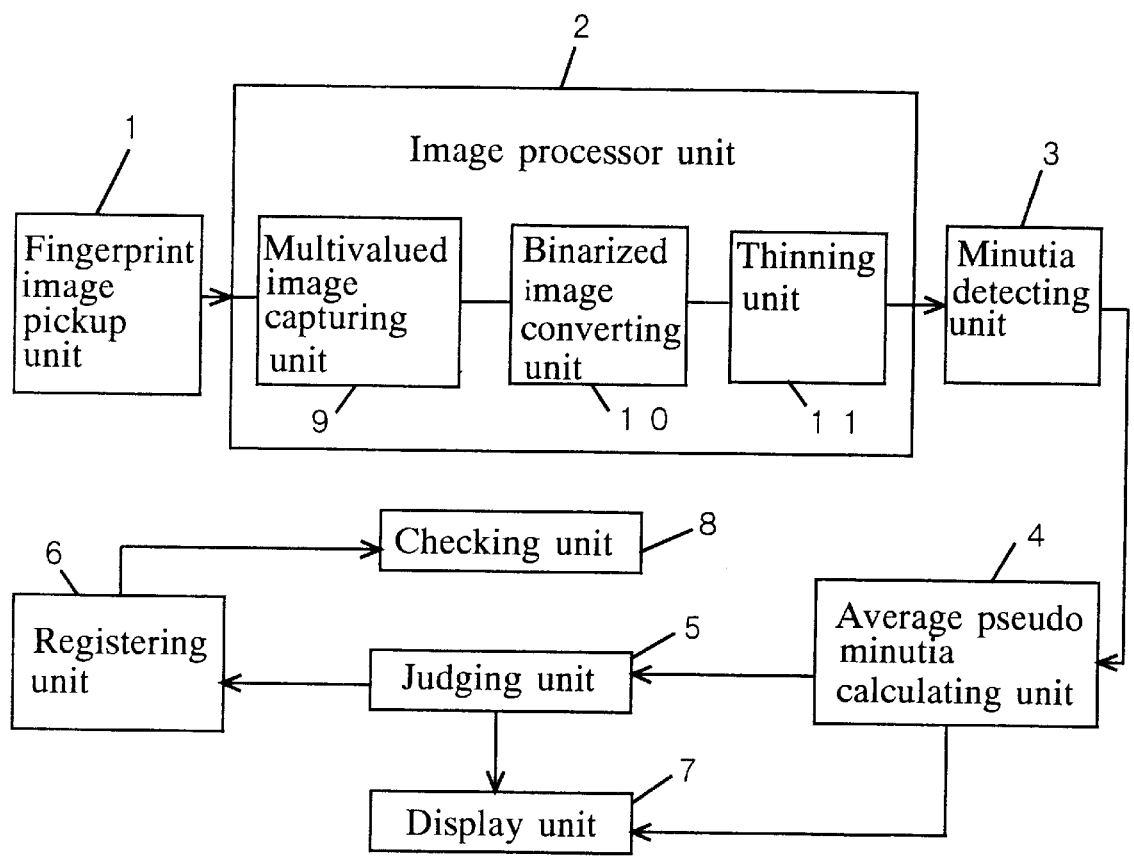
FIG. 1 is an explanatory diagram of the embodiment of a fingerprint checking device according to the present invention.

FIG. 1 is an explanatory diagram of an embodiment of a fingerprint checking device according to the present invention, in which reference numeral 1 denotes a fingerprint image pickup unit, 2 an image processor unit, 3 a minutia detecting unit, 4 an average pseudo minutia calculating unit, 5 a judging unit, 6 a registering unit, 7 a display unit, 8 a checking unit, 9 a multivalued-image capturing unit, 10 a binarized-image converting unit, and 11 a thinning-processing unit. The fingerprint image pickup unit 1 can apply various types of known configurations, and is generally configured that a fingerprint affixing surface is illuminated by a light source and the light reflected on the surface of a finger is pictured by a CCD camera.

Figure 32A:
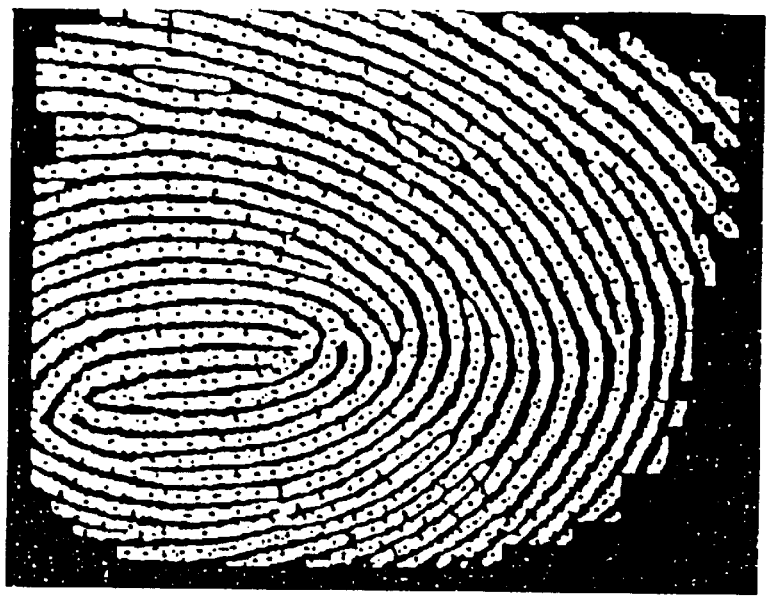
FIG. 32 is an explanatory diagram of a fingerprint image and a thinning-processed image.
Figure 32B:
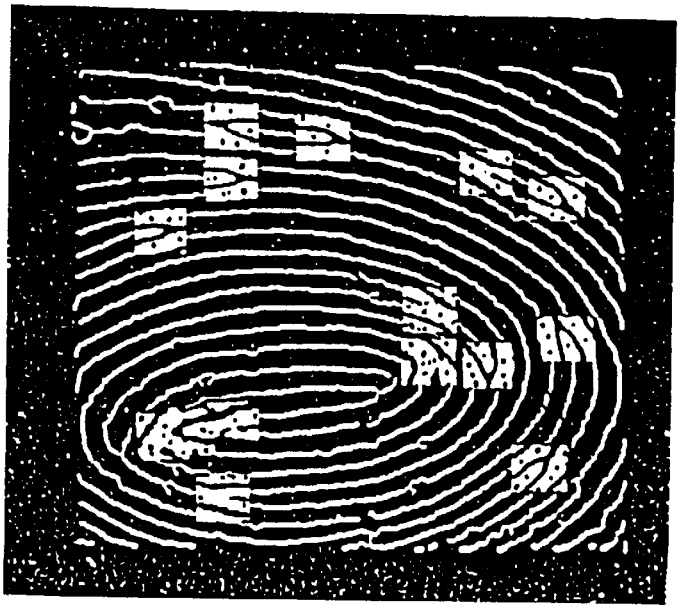
Figure 33A:
FIG. 33 is an explanatory diagram of a fingerprint image and a thinning-processed image.
Figure 33B:
Figure 34:
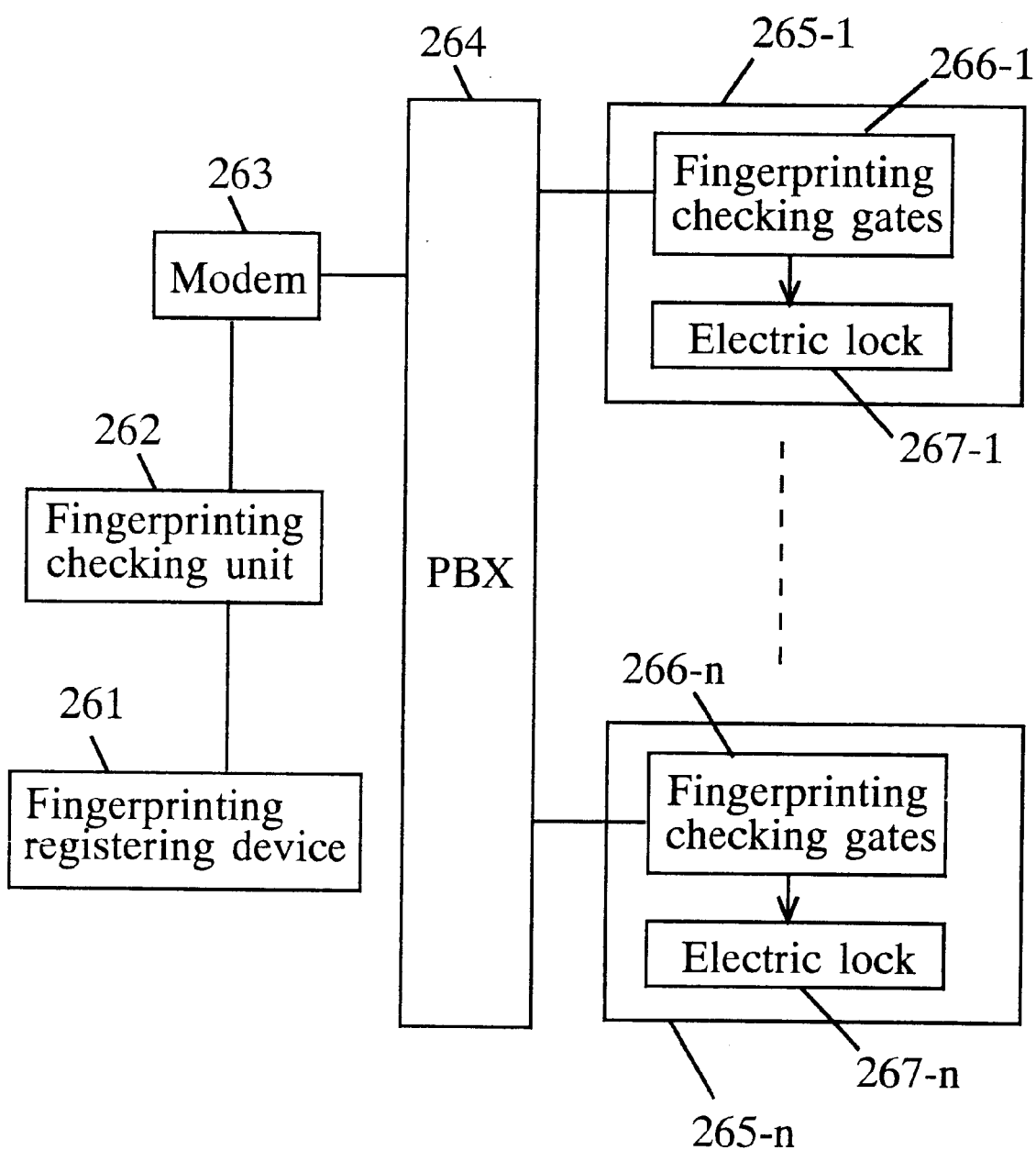
FIG. 34 is an explanatory diagram of a system.
Figure 35:
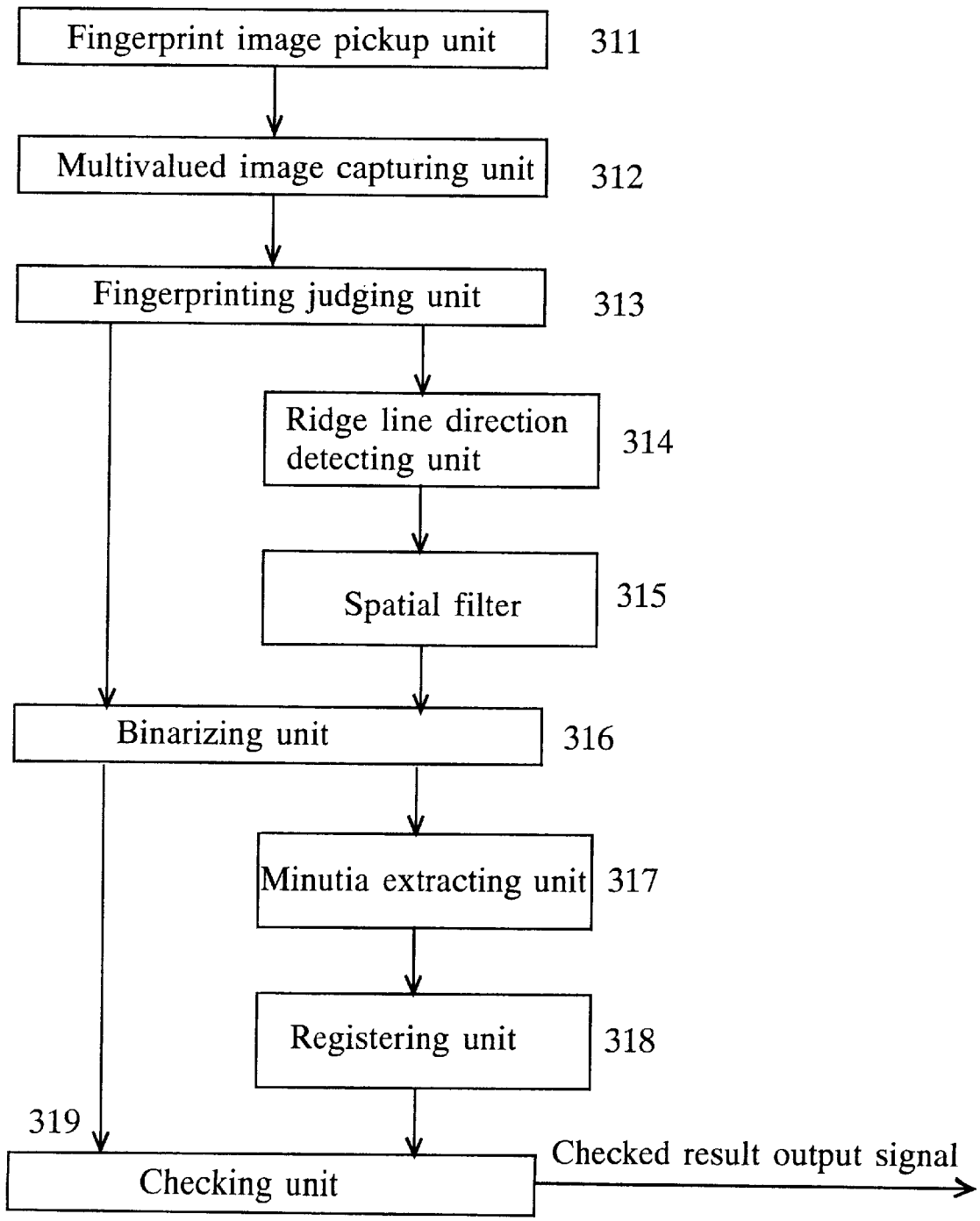
FIG. 35 is an explanatory diagram of a fingerprint checking device.
Figure 36:
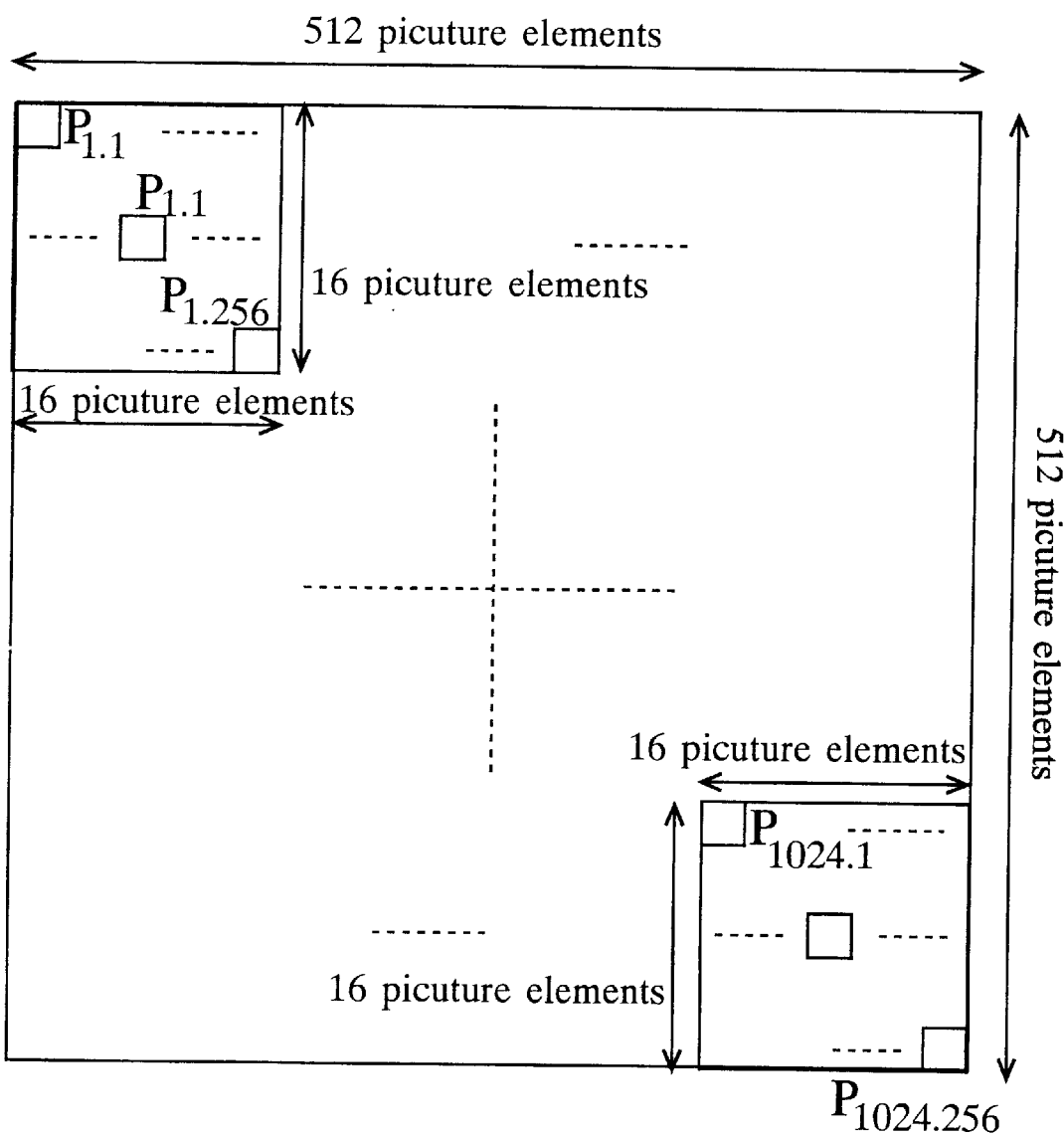
FIG. 36 is an explanatory diagram of dividing a pictured image into blocks.

The image processing unit 2 digitizes a fingerprint image from the fingerprint image pickup unit 1 into a multivalued level by the multivalued-image capturing unit 9 and binarized by the binarized-image converting unit 10. And, the binarized fingerprint image is thinning-processed by the thinning-processing unit 11. For example, as to a binarized image, the ridge lines of a fingerprint are converted into lines of about one picture element as shown in FIG. 31, FIG. 32 and FIG. 33(b) according to the judging processing whether or not the adjacent picture elements with respect to the focused picture element at the center are continuous by using a 3×3 picture element mask.

The minutia detecting unit 3 detects the thinning-processed fingerprint image for bifurcation points where a prescribed number of picture elements are continuous or ending points where there are intervals of a prescribed number of picture elements as normal minutiae, and detects bifurcation points and ending points under other conditions as pseudo minutiae. In such a case, by using the above-described 3×3 picture element mask for example, the picture elements in the neighborhood of the focused picture elements at the center can be judged whether or not they are continuous or bifurcated, so that respective minutiae can be detected.

With respect to a registering window with the normal minutia by the minutia detecting unit 3 at almost the center, e.g., the registering window shown in a rectangular form in the thinning-processed image in FIG. 31(B), the average pseudo minutia calculating unit 4 calculates pseudo minutiae, e.g., the pseudo minutiae shown at P1 to P4 in FIG. 31(C), adds up the number of pseudo minutiae of all registering windows, and dividing the total by the number of registering windows to determine the average number of pseudo minutiae of the registering windows.

The judging unit 5 judges that a fingerprint image is good when the average number of pseudo minutiae is equal to or less than a threshold, e.g., 5. For example, the number of pseudo minutiae in the registering window shown in FIG. 31(C) is four, and when it is assumed that the average number of pseudo minutiae is also four, it is equal to or less than the threshold. In such a case, the fingerprint image shown in FIG. 31(A) is judged to be of a good image quality, and the pertinent fingerprint is registered in the registering unit 6. In this case, coordinate information of the registering windows containing the normal minutia and the binarized image within the registering windows are registered. And, the registering unit 6 can apply various types of storage devices such as a semiconductor integrated circuit memory and a magnetic disk drive.

Display unit 7 can be formed of a liquid crystal display device, a CRT display device or the like, and shows the above-described average number of pseudo minutiae, or indicates that the fingerprint image has a poor image quality as the average number of pseudo minutiae increases, so that the image quality can be converted into a numerical value and displayed. Information on the possibility of registering can also be indicated. When the average number of pseudo minutiae exceeds a threshold in the judging unit 5, it can be displayed to register another finger. When the fingerprint of a best finger is registered, the best finger can be displayed as the registered finger.

After registering a fingerprint in the registering unit 6, the checking unit 8 checks the fingerprint pictured by the fingerprint image pickup unit 1 with the registered fingerprint, and when they match, it is judged as personal identification. And, it can be applied to various types of security devices. The functions of the above-described units can be achieved by the individual configurations of the respective units or by a calculating function of a processor or a memory.

Figure 2:
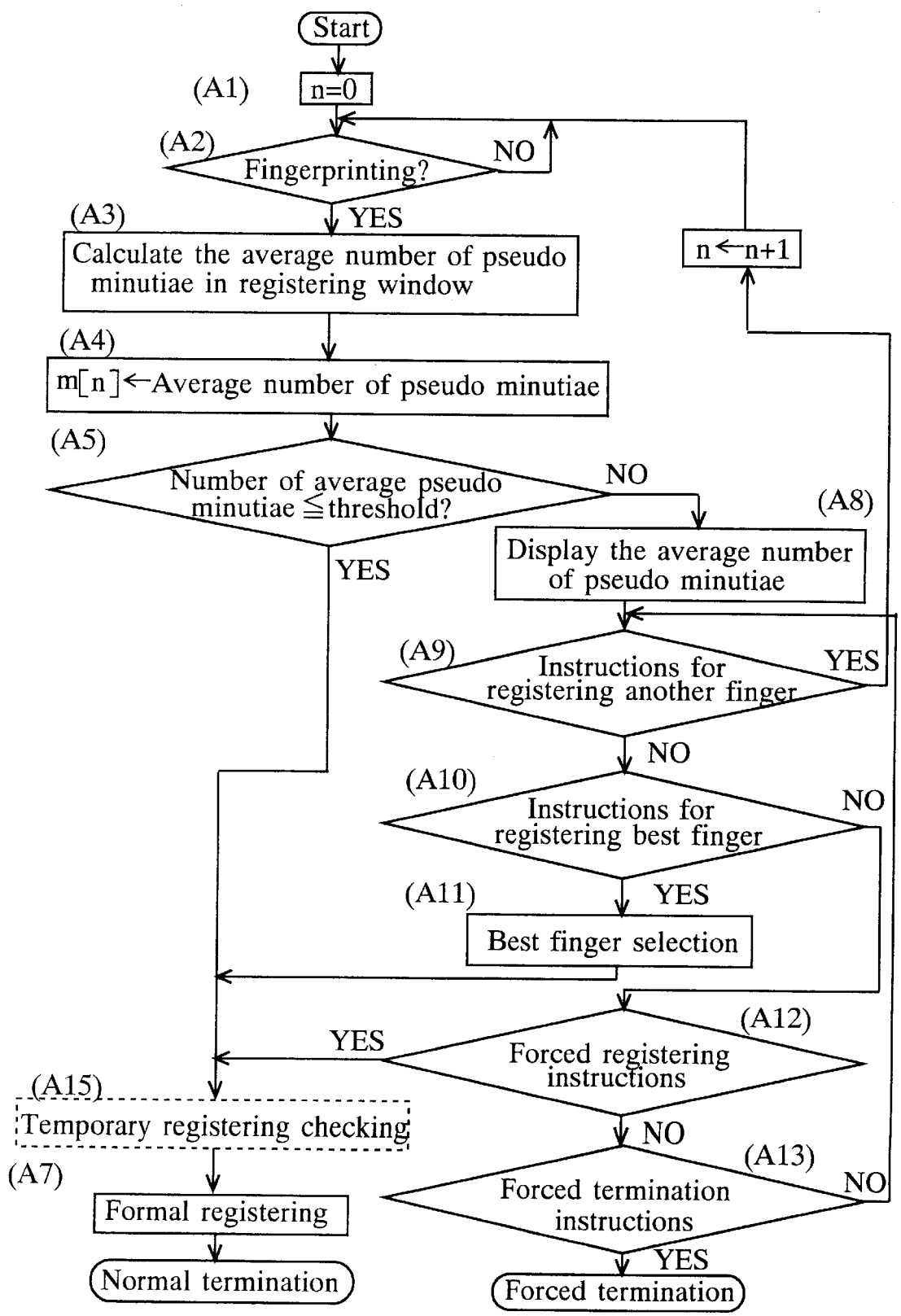
FIG. 2 is a flowchart of fingerprint registering process in an embodiment according to the invention.

FIG. 2 is a flowchart of registering a fingerprint in the embodiment of the present invention, in which n denotes the number of fingers to be registered. For example, a first finger is indicated by 0, a second finger by 1, and a third finger by 2. And, m[ ] is an address of a memory for storing the average number of pseudo minutiae. For example, an address for storing the average number of pseudo minutiae of a first finger is m[0], and an address for storing the average number of pseudo minutiae of a second finger is m[1].

First, when n=0 (A1), it is judged whether or not fingerprinting has been made (A2), and if fingerprinting has been made, the average number of pseudo minutiae in the registering window is calculated by the average pseudo minutia calculating unit 4 (see FIG. 1) (A3). This average number of pseudo minutiae is stored in an address m[0] of the memory. And, it is judged whether or not the average number of pseudo minutia is equal to or less than the threshold by the judging unit 5 (A5). When the average number of pseudo minutia is equal to or less than the threshold, it is judged that the fingerprint image is good, and the formal registering is made (A7). Otherwise, temporary registering and checking (A15) are performed before the formal registering, and if they match, the formal registering can be made.

When the average number of pseudo minutiae exceeds the threshold, the average number of pseudo minutiae is shown on the display unit 7 (A8). In this case, the average number of pseudo minutiae is displayed as a numerical value, or it can be displayed in percentage indicating the image quality.

In accordance with what is displayed, it is judged whether or not registering of another finger has been instructed (A9), and if the instructions for registering another finger have been made, the number of fingers n to be registered is stored as +1, and processing goes to step (A2).

When repeated registering of all fingers has been completed, there is no instructions for registering another finger remain, so that it is judged whether or not there is any instructions for registering the best finger (A10), and when there is such instructions, selection of the best finger is performed (A11). And, the fingerprint of the best finger selected by the best finger selecting process is registered.

If there is not any instructions for registering the best finger, it is judged whether or not there is forced registering instructions (A12). In other words, when the average number of pseudo minutiae of the fingerprints of all fingers exceeds the threshold, a desired finger can be designated to make the forced registering instructions, and the fingerprint of the designated finger is registered. In this case, in the same way as prior art, the temporary registering and the checking according to the affixed fingerprint are performed, and when the temporarily registered fingerprint and the affixed fingerprint match, processing goes to the formal registering (A7), and when they do not match, registering can be rejected. If there is not forced registering instructions, it is judged whether or not there is a forced termination instruction (A13), and if there is such an instruction, processing is forced to be terminated, and if there is not, processing goes to step (A9).

Figure 3:
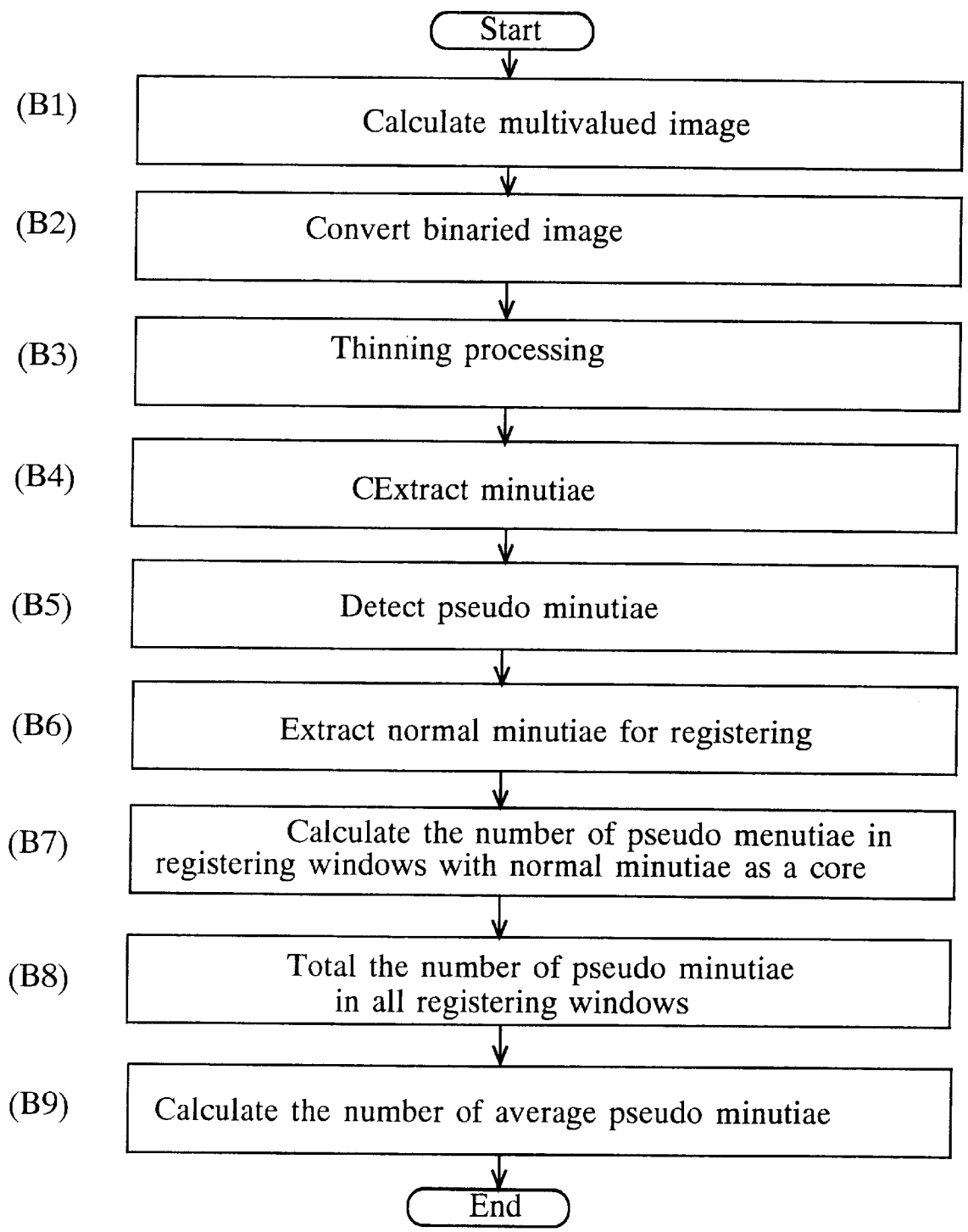
FIG. 3 is a flowchart of calculating the average number of pseudo minutiae in a registering window in an embodiment according to the invention.

FIG. 3 is a flowchart of calculating the average number of pseudo minutiae in the registering window in the embodiment of the invention, in which an image signal from the fingerprint image pickup unit 1 is converted into a multi-valued digital signal and captured by the multivalued image capturing unit 9 of the image processor unit 2 (B1), it is converted into a binarized image by the binarized-image converting unit 10 (B2), it is then masked and thinning-processed by the thinning-processing unit 11 as described above (B3), minutiae are extracted based on the thinning-processed image by the minutia detecting unit 3 (B4), pseudo minutiae are detected (B5), and normal minutiae for registering are extracted (B6).

Then, in the average pseudo minutia calculating unit 4, the number of pseudo minutiae within the registering window with the normal minutiae at about the center is calculated (B7), a total of pseudo minutiae in all registering windows is calculated (B8), and the total is divided by the number of registering windows to obtain the average number of pseudo minutiae (B9). Such calculation can be performed at a high speed by combining the already known addition with shifting.

Figure 4:
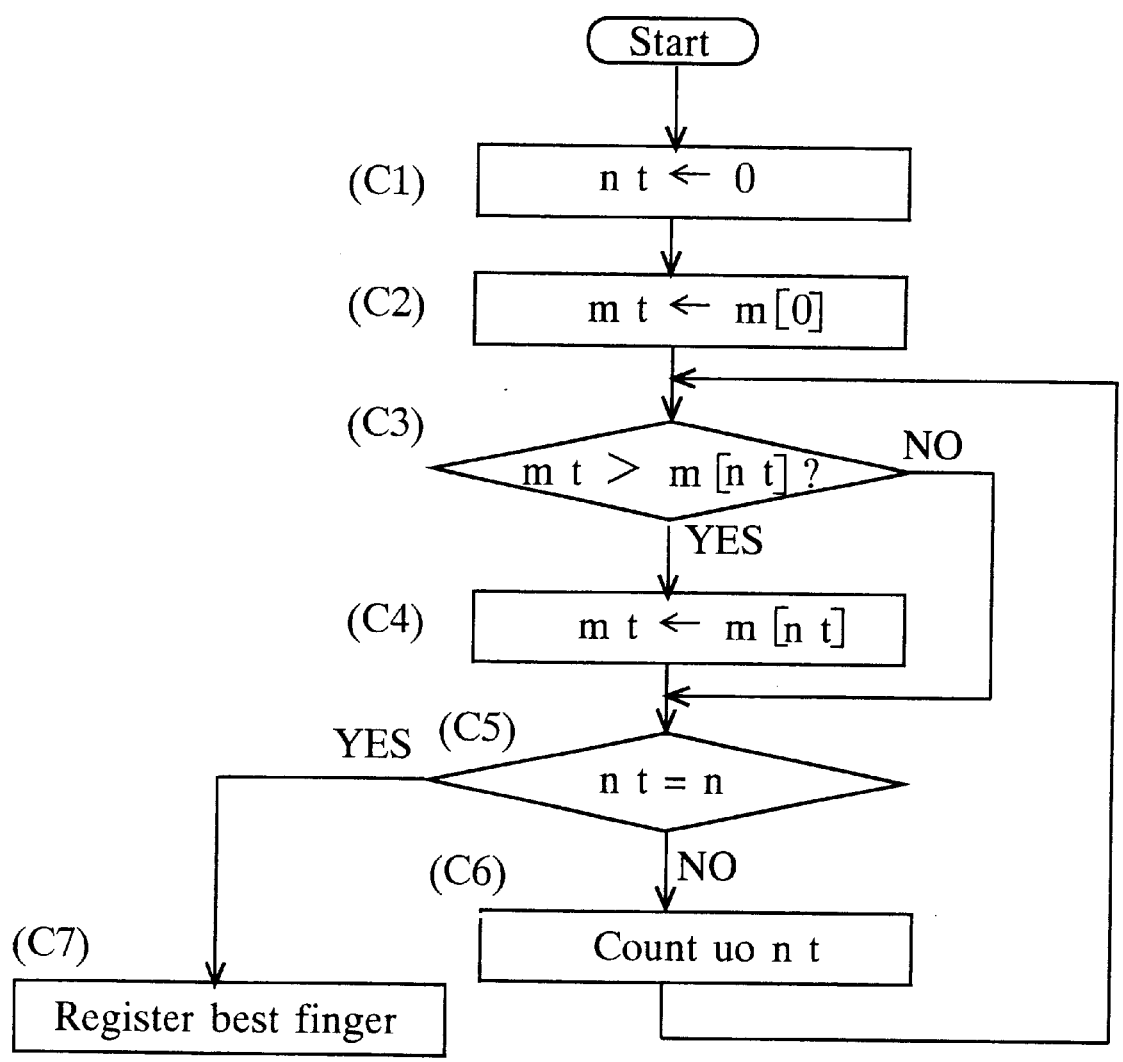
FIG. 4 is a flowchart of selecting the best finger in an embodiment according to the invention.

FIG. 4 is a flowchart of selecting the best finger in the embodiment of the invention, indicating the step (A11) of FIG. 2 in detail. In the drawing, reference numeral $n_r$ denotes the content of a counter which is used to select the best finger, and $m_r$ the average number of pseudo minutiae. When the average number of pseudo minutiae in the registering windows exceeds the threshold and no instructions for registering another finger is given, $n_r=0$ (C1), then $m_r=m[0]$ (C2), and the average number of pseudo minutiae m for the first finger is read to judge whether or not $m_r>m[n_r]$ (C3).

And, when $m_r>m[n_r]$, $m_r\leftarrow m[n_r]$ (C4), and it is judged whether or not $n_r=n$ (C5). Even when it is not $m_r>m[n_r]$, it is judged whether or not $n_r=n$. And, when $n_r=n$, the finger which is indicated by $n_r$ is determined as the best finger and registered (C7). When $n_r\neq n$, $n_r$ is counted up (C6), and processing goes to step (C3). Thus, among all fingers, the finger having the minimum average pseudo minutia which is not satisfactory as the fingerprint image is temporarily selected as the best finger, and its fingerprint is registered. In this case, the name and number of the best finger are shown on the display unit 7 to notice a fingerprint registering operator. Accordingly, the selected best finger may be affixed to check a fingerprint.

Embodiment 2

Figure 5:
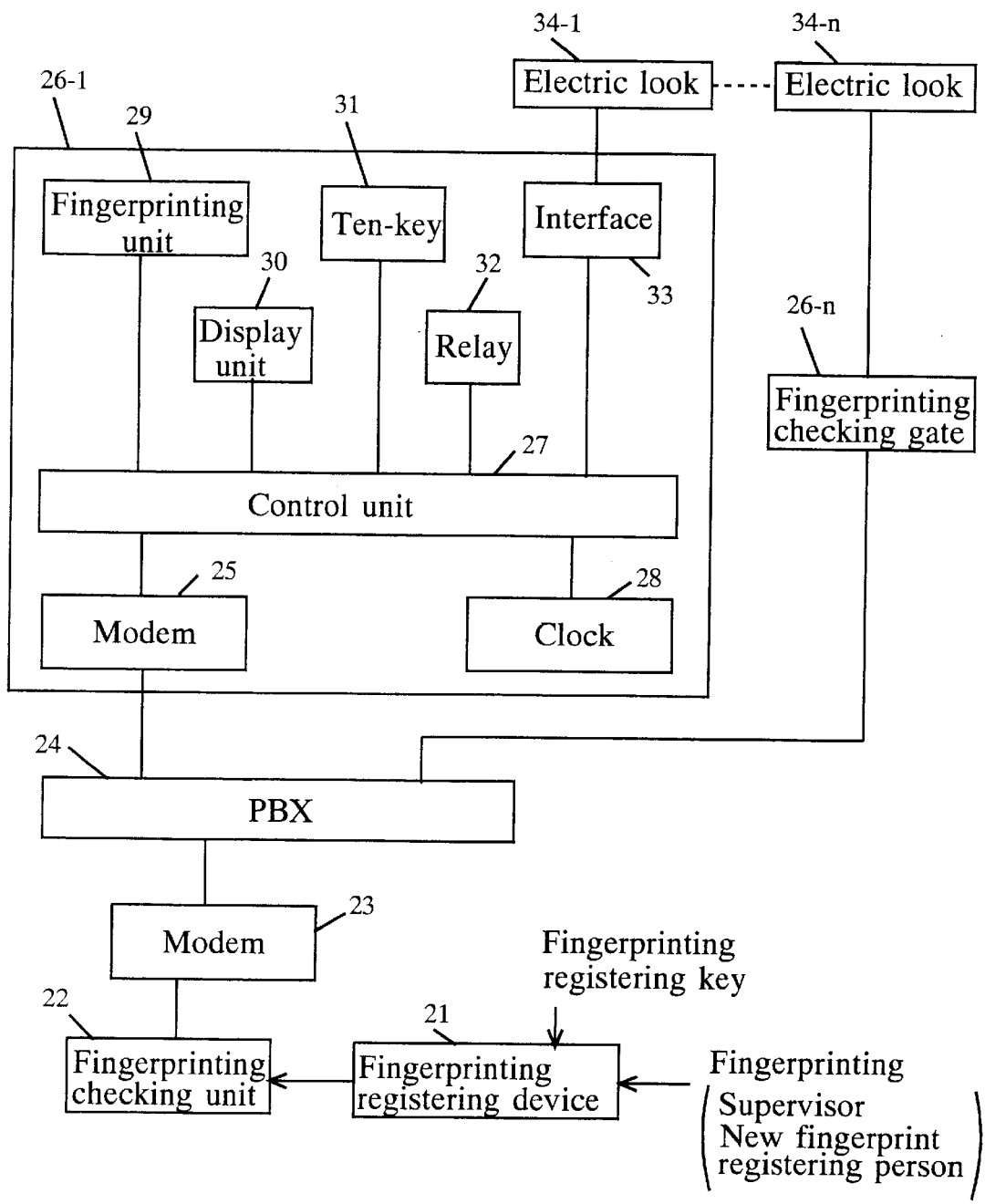
FIG. 5 is an explanatory diagram of an embodiment of a fingerprint checking entrance/exit control system according to the invention.

FIG. 5 is an explanatory diagram of the embodiment of a fingerprint checking entrance/exit control system according to the present invention, in which reference numeral 21 denotes a fingerprint registering device, 22 a fingerprint checking unit, 23 and 25 a modem, 24 a private branch exchange (PBX), 26-1 to 26-n a fingerprint checking gate, 27 a control unit, 28 a clock, 29 a fingerprinting unit, 30 a display unit, 31 a ten-key, 32 a relay, 33 an interface, 34-1 to 34-n an electric lock of the door to a room where entrance and exit are made or of allowing to operate a computer which stores significant data.

The fingerprint registering device 21 comprises an unillustrated keyboard such as a ten-key, a key hole for a fingerprint registering key, a fingerprinting part, a fingerprint registering part and a display to indicate guidance. To start to use the system, at least two supervisors (system administrator) are selected, the fingerprint of each supervisor is registered by using the fingerprint registering key, then a new fingerprint registering person other than the supervisors inserts the fingerprint registering key, and at least one supervisor affixes his or her fingerprint on the fingerprinting part, and when the supervisor s registered fingerprint matches with the affixed fingerprint and the new fingerprint registering person affixes his or her fingerprint on the fingerprinting part, data such as the identification number, post, name, attribute and accessible door entered through the keyboard and the fingerprint can be registered.

Specifically, the new fingerprint registering person can use the fingerprint registering key upon being approved to register a fingerprint by the supervisor, and by the fingerprint registering approval by the direct fingerprint checking of the supervisor, the fingerprint can be registered in the fingerprint registering device 21. Thus, since the fingerprint of the new fingerprint registering person can be registered under the double guards of the fingerprint registering key and the fingerprint checking of the supervisor, security of the fingerprints registered in the fingerprint registering device 21 can be improved.

The fingerprint checking unit 22 checks the registered fingerprints with the affixed fingerprint, and can be composed of a host computer. Since the fingerprint checking unit 22 and the fingerprint registering device 21 have a common function in processing the fingerprint, they can be achieved by the same computer.

The fingerprint checking gates 26-1 to 26-n comprise the modem 25, the control unit 27 configured of a microprocessor, the clock 28 configured of a hard clock or soft clock, the fingerprinting unit 29 configured of a light source and a CCD camera, the display unit 30 such as a liquid crystal panel, the ten-key 31 for entering an ID or the like, the relay 32 used for an unillustrated power switch for the device, and the interface 33 for releasing or locking the electric lock; and are provided for a room where entrance and exit are made of a computer.

And, the fingerprint checking unit 22 and the fingerprint checking gates 26-1 to 26-n are connected through the private branch exchange 24 but may be connected by a dedicated line to form the system. And, by providing a fingerprint checking unit which has the same functions as the fingerprint checking unit 22 and a storage unit which receives and stores online or off-line the fingerprint data stored in the fingerprint registering device 21, the registered fingerprints and the affixed fingerprint can be checked separately at the fingerprint checking gates 26-1 to 26-n.

When a fingerprint is affixed on the fingerprinting unit 29, a fingerprint image signal obtained by picturing the fingerprint under the control of the control unit 27 is transferred to the fingerprint checking unit 22 through the modem 25, the private branch exchange 24 and the modem 23. The fingerprint checking unit 22 checks it with the registered fingerprints in the fingerprint registering device 21, and sends back the checked result to the fingerprint checking gate. Otherwise, at the fingerprint checking gate which has the fingerprint checking unit, the affixed fingerprint and the registered fingerprints can be checked without transferring the fingerprint image signal.

If they match, the control unit 27 releases the electric lock through the interface 33. When the accessible door is limited at the time of registering a fingerprint, it is judged whether or not the fingerprint matches at the fingerprint checking gate for the accessible door, and if the fingerprint matches for the accessible door, the entrance is allowed. And, if the fingerprint affixed to the fingerprinting unit 29 does not match with any registered fingerprint, it is shown on the display unit 30, and the electric lock is not released. Therefore, if a person does not have his or her fingerprint registered, the affixed fingerprint does not match with the registered fingerprints and the entrance is not allowed. And, when the fingerprint checking gate is provided for a computer, the computer cannot be used when the fingerprints do not match.

Figure 6:
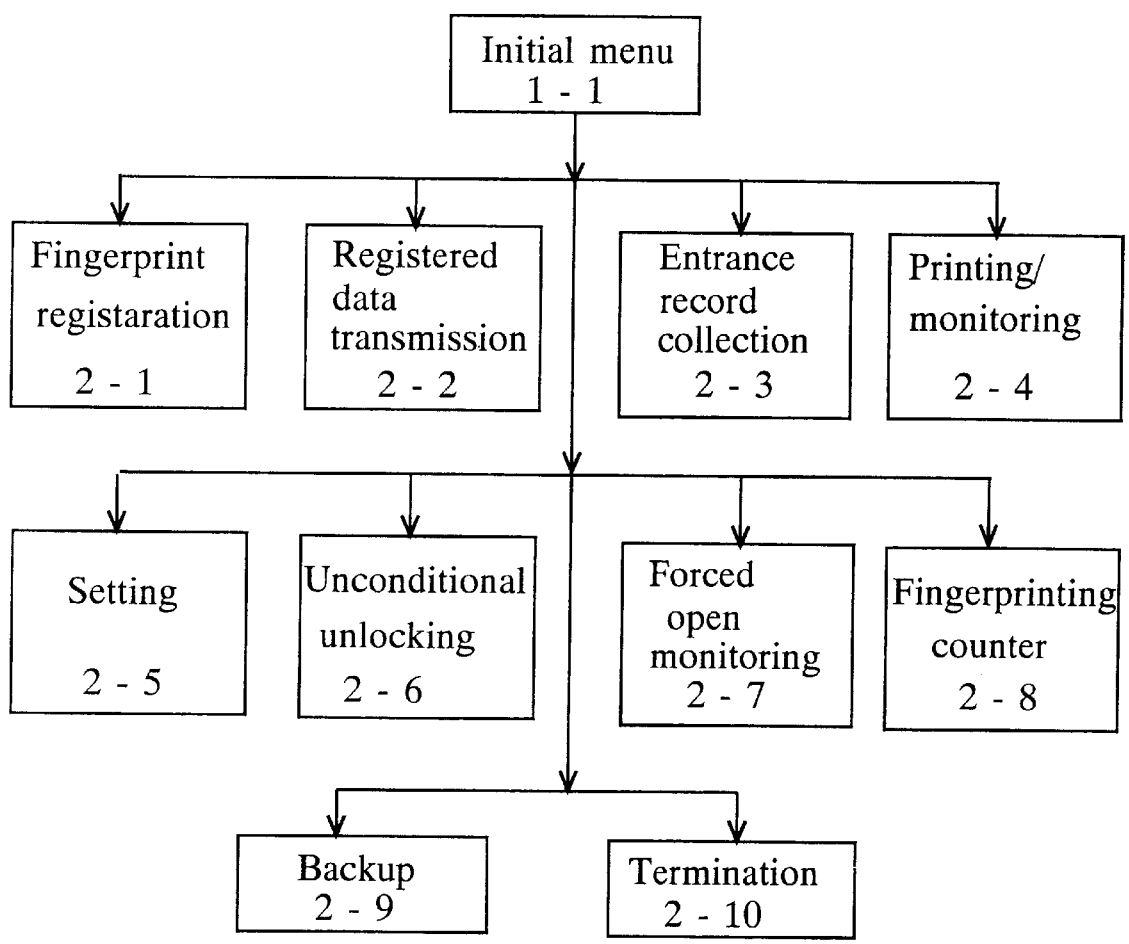
FIG. 6 is a menu explanatory diagram of an embodiment according to the invention.

FIG. 6 is an explanatory diagram of a menu in the embodiment according to the invention, showing one example of the operation menu on the side of the fingerprint checking unit 22 to control the entrance and exit (see FIG. 5). An initial menu 1-1 includes menus such as fingerprint registration 2-1, registered data transmission 2-2, entrance record collection 2-3, printing/monitoring 2-4, setting 2-5, unconditional unlocking 2-6, forced open monitoring 2-7, fingerprinting counter 2-8, backup 2-9, and termination 2-10. Among them, the fingerprint registering 2-1, setting 2-5, unconditional unlocking 2-6, fingerprinting counter 2-8, and termination 2-10 can be operated by the supervisor (system manager) only.

Figure 7:
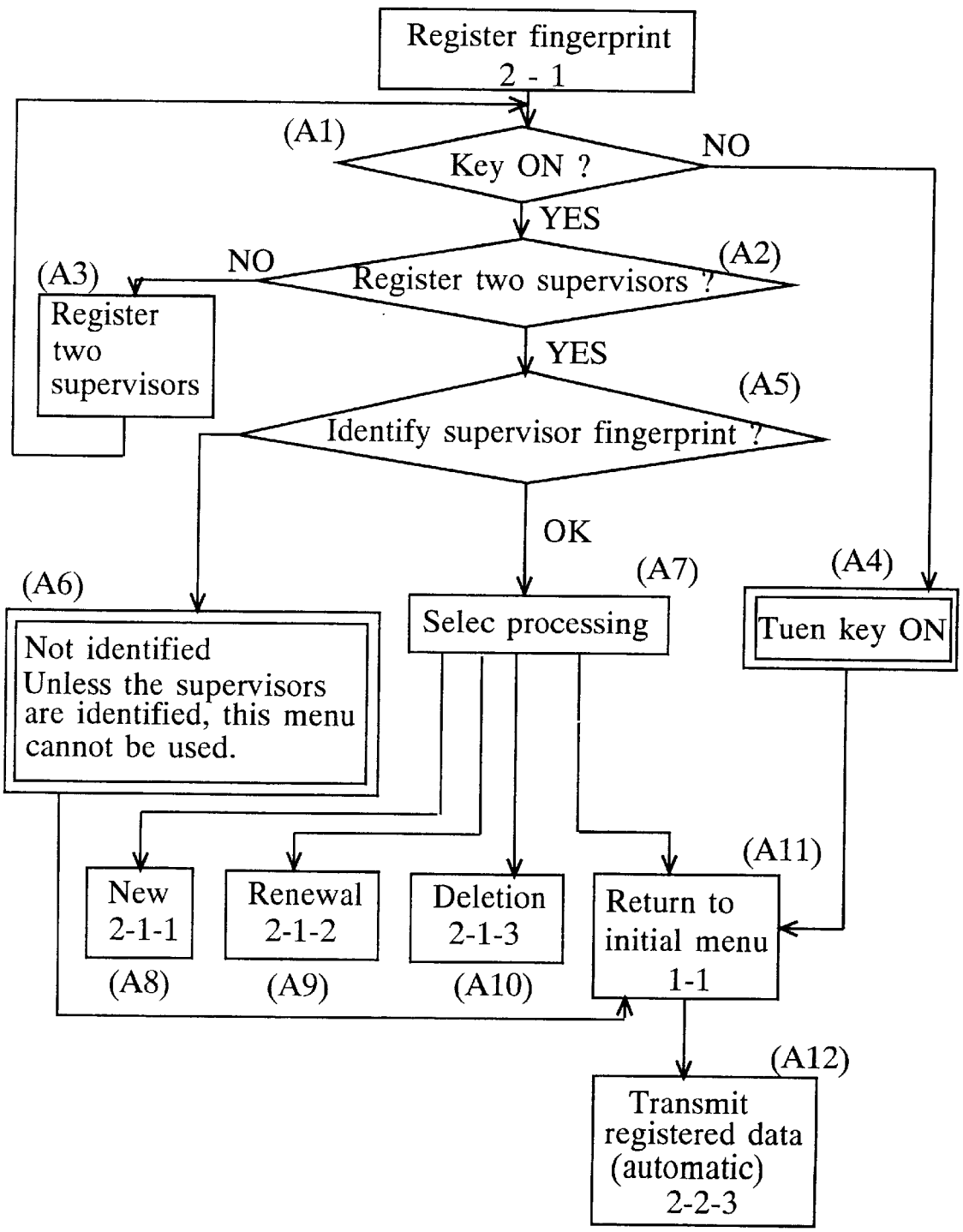
FIG. 7 is a flowchart of registering a fingerprint in an embodiment according to the invention.

FIG. 7 is a flowchart of registering a fingerprint in the embodiment according to the invention, showing the registering of the fingerprint in the fingerprint registering device 21 shown in FIG. 5. The fingerprint registration 2-1 of the menu of FIG. 6 shown on the fingerprint registering device 21 is designated. In registering the fingerprint, the fingerprint registering key is needed, and it is judged whether or not the fingerprint registering key is turned on (A1). When the fingerprint registering key is not inserted or it is inserted but not turned on, a message "Turn on the key." is displayed, and the initial menu 1-1 resumes (A11).

When the fingerprint registering key is turned on, it is judged whether or not the fingerprints of at least two supervisors have been registered. Since the supervisors have the fingerprints registered to give approval for registering a new fingerprint, if there is only one supervisor at the time of operating the system and any accident takes place, subsequent new registering, renewal or deletion of a fingerprint cannot be made, so that at least two supervisors are registered without reservation. Therefore, in step (A2), it is judged whether or not two supervisors have been registered, and if not, the fingerprints of two supervisors are registered without reservation.

When a fingerprint is registered after registering the fingerprints of two supervisors, the fingerprint registering key is turned on, the fingerprints of the supervisors are affixed, it is judged whether or not the supervisors could be identified by checking the fingerprints (A5), and if the identification cannot be made, a message "Not identified. Unless the supervisors are identified, this menu cannot be used." is displayed (A6), and the initial menu 1-1 resumes (A11).

When the supervisors are identified, processing goes to the selection of processing (A7), and new 2-1-1 (A8), renewal 2-1-2 (A9), deletion 2-1-3 (A10), or initial menu 1-1 (A11) is selected. And, after returning to initial menu 1-1, registered data transmission 2-2 (A12) is automatically selected and transmitted to the fingerprint checking gate.

Figure 8:
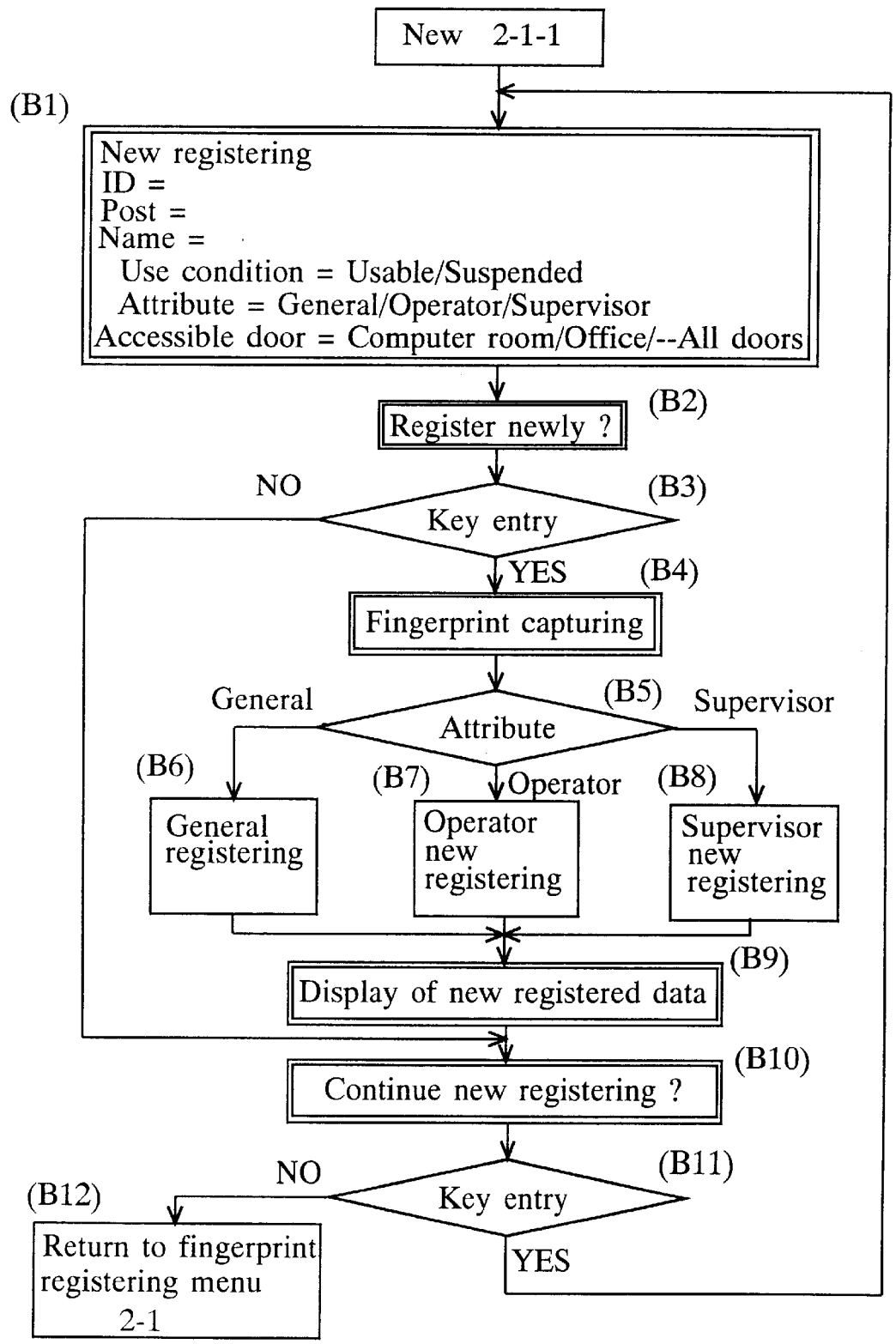
FIG. 8 is a flowchart of registering a new fingerprint in an embodiment according to the invention.

FIG. 8 is a flowchart of registering a new fingerprint in the embodiment according to the invention, showing that the fingerprint registration 2-1 in the menu of FIG. 6 is selected, and new 2-1-2 (A8) of FIG. 7 is selected. The fingerprints of two supervisors have been registered, and the ID, post, name, use condition, attribute and accessible door of a fingerprint registering person are entered (B1). The attribute in this case generally indicates an operator of the computer or a supervisor managing the system. And, the accessible door means a computer room, a room number or a door. As to the supervisor who has first registered a fingerprint, the ID, post and name are entered, the attribute is automatically determined as the supervisor, and the accessible door can be selected.

Upon completing the above-described entry, a message "New registering (Y/N)" is displayed (B2). And, a key indicating YES or NO is operated, and it is judged which key is operated (B3). If the NO key is operated and new registering is not effected, processing goes to step (B1), and when the YES key is operated and new registering is effected, the affixed fingerprint is captured (B4), and the attribute entered in step (B1) is judged.

And, when the attribute is general, general new registering (B6) is effected, when it is the operator, operator new registering (B7) is effected, and when it is the supervisor, supervisor new registering (B8) is effected. When the number of supervisors registered is limited, the number of registered supervisors is judged, and if it exceeds a prescribed number, registering of a fingerprint with the attribute of the supervisor designated is rejected.

Then, new registered data is shown (B9), it is checked by the new fingerprint registering person, a message "Continue new registering? (Y/N)" is shown (B10), it is judged which key has been operated (B11), if a discontinue key is operated, menu of fingerprint registering 2-1 resumes (B12), and if continue menu is operated, step (B1) resumes.

Figure 9:
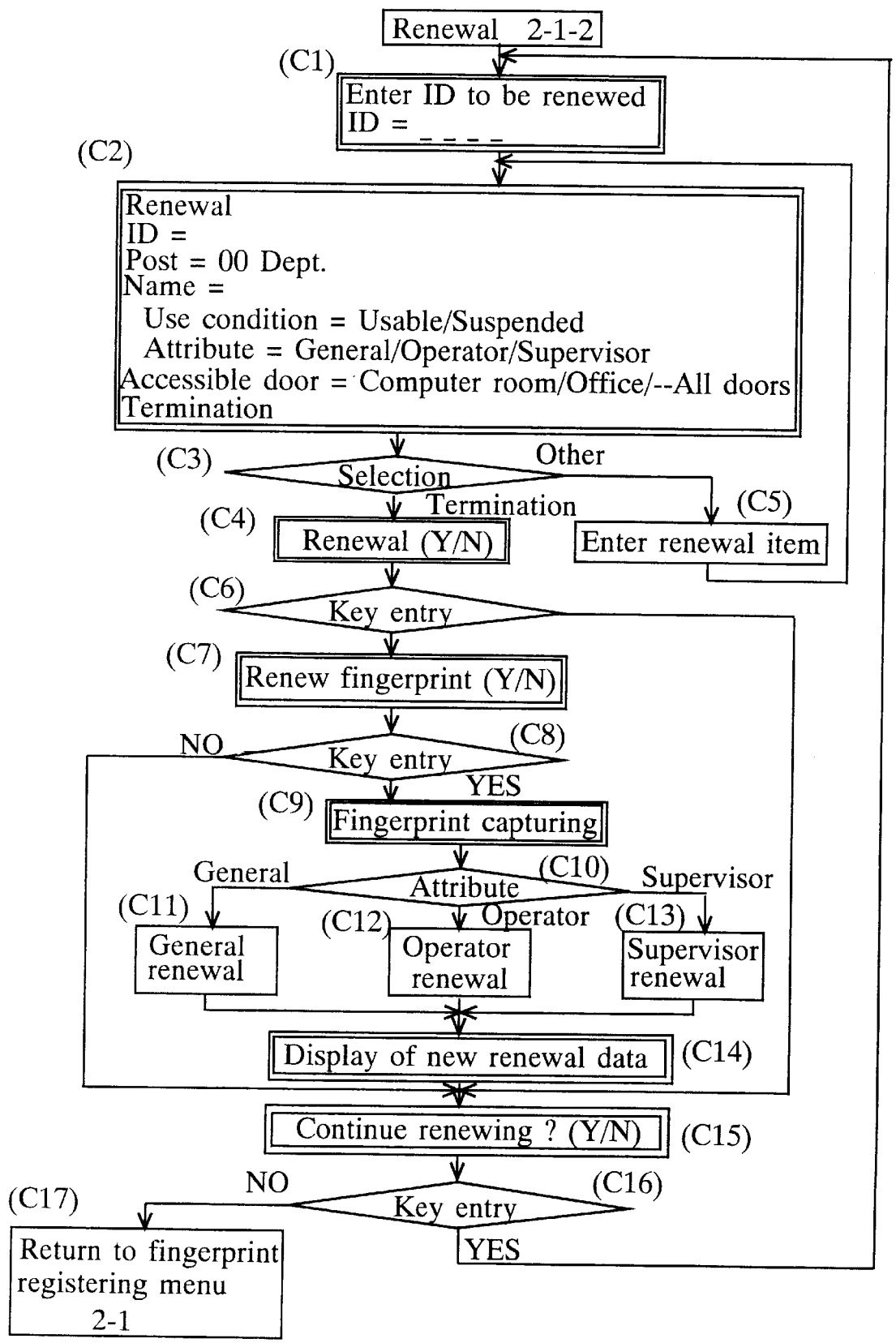
FIG. 9 is a flowchart of renewing in an embodiment according to the invention.

FIG. 9 is a flowchart of renewing in the embodiment according to the invention, showing the selection of renewal 2-1-2 of FIG. 7, and a message "Enter ID to be renewed." is shown (C1). And, when the ID to be renewed is entered, registered data containing the post, name, use condition, attribute, accessible door as well as the renewed ID is shown (C2).

And, selection is judged (C3), and when other is selected, renewal item is entered (C5), and processing goes to step (C1). And, when termination is selected, a message "Renew (Y/N)" is shown (C4), it is judged which key has been operated for entry (C5), if a non-renewal key is operated, processing goes to step (C15), and if a renewal key is operated, the affixed fingerprint is captured (C9), and the attribute is judged (C10).

When the attribute is general, operator or supervisor, the general renewing (C11), operator renewing (C12) or supervisor renewing (C13) is performed, renewed data is shown (C14) to allow the check of the renewed content, and a message "Continue renewing? (Y/N)" is shown (C15), it is judged which key has been operated (C16), and when a non-renewal key is operated, processing returns to the menu of fingerprint registering 2-1 (C17), and when a renewing key is operated, processing returns to step (C1). In the supervisor renewing (C13), when renewal of the attribute results in that the number of remaining registered supervisors does not meet the prescribed number of at least two, the pertinent attribute renewal request is rejected.

Figure 10:
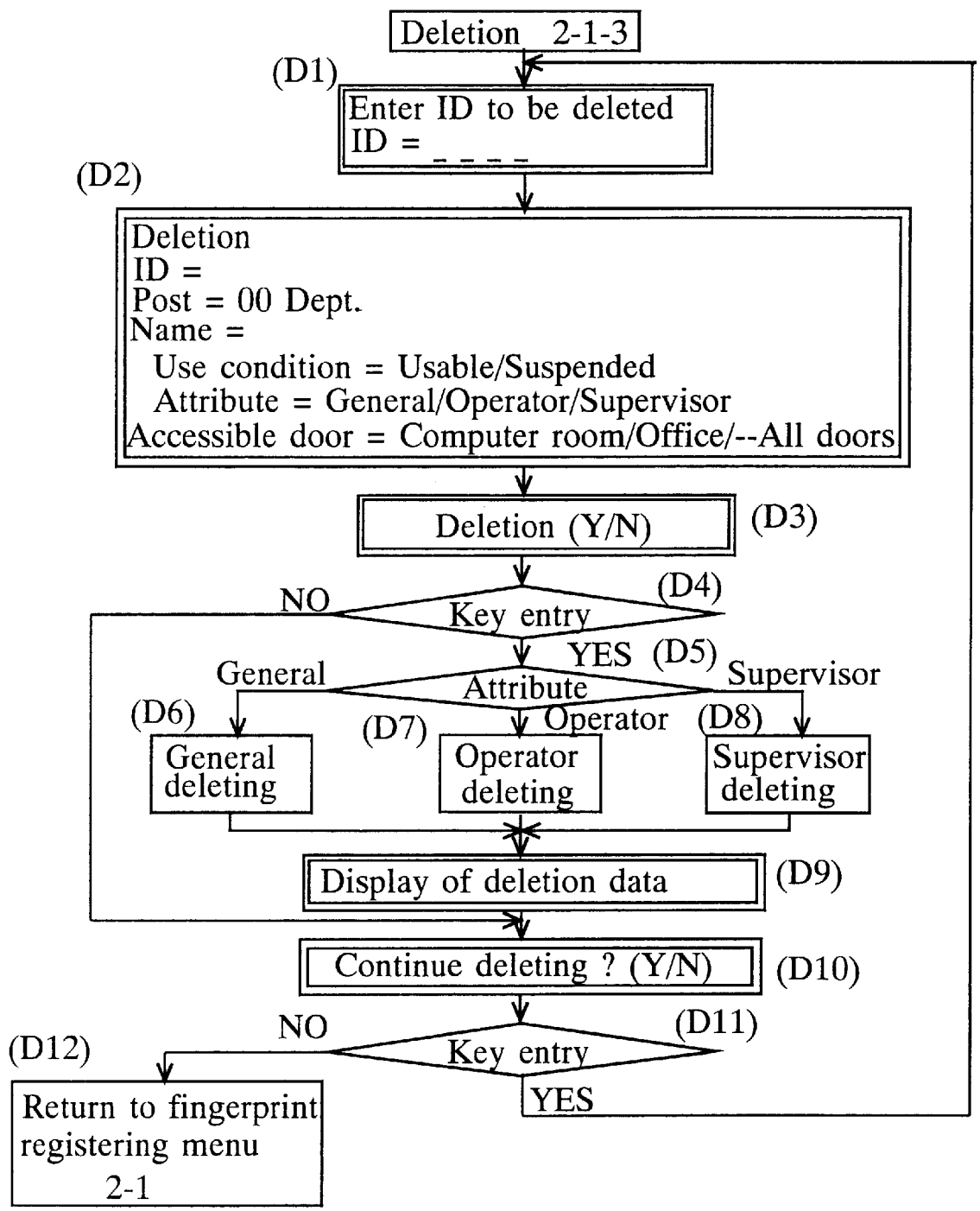
FIG. 10 is a flowchart of deleting in an embodiment according to the invention.

FIG. 10 is a flowchart of deleting in the embodiment according to the invention, showing the detection of deletion 2-1-3 in FIG. 7, and according to a message "Enter ID to be deleted." (D1), the ID to be deleted is entered. Data of the pertinent ID, post, name, use condition, attribute and accessible door is shown (D2). And, a message "Delete (Y/N)" is shown (D3), it is judged which key has been operated (D4), if a non-deletion key has been operated, processing goes to step (D10), and if a deletion key has been operated, the attribute is judged (D5), and according to the attribute, general deleting (D6), operator deleting (D7) or supervisor deleting (D8) is performed, and deletion data is shown for confirmation (D9).

In the supervisor deleting (D8), when the deletion remains two or more supervisors, deletion is performed, but if it is one, deletion is rejected. It can be determined that the number of remained supervisors is a prescribed number of at least two, and if the remaining supervisors may be less than the prescribed number, the pertinent supervisor deletion request can be rejected.

Then, a message "Continue deleting? (Y/N)" is displayed (D10), and it is judged which key has been operated in response (D11). When a non-continuing key has been operated, processing returns to the menu of fingerprint registering 2-1 (D12), and when the continuing key has been operated, processing returns to step (D1).

As described above, according to the fingerprint registering key and the supervisor fingerprint checking, new registering, renewal or deletion of the fingerprint can be made, security of the registered fingerprints under the double guards can be improved, and safety of entrance and exit according to the registered fingerprints can be secured.

Figure 11:
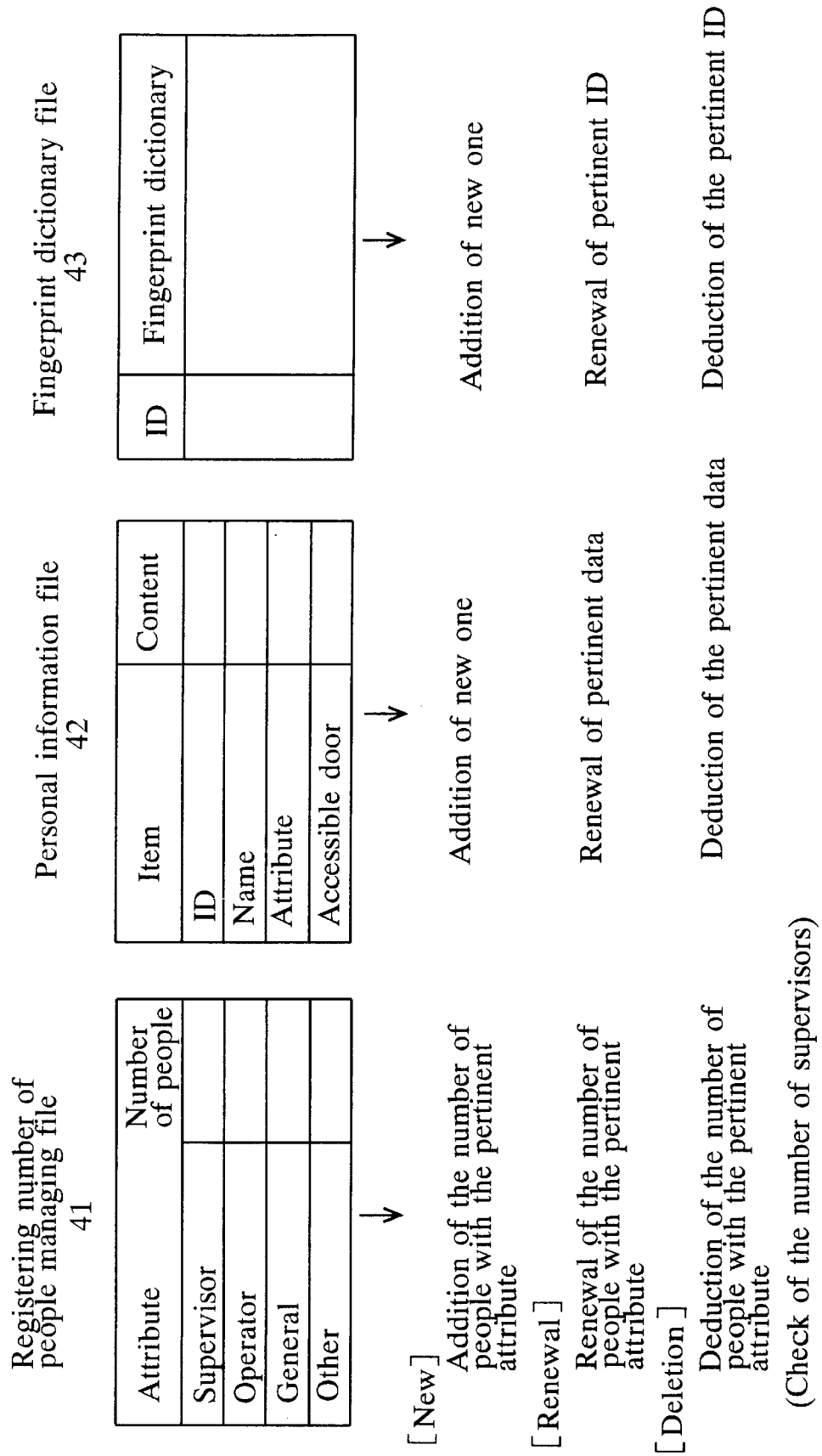
FIG. 11 is an explanatory diagram of a file in an embodiment according to the invention.

FIG. 11 is an explanatory diagram of files in the embodiment according to the invention, containing a registering number of people management file 41, a personal information file 42 and a fingerprint dictionary file 43. The registering number of people management file 41 manages the number of people having fingerprints registered according to the attributes of supervisor, operator and general. And, the personal information file 42 registers the contents of respective items of ID, name, attribute, and accessible door entered at the time of registering fingerprints. And, the fingerprint dictionary file 43 contains a fingerprint dictionary in correspondence with the ID, and the fingerprint dictionary registers fingerprints by known means using minutiae of fingerprints to form a checking dictionary.

Therefore, in step (A2) of FIG. 7, it is easy to judge whether or not the registered number of supervisors has exceeded two by referring to the registering number of people management file 41. And, in the case of the new registering shown in FIG. 8, the number of people corresponding to the attributes of the registered number of people file 21 is added, and the ID, name, attribute and accessible door for new registering is added to the personal information file 42, and the ID and fingerprint for new registering are added to the fingerprint dictionary file 43.

In the case of renewal shown in FIG. 9, to renew the attribute, the number of people with the pertinent attributes given in the registering number of people managing file 41 is renewed. In such a case, the number of supervisors is checked, and when the registered number of supervisors renewed keeps the prescribed number of two or more, the renewal of the attributes of the supervisors is approved, and when the registered number of supervisors becomes below the prescribed number by renewing from the attributes of the supervisors to other attributes, it can be controlled to reject the renewal. And, the personal information file 42, when the renewal is approved, is renewed according to the contents of the renewal registration. The fingerprint dictionary file 43 has the pertinent ID renewed.

In the case of deletion shown in FIG. 10, the number of people with the pertinent attribute in the registering number of people managing file 41 is subtracted. In such a case, the number of supervisors is checked, and when the number of supervisors after deleting is the prescribed number of at least two, the deletion is approved, and when it is below the prescribed number of at least two, it can be controlled that deletion is not approved. And, the personal information file 42 deletes the pertinent data when the deletion is approved. And, the fingerprint dictionary file 43 has the pertinent ID deleted.

At the time of registering a fingerprint and checking a fingerprint in the entrance and exit control, by referring to the above-described file, security in registering, renewing or deleting a fingerprint and security of entrance and exit control can be improved.

Embodiment 3

Figure 12:
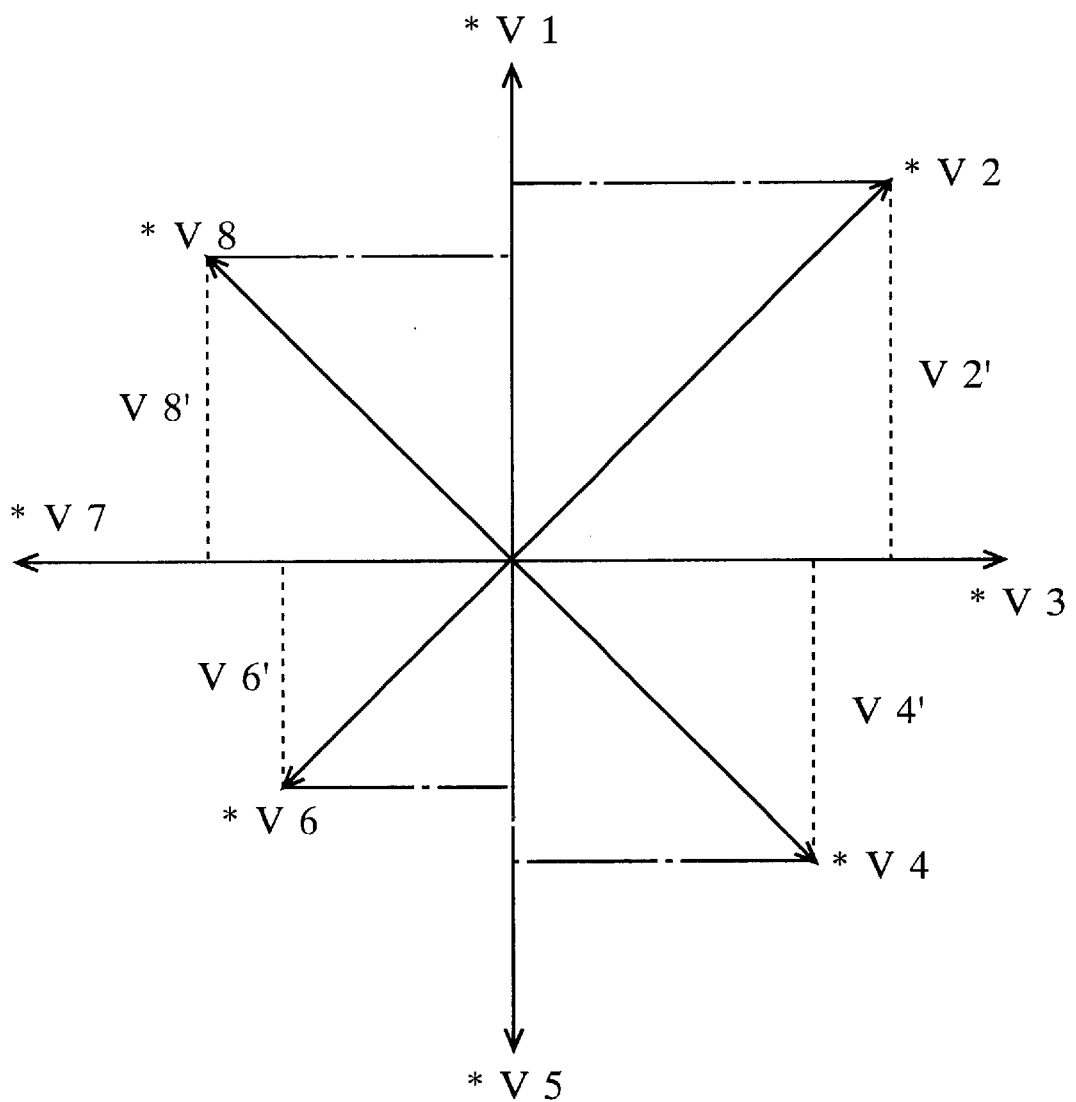
FIG. 12 is an explanatory diagram of judging the ridge line direction of a fingerprint in an embodiment of a fingerprint checking method according to the invention.
Figure 37:
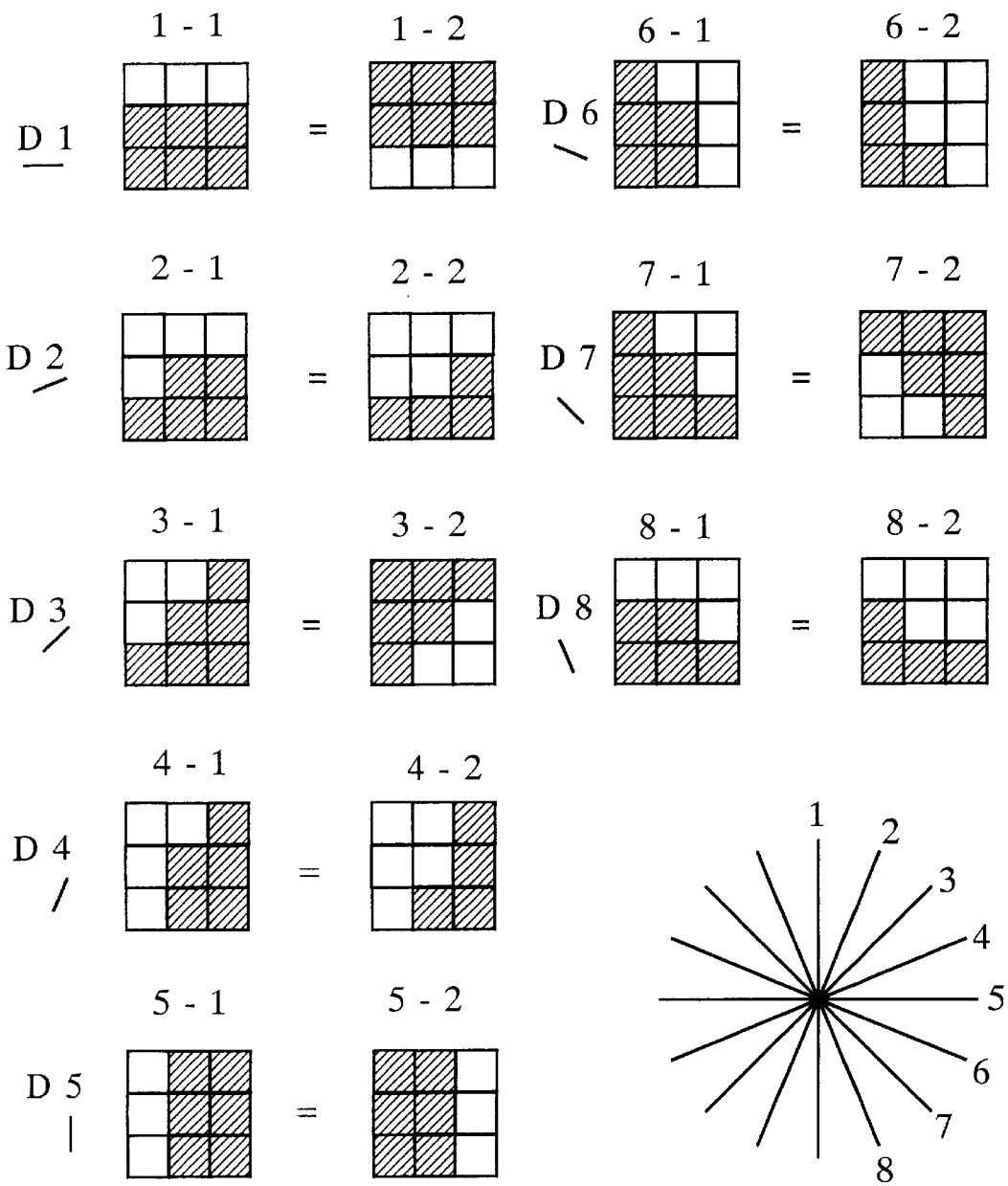
FIG. 37 is an explanatory diagram of judging the direction of picture elements.

FIG. 12 is an explanatory diagram of judging the ridge line directions of a fingerprint in the embodiment of a fingerprint checking method according to the invention. For example, as shown in FIG. 37, the directions of respective picture elements in the block are detected to belong to which of the directions 1 to 8 shown at the lower right in the drawing by using a direction detecting mask formed of 3×3 picture elements. And, the picture element is added for every directions (inclinations) 1 to 8. The contents of a totaling register showing the number of picture elements added to correspond with the directions 1 to 8 at that time are indicated as vectors V1 to V8. In other words, the number of picture elements added in the direction 1 of FIG. 37 is vector *V1, the number of picture elements added in the direction 2 is vector *V2, the number of picture elements added in the direction 3 is vector *V3, and as described above, the directions which intersects at right angles like the directions 1 and 5 are determined as mutually offsetting directional vectors like vector *V1 and vector *5.

And, with respect to the vector *V1, a component in the direction of *V1 of vectors *V2 to *V8 is determined and added. For example, the component in the direction of *V1 of vector *V2 is V2 indicated by a dotted arrow, and the component in the direction of *V1 of vector *V8 is V8 indicated by a dotted arrow. And, vectors *V3, *V7 intersect with vector *V1 at right angles, so that the component in the direction of *V1 is zero. And, since vector *V5 is in the direction of 180 degrees with respect to vector *V1, the component in the direction of *V1 is −V5. Besides, the component in the direction of *V1 of vector *V1 is −V4 as indicated by a dotted arrow, the component in the direction *V1 of vector *V6 is −V6 as indicated by a dotted arrow. Therefore, when the component in the direction of *V1 is added, R1=V1 +V2+V8−V4−V6.

Similarly, as to the directions of vectors *V2 to *V8, R2 to R8 are determined with the components in the respective directions added, and the direction which has the maximum value among the added results R1 to R8 is determined as the direction of ridge lines in the block. For example, when the number of picture elements of vectors * V1, *V3 is many, the number of picture elements of vector *V2 is smaller than that, and the number of picture elements of other vectors *V4 to *V8 is much smaller than that, the direction of vector *V1 or *V3 is determined as the direction of ridge lines in prior art. But, since the added result of the component in the direction *V2 is the maximum value, the direction of *V2 between vectors *V1 and *V3 is determined as the direction of ridge lines.

Figure 13:
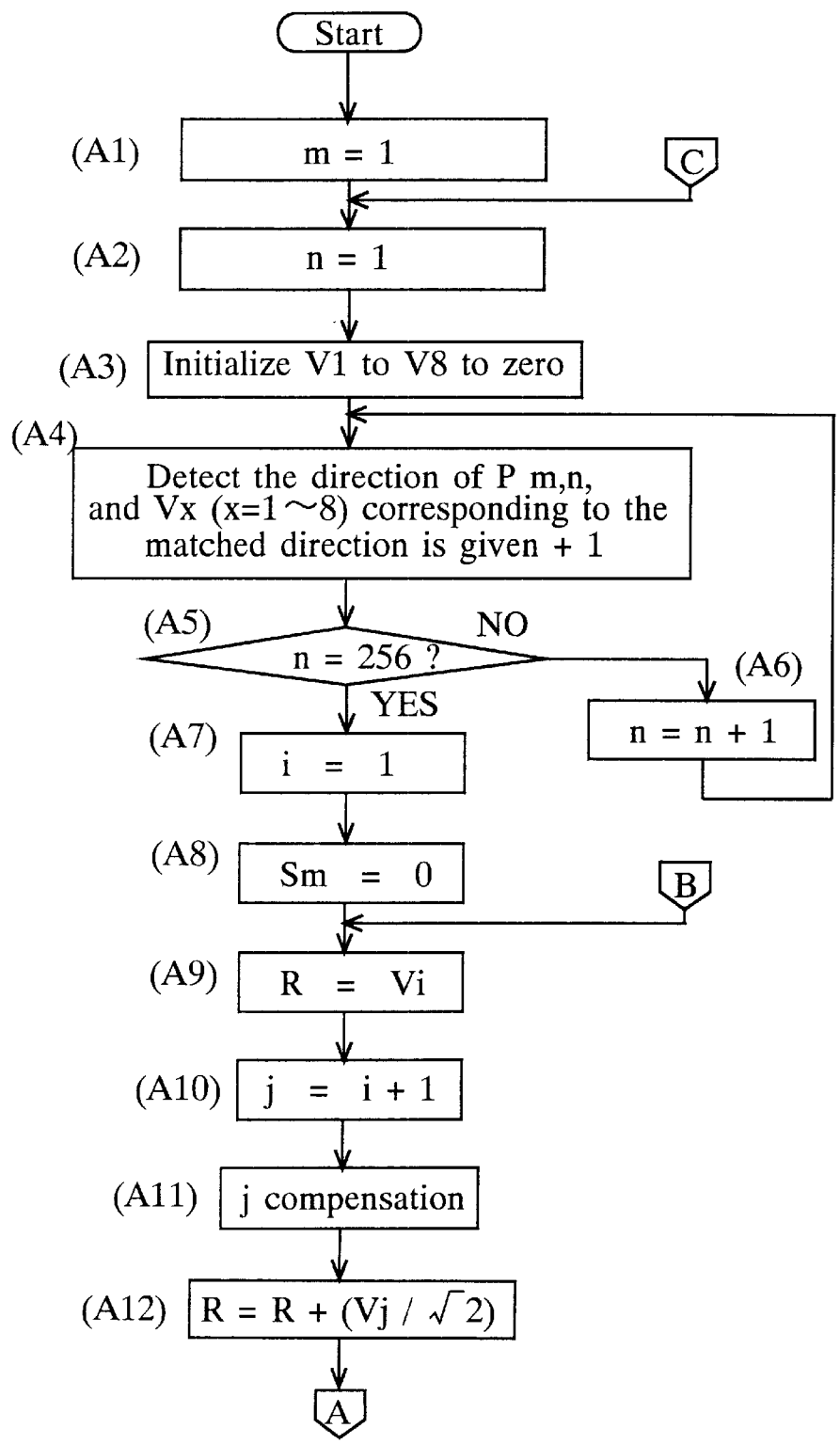
FIG. 13 is a flowchart of an embodiment according to the invention.
Figure 14:
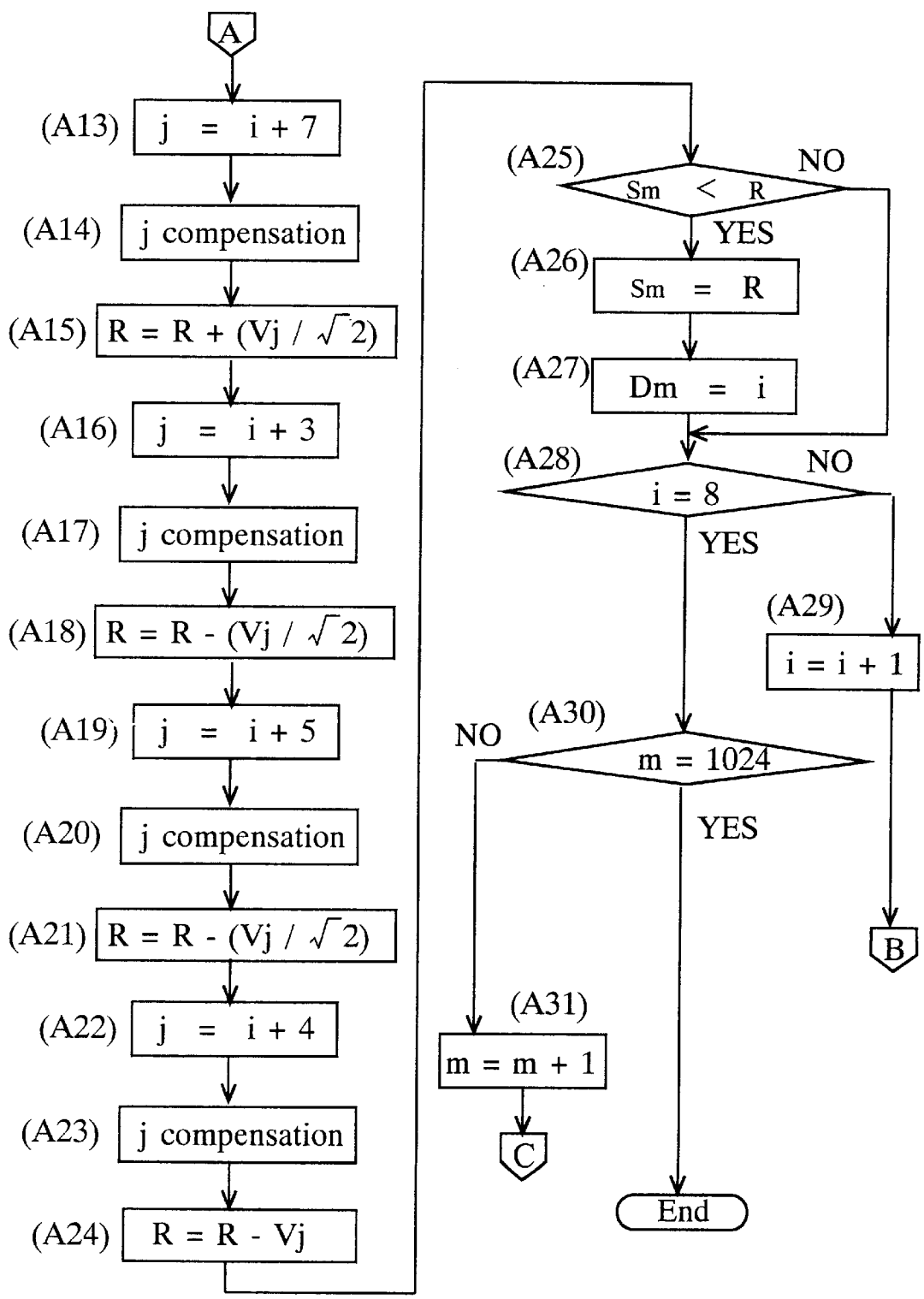
FIG. 14 is a flowchart of an embodiment according to the invention.
Figure 38:
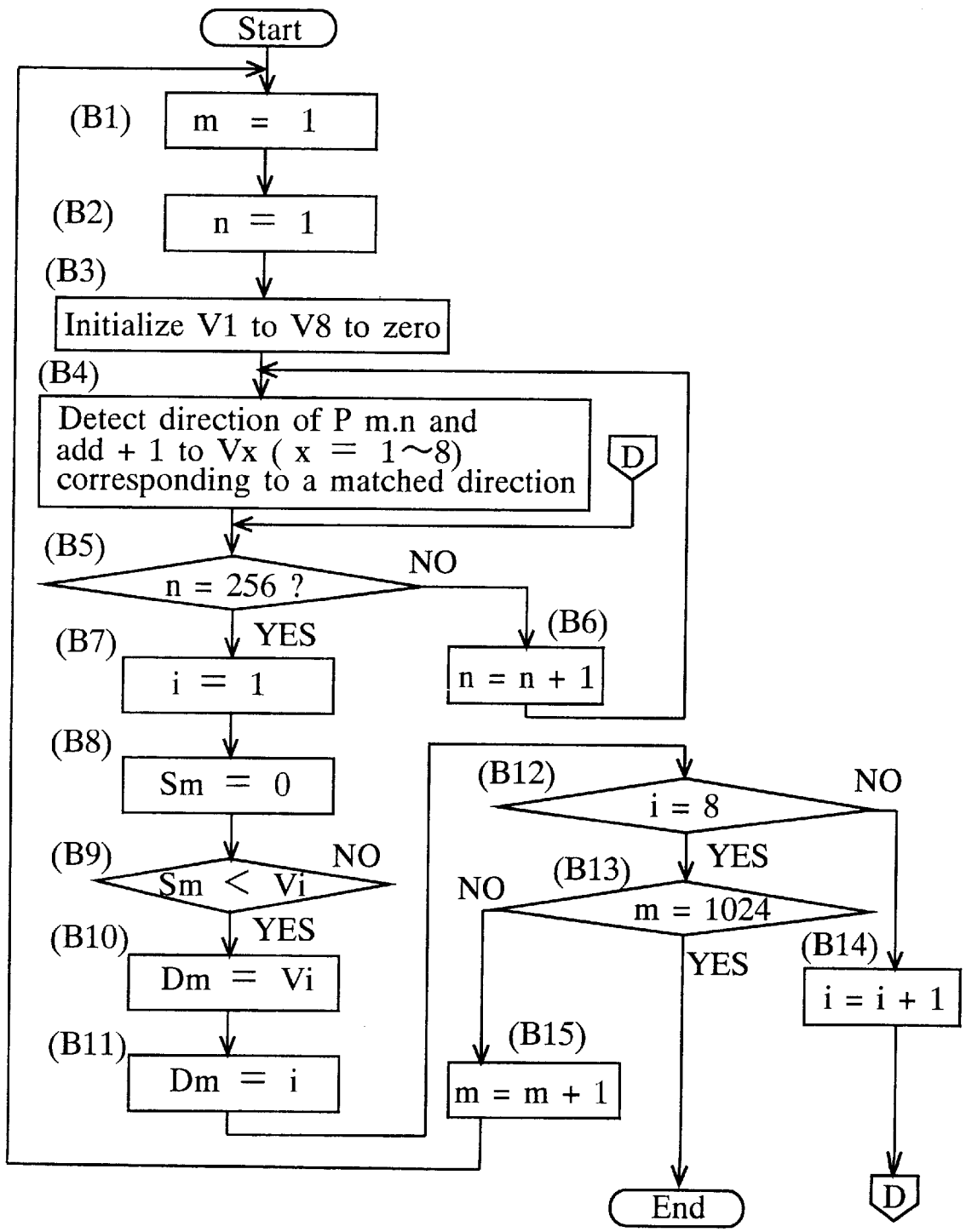
FIG. 38 is a flowchart of prior art.

FIG. 13 and FIG. 14 show a flowchart in the embodiment according to the invention. In steps (A1) to (A8), in the same way as shown in steps (B1) to (B8) of prior art shown in FIG. 38, block number m and picture element number n in the block are determined to be an initial value 1, the content of the totaling register corresponding to a direction is determined to be an initial value 0, and the direction of picture element $P_{m,n}$ (m=1~1024, n=1~256) is detected by using a direction detecting mask made of 3×3 picture elements. And, as to the binarized image of a finger, a histogram of picture elements in the block is produced in respective directions.

Then, it is determined that R=Vi. Specifically, direction-oriented totaling register content Vi is determined to be register R. And, it is determined that j=i+1 (A10), and j is compensated (A11). When i=1, this j compensation is indicated as j=i+1=2, indicating vector *V2 at 45 degrees with respect to vector *V1, but when i=8, it is j=8+1=9, so that it is judged whether or not j exceeds 8, and if j exceeds 8, processing to satisfy j=j−8 is indicated.

And, totaling register content Vj in direction j is multiplied by $½^{1/2}$ to determine a component in direction j, and it is added to the register R (A12). For example, as to the V1 direction component of vector *V2, since *V2 is in a direction of 45 degrees with respect to *V1, V2 indicated by a dotted arrow is obtained by multiplying *V2 by $½^{1/2}$. Namely, step (A12) shows to add this V2 to V1.

Then, it is determined that j=i+7 (A13), and j is compensated (A14). In this case, when i=1, then j=8. But, when i=2, then j=2+7=9. Therefore, when j>8, compensation for j=j−8 is effected. And, in the same way as step (A12), addition of $R=R+(Vj/2^{1/2})$ is effected to determine Vi direction component of Vj (A15). In this case, it is shown that when i=1, addition is effected to determine a V1 direction component V8 of V8 in FIG. 1.

When it is determined that j=j+3 (A16), the same j compensation as in steps (A11), (A14) is effected (A17). In this case, when i=1, then j=4, and since the *V1 direction component V4 of *V4 is in the direction opposite from *V1, it is determined to be −V14−V4, and (V1−V4) is calculated. Step (A18) shows this processing.

It is then determined that j=j+5 (A19), and the j compensation is effected in the same way as in steps (A11), (A14) and (A17) (A20), and the same calculation as in step (A18) is effected (A21). Then, when j=j+4 (A22), the same j compensation as above is effected (A23), and calculation of R=R−Vj is effected (A24). In this case, when i=1, then j=5, and it means vector *V5 in FIG. 12. Since *V5 is in the direction 180 degrees opposite from *V1, the *V1 direction component of *V5 becomes −V5, so that processing of V1−V5 is performed.

And, it is judged whether or not Sm<R (A25). In other words, the content Sm of the maximum valued register for each block is compared with the content R of the totaling register and when Sm<R, the content Sm of the maximum valued register is converted into the content R of the totaling register (A26), and the content Dm of the direction register is determined as the direction i at the time (A27).

And, when it is not Sm<R and next to step (A27), it is judged whether or not i=8 (A28). In other words, it is judged whether or not processing has been completed in the directions 1 to 8, and if not, it is determined that i=i+1 (A29), and processing goes to step (A9). And, if it has been completed, it is judged whether or not m=1024 (A3). Namely, it is judged whether or not processing on 1 to 1024 blocks has been completed, and if not, then m=m+1 (A31), and processing goes to step (A2). If it has completed, the content Sm of the maximum valued register corresponding to the block is fixed as the maximum value. And, the direction corresponding to the maximum value is stored in the direction register Dm.

The pattern in the direction of ridge lines corresponding to the block thus obtained is along the flow of the ridge lines, and by effecting the spatial filtering based on it, occurrence of a bridge between the ridge lines as in prior art can be prevented.

As to the pattern in the direction of ridge lines corresponding to the block, to further smooth the flow of ridge lines, a 3×3 block structured mask is used to determine the average of the focused blocks at the center and the peripheral blocks in the direction of ridge lines, so that it can be determined as the direction of ridge lines of the focused blocks.

Figure 15:
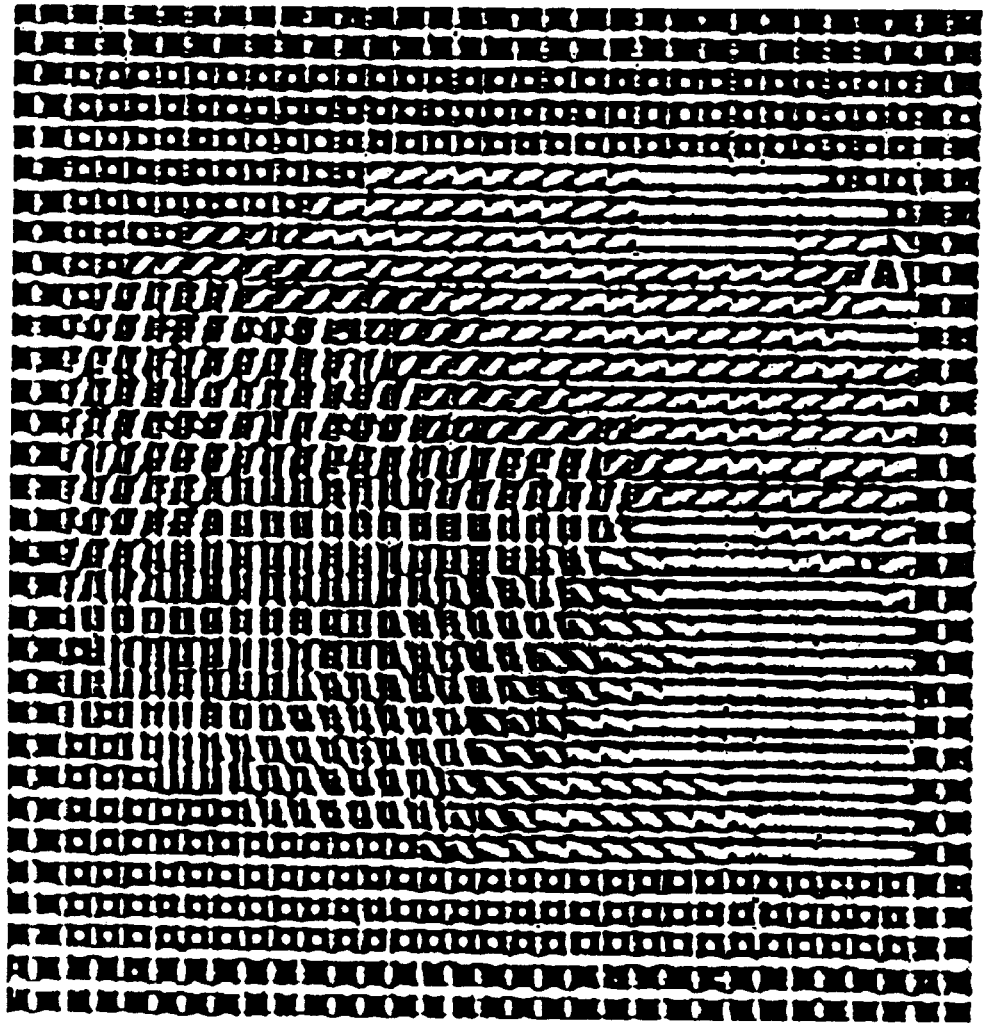
FIG. 15 is an explanatory diagram of a ridge line direction pattern by an averaging process in an embodiment according to the invention.
Figure 39A:
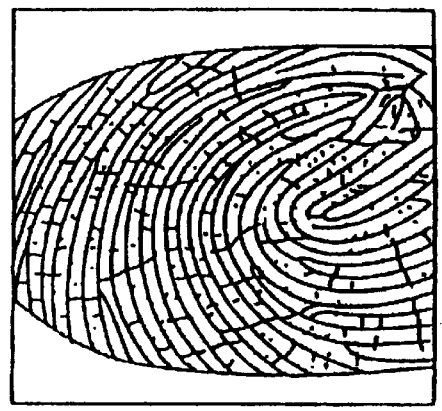
FIG. 39 is an explanatory diagram of detecting the direction of ridge lines according to prior art.
Figure 39B:
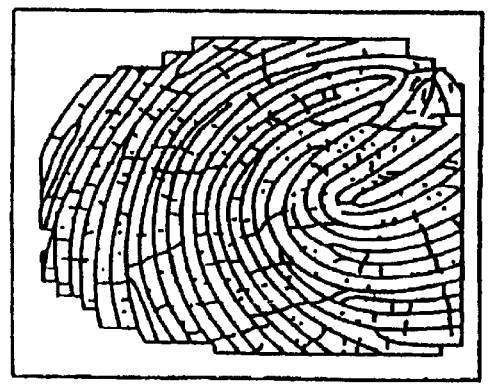
Figure 39C:
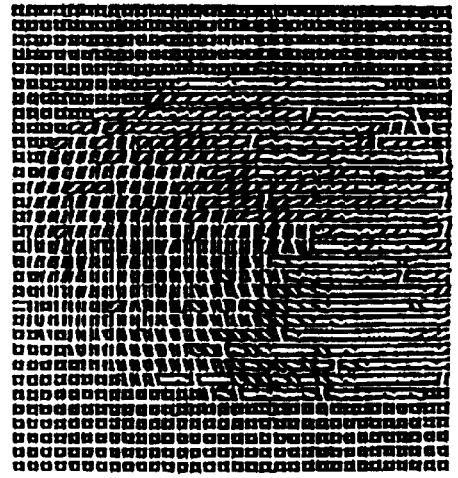
Figure 40D:
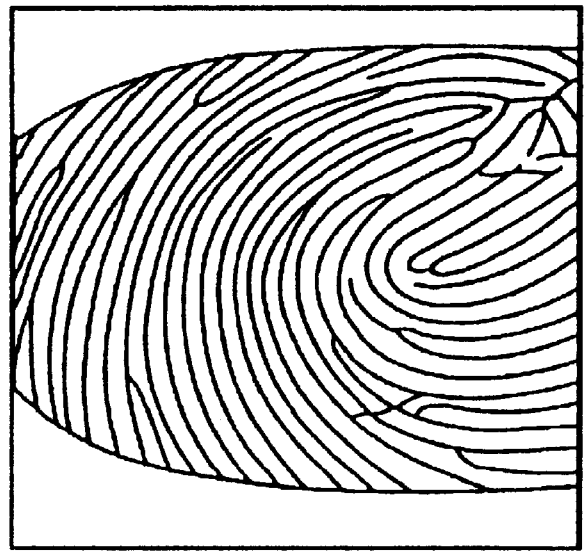
FIG. 40 is an explanatory diagram of detecting the direction of ridge lines according to prior art.
Figure 40E:
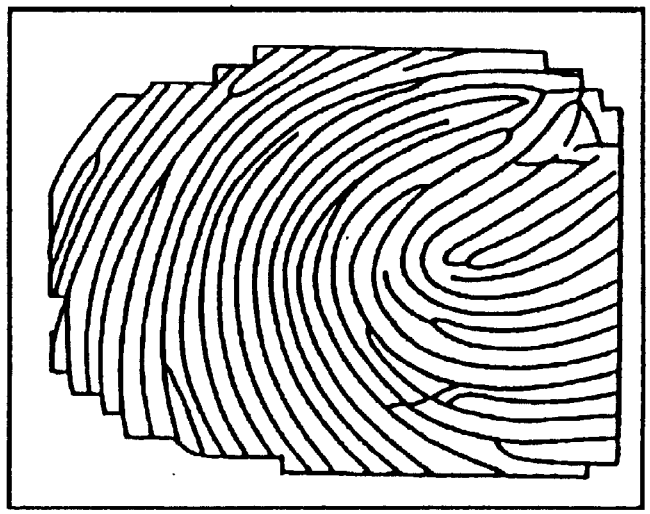
Figure 41A:
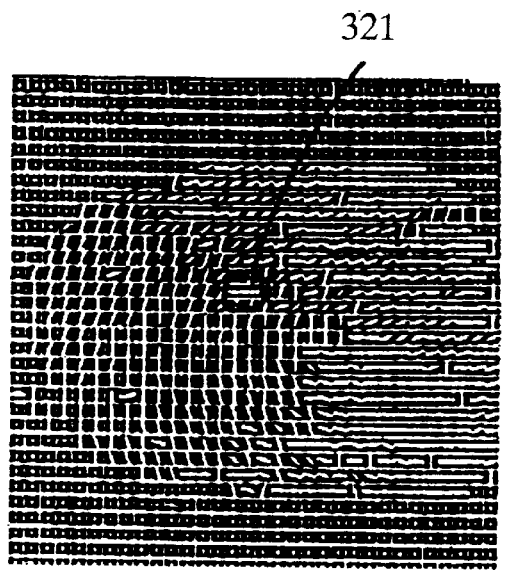
FIG. 41 is an explanatory diagram of a disadvantage of prior art.
Figure 41B:
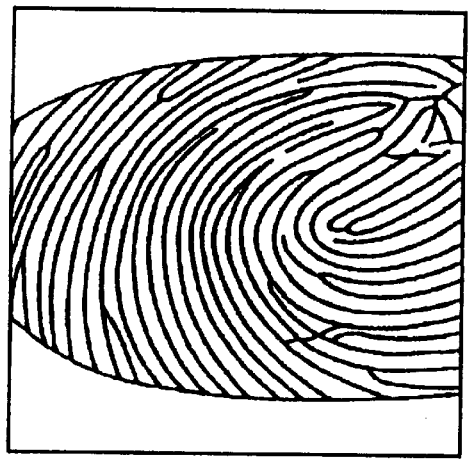
Figure 41C:
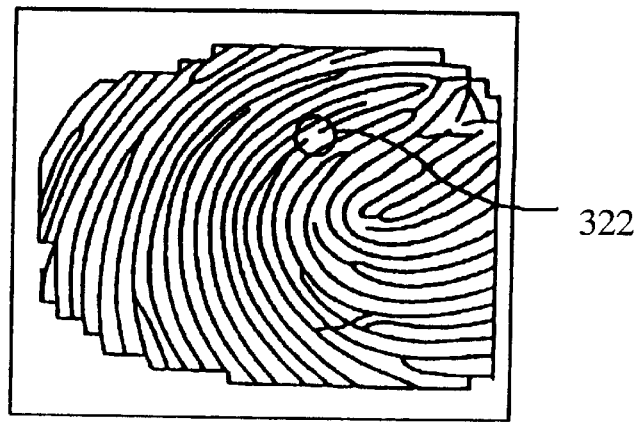
Figure 42:
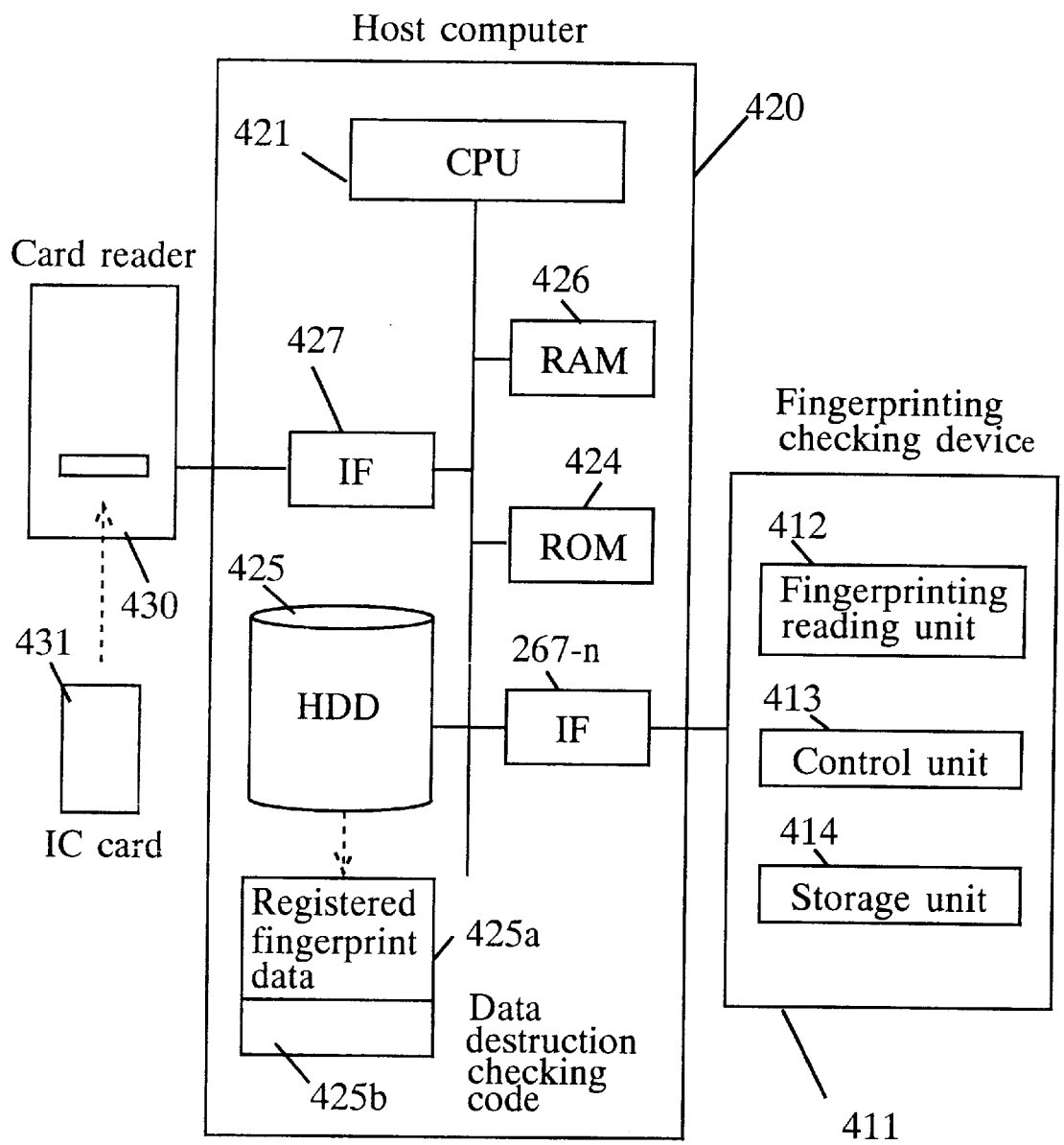
FIG. 42 is an explanatory diagram of a fingerprint checking system.
Figure 43:
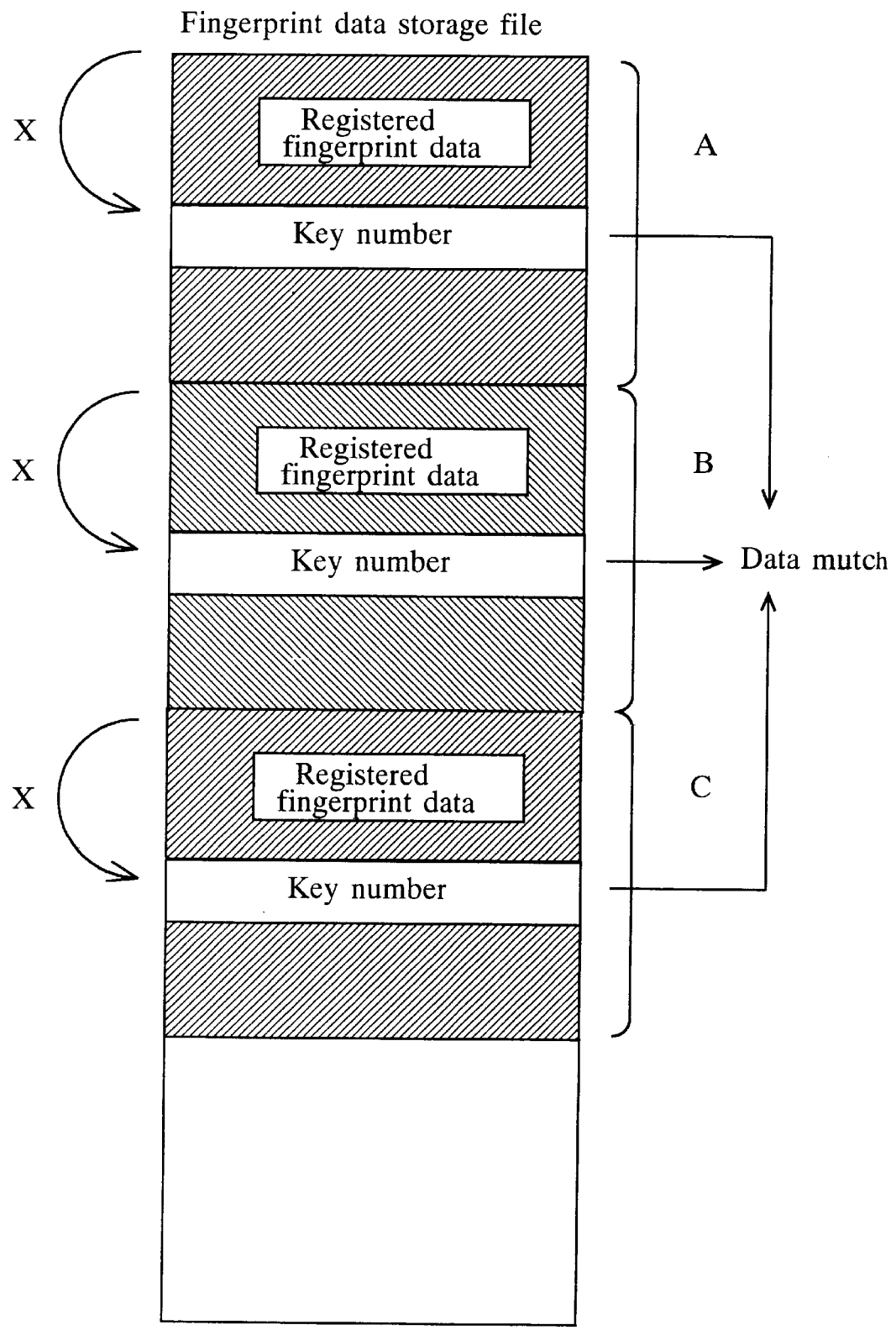
FIG. 43 is an explanatory diagram of extracting a key number-stored area according to prior art.

FIG. 15 is an explanatory diagram of a pattern in the direction of ridge lines by averaging processing in the embodiment of the invention. As described above, a 3×3 block configured mask is used to determine the average of ridge line directions in the focus blocks. It is apparent by comparing the pattern of FIG. 15 with the pattern shown in FIG. 39 (C) or FIG. 41 (A) that the flow of ridge lines is smoothed by the averaging process in the embodiment according to the invention, it is used to effect the spatial filtering, and binarizing is performed, so that accurate minutiae of a fingerprint can be extracted easily.

The above-described embodiment is a case that the picture elements in each block of the binarized image are in eight directions, but not limited to such directions and may be four or six directions for detection. And, the added value of picture elements in each direction is expressed in vector, addition is effected to determine the direction component for each vector, and the direction where such added value becomes maximum can be determined as the direction of ridge lines of the pertinent block.

Embodiment 4

Figure 16:
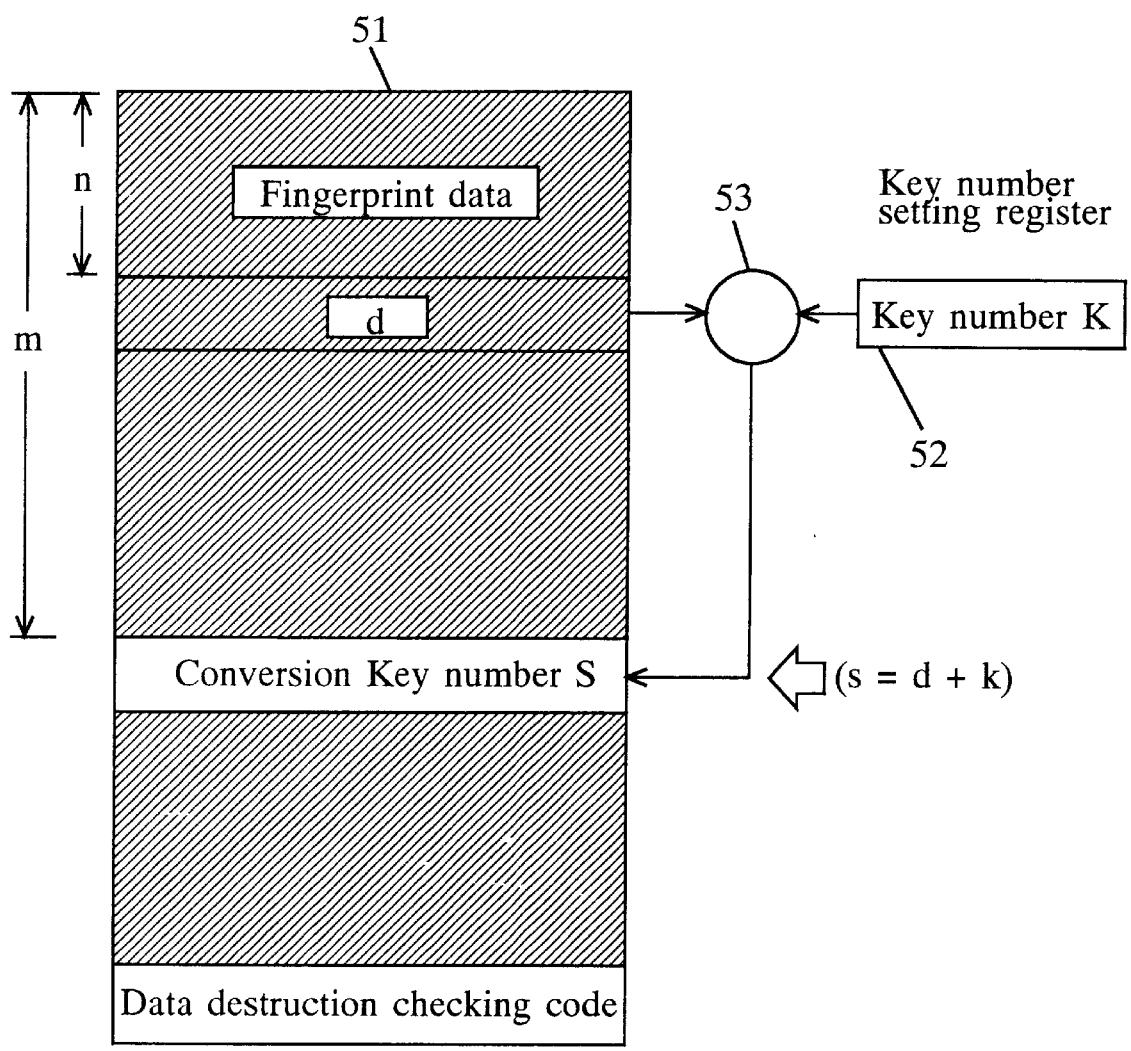
FIG. 16 is an explanatory diagram of a fingerprint checking method according to the invention.

FIG. 16 is an explanatory diagram of the embodiment of a fingerprint checking method according to the present invention, in which a conversion key number s is produced by a previously defined function by a computing unit 53 such as an adder, subtracter, multiplier or scientific calculator from a content d at the n-th byte of fingerprint data in a registered fingerprint data storage file 51 and a key number k set for a key number setting register 52, and it is inserted at the m-th byte of the fingerprint data. And, FIG. 16 also shows a state with a data destruction checking code added. In this case, n, m and k are kept confidential, and n and m can be any arbitrary value and determined in advance.

For example, when it is assumed that the content d at the n-th byte of the registered fingerprint data is $18_{(h)}$ in hexadecimal notation, the key number k which is entered through a keyboard or ten-key and set for the key number setting register 52 is $7_{(h)}$, and the computing unit 53 is an adder, then $s=d+k=18_{(h)}+7_{(h)}=1F_{(h)}$, and the conversion key number s is inserted at the m-th byte of the registered fingerprint data.

When the key number $k=7_{(h)}$ is entered to check a fingerprint, the fingerprint checking device reads the content $d=18_{(h)}$ at the n-th byte of the registered fingerprint data and the conversion key number $s=F_{(h)}$ at the m-th byte, the computing unit 3 is operated as a subtracter, and the key number k can be reconstructed by computing $k=s-d=1F_{(h)}-18_{(h)}=7_{(h)}$, so that the reconstructed key number k is checked with the entered key number, and when they match, checking of the affixed fingerprint and the registered fingerprints are started. But, if the key number does not match, it is judged not to be a normal fingerprint check, and the subsequent processing is rejected.

The computing unit 53 functions as an adder at the time of producing a conversion key number and as a subtracter at the time of reconstructing the conversion key number, but it can be functioned as a subtracter at the time of producing the conversion key number and as an adder at the time of reconstructing the conversion key number. It is also possible to perform various functional calculations such as the above-described addition or deduction by multiplying the entered key number k or the content d at the n-th byte by a constant, and a method of effecting various functional calculations can be applied in accordance with the system. Accordingly, even when the conversion key number s is read, the reconstruction of the key number k can be disabled.

As described above, since the conversion key number is stored together with the registered fingerprint data, the registered fingerprint data has a random property even when the fingerprint registering is repeated with the entered key number constant, possibility is low that the content d at the n-th byte of the registered fingerprint data becomes same, and the conversion key number varies every time a fingerprint is registered. Therefore, as described in connection with FIG. 5, even when the registered fingerprint data is checked after entering the same key number to register a fingerprint, it is impossible to find a position where the key number is inserted upon matching. And, if the registered fingerprint data is altered, the conversion key number cannot be reconstructed, so that misuse can be prevented.

Figure 17:
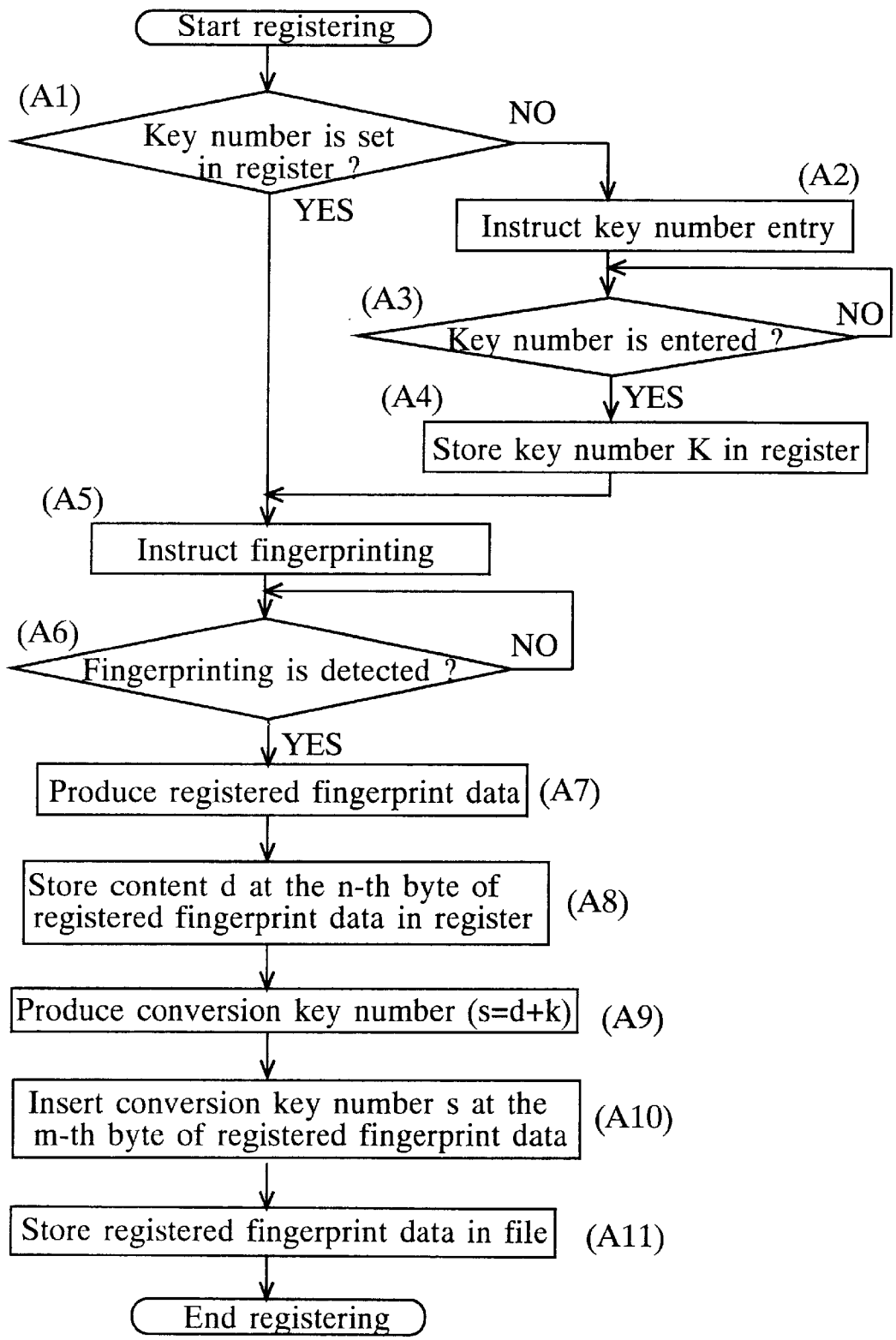
FIG. 17 is a flowchart of registering a fingerprint in an embodiment according to the invention.

FIG. 17 is a flowchart of registering a fingerprint in the embodiment according to the invention, in which it is judged whether or not the key number k has been set for the key number setting register 52 (A1), and if it has been set, fingerprinting is instructed (A5), but if not, the entry of the key number is instructed (A2).

After instructing the entry of the key number, it is judged whether or not the key number has been entered (A3), if the key number has been entered, the key number k is stored in the key number setting register 2 (A4), and processing goes to step (A5). And, it is judged whether or not the fingerprinting has been detected (A6), and if the fingerprinting is detected, the registered fingerprint data is produced in view of the extracted minutiae (A7).

And, the content d at the n-th byte of the registered fingerprint data is stored in the register (A8), the conversion key number s is produced by calculating, e.g., s=d+k by the computing unit 53 (A9), the conversion key number s is inserted at the m-th byte of the registered fingerprint data (A10), and the registered fingerprint data is stored in the file (A11).

Figure 18:
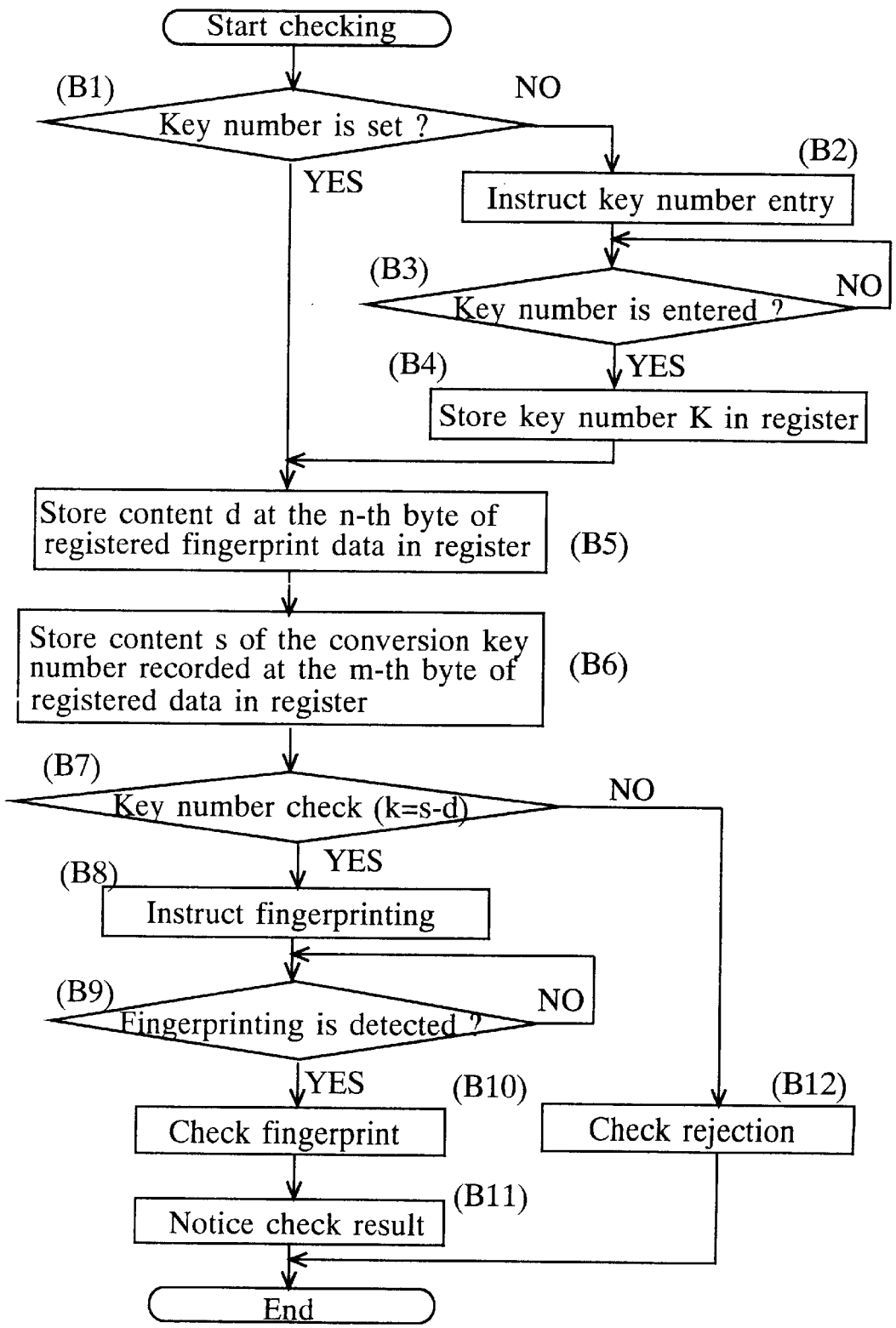
FIG. 18 is a flowchart of checking a fingerprint in an embodiment according to the invention.

FIG. 18 is a flowchart of checking a fingerprint in the embodiment according to the invention, in which it is judged whether or not the key number has been set (B1), if it has not been set, entry of the key number is instructed (B2), it is judged whether or not the entry of the key number has completed (B3), and when the key number is entered in accordance with the instructions for entering the key number, the key number k is stored in the register (B4).

When the key number has been set or it has been entered, the content d at the n-th byte of the registered fingerprint data is read and stored in the register (B5), then the conversion key number s in the content at the m-th byte of the registered fingerprint data is read and stored in the register (B6), and the conversion key number s is reconstructed by the computing unit 53. For example, the key number k is reconstructed as k=s−d, and the reconstructed key number k is checked with the entered key number (B7).

If they do not match, check rejection processing is effected (B12). For example, a message "Key numbers do not match." is displayed, and the subsequent processing is canceled. And, when they match, fingerprinting is instructed (B8), and it is judged whether or not fingerprinting is detected (B9), if fingerprinting is detected, a fingerprint is checked according to some known method (B10), and the checked result is noticed (B11). For example, when the entered fingerprint matches, an unlocking signal is sent to allow the entrance.

Embodiment 5

Figure 19:
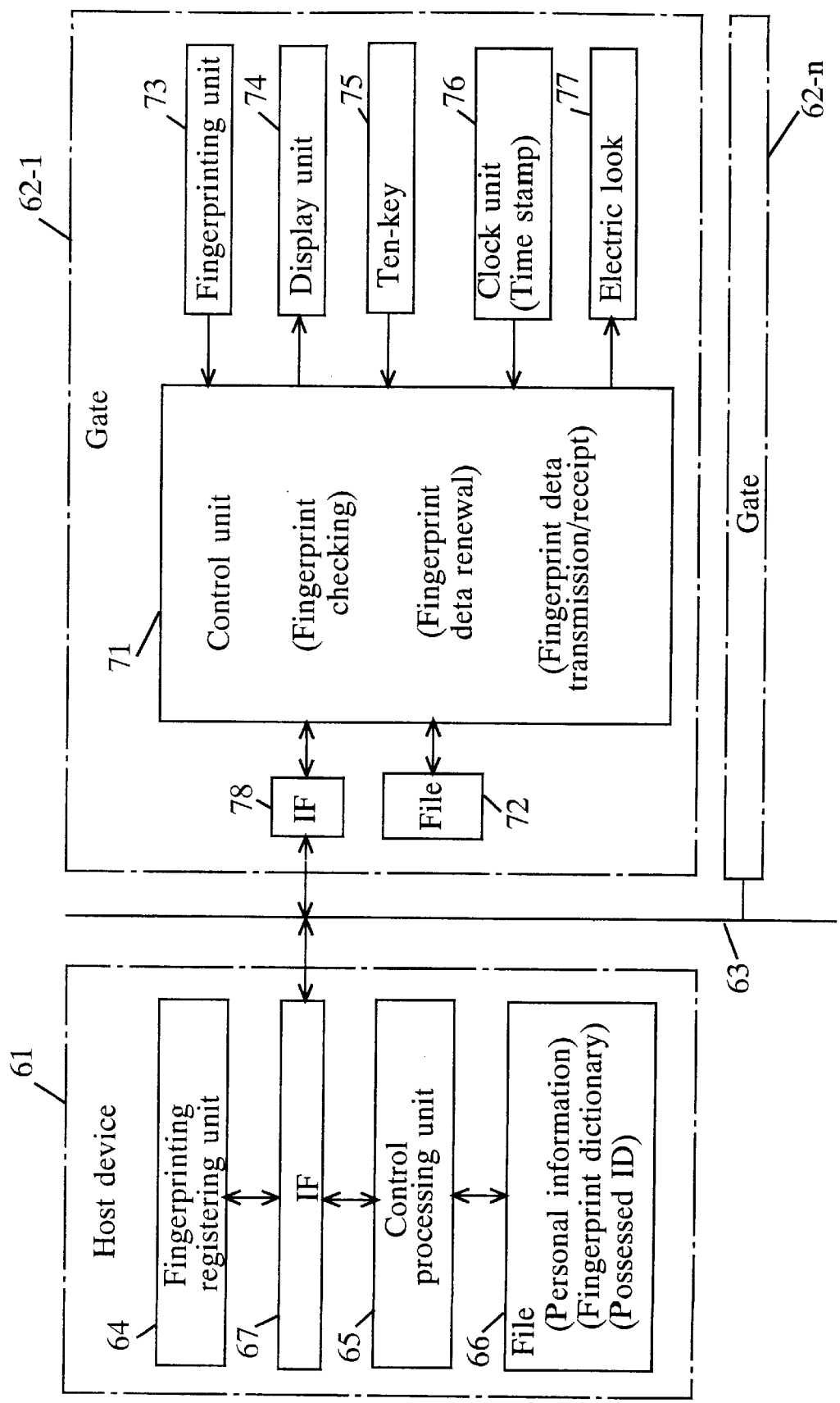
FIG. 19 is an explanatory diagram of an embodiment of a fingerprint checking entrance/exit control system according to the invention.

FIG. 19 is an explanatory diagram in the embodiment of a fingerprint checking entrance/exit control system according to the invention, in which reference numeral 61 denotes a host device, 62-1 to 62-n a gate, 63 a line for a local area network (LAN) or the like, 64 a fingerprint registering unit, 65 a control processing unit, 66 a file, 67 and 78 an interface (IF), 71 a control unit, 72 a file, 73 a fingerprinting unit, 74 a display unit, 75 a ten-key, 76 a clock unit, and 77 an electric lock.

Figure 44:
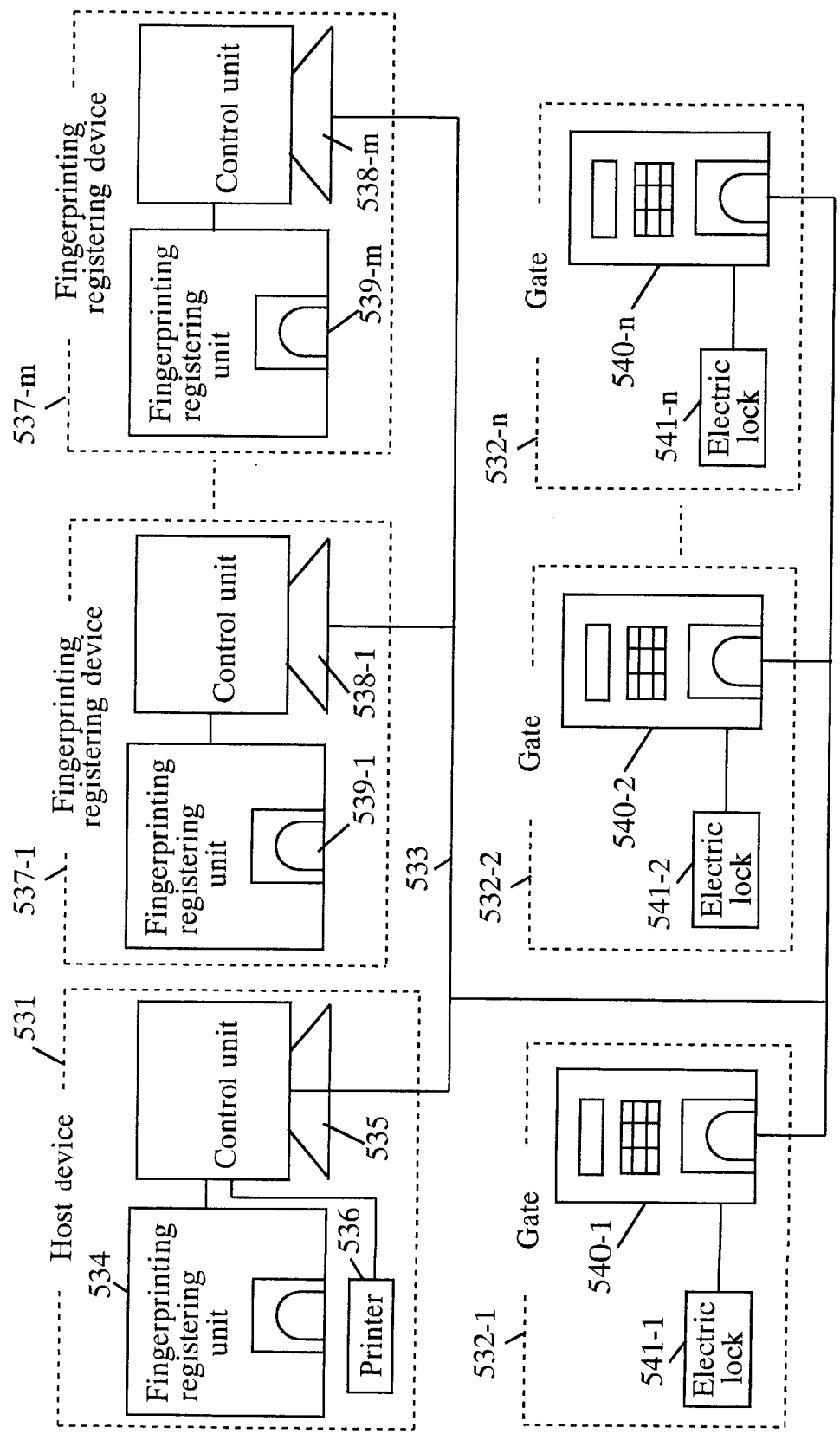
FIG. 44 is an explanatory diagram of a fingerprint checking entrance/exit control system.

The host device 61 is connected with a plurality of gates 61-1 to 61-n through the line 63 to form the fingerprint checking entrance/exit system, and a fingerprint registering device can be connected to the line as shown in FIG. 44. And, at the time of registering a fingerprint by the fingerprint registering unit 64 of the host device 61, personal information of name, post, identification number (ID) and entrance allowing information according to desired room number are entered, and a fingerprint is affixed. The personal information entered at the time of registering the fingerprint is stored in the personal information file of the file 66, the fingerprint data formed by extracting minutiae of the affixed fingerprint is stored in a fingerprint dictionary file, and the identification number (ID) corresponding to the room number according to the entrance allowing information is stored in a possessed ID file.

The control processing unit 65 controls the fingerprint registering in the fingerprint registering unit 64, the production of the personal information file, fingerprint dictionary file and possessed ID file in the file 66, the collection of renewal registered fingerprint data at the gates 62-1 to 62-n, and the transmission of the renewal registered fingerprint data to the gates with reference to the possessed ID file. For example, the above-described functions can be achieved by a program-controlled processor.

The gates 62-1 to 62-n indicate the control of an electric lock 77 for allowing the opening or closing of a door, but can also be applied when the use of a specified device such as a computer is allowed by checking a fingerprint by providing the electric lock which allows to use the device. And, the file 72 is for storing personal information and registered fingerprint data downloaded from the file 66 of the host device 61, and the control unit 71 configures a fingerprint checking unit for checking the registered fingerprint data stored in the file 72 with a fingerprint affixed on the fingerprinting unit 73, controls to release the electric lock 77 when personal identification is authenticated by checking the fingerprint, adds a time stamp according to time indicated by the clock unit 76, controls to renew the registered fingerprint data stored in the file 72 by the affixed fingerprint data, and upon the request from the host device 61, controls to send renewal registered fingerprint data. For example, such functions can be achieved by a program-controlled processor.

Figure 20:
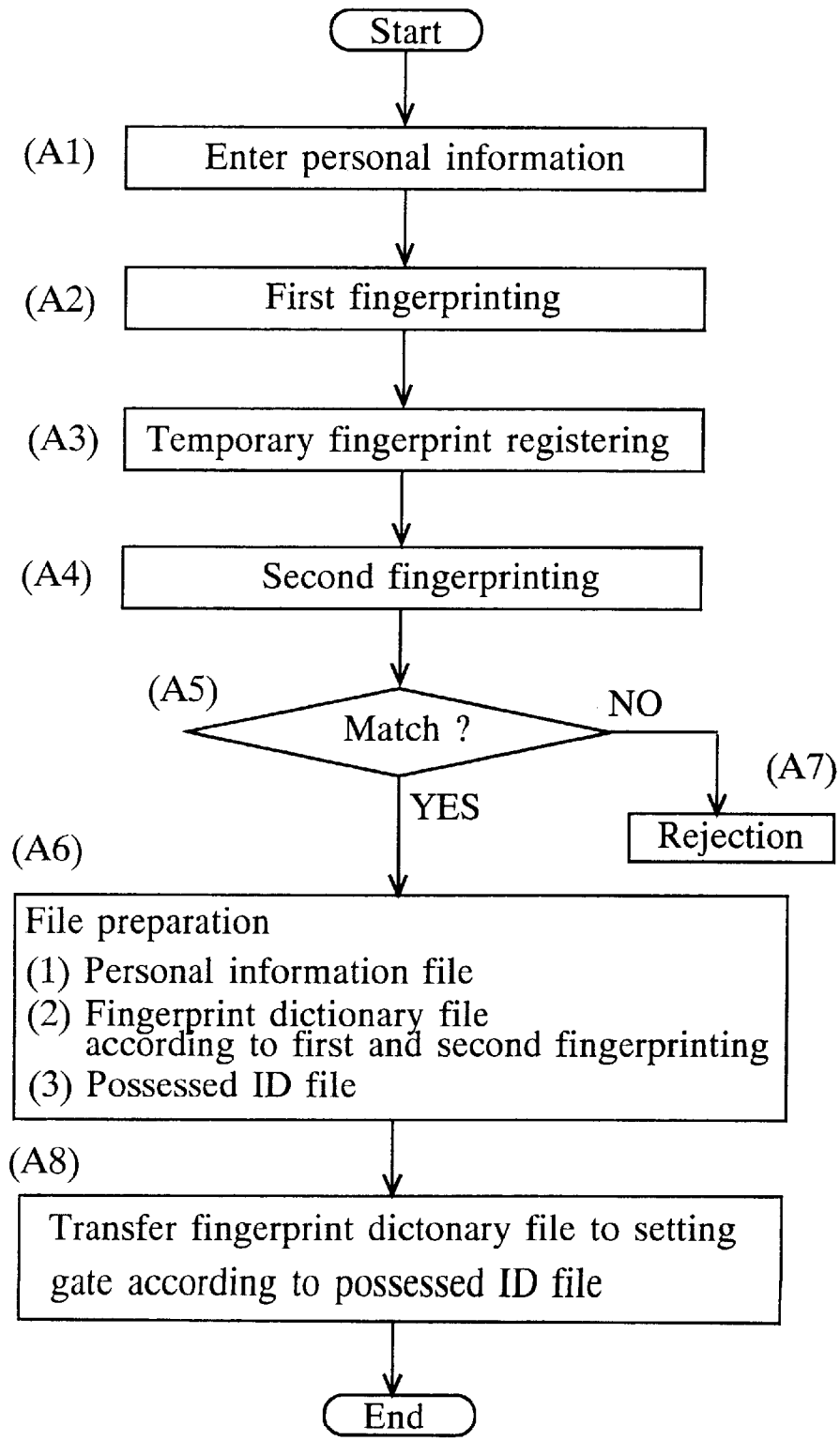
FIG. 20 is a flowchart of registering.

FIG. 20 is a flowchart of registering, in which personal information such as name, identification number (ID), post and desired room number is entered into the fingerprint registering unit 64 of the host device 61 or the fingerprint registering device not shown in FIG. 19 (A2), and the first fingerprinting is effected (A2). Fingerprint data according to the first fingerprinting is temporarily registered (A3). Then, the second fingerprinting is effected (A4). And, the fingerprint data according to the first fingerprinting is checked with fingerprint data according to the second fingerprinting to judge whether or not they match (A5). In other words, they are mutually checked as registered fingerprint data and affixed fingerprint data, and when the personal identification is authenticated, it is judged as acceptance, and if it is judged as rejection, the registering operation is determined as failure (A7). In this case, the fingerprint registering operation is effected from beginning.

And, if matched in the fingerprint checking, the control processing unit 65 controls to produce the file 66 (A6). In other words, the personal information file, the fingerprint dictionary file containing the first registered fingerprint data according to the first fingerprinting and the second registered fingerprint data according to the second fingerprinting, and the possessed ID file prepared according to entrance allowing information are prepared. And, the fingerprint dictionary file is transferred to the setting gate according to the possessed IF file (A8). In this case, transmission is made with the identification number (ID) of personal information corresponding to the registered fingerprint data added. Otherwise, it can be controlled to transmit upon request for the registered fingerprint data based on the identification number (ID) from the gates 62-1 to 62-n.

FIG. 21 is an explanatory diagram of a file, showing an example of a personal information file 81, a fingerprint dictionary file 82 and a possessed ID file 83. And, the personal information file 81 shows a case of ID=ida, name= OGABW, post=GPRJ and entering room numbers=G1~Gn, and a supervisor enabling to use the host device or attribute such as general personnel who are not allowed to use can be stored. And, information such as operation records of personal information can also be stored.

And, the fingerprint dictionary file 82 shows a case of ID=ida, registered fingerprint data=RD1, RD2, and time stamps=TS1, TS2. In other words, first registered fingerprint data RD1 according to the first fingerprinting at registering the fingerprint and second registered fingerprint data RD2 according to the second fingerprinting are stored. And, the possessed ID file 83 has fingerprint-registered IDs stored in correspondence with the gates G1 to Gn. For example, the gate G1 shows a case that IDs such as ida, idb and ide are set, and ID=ida is set for all gates G1 to Gn.

Figure 22:
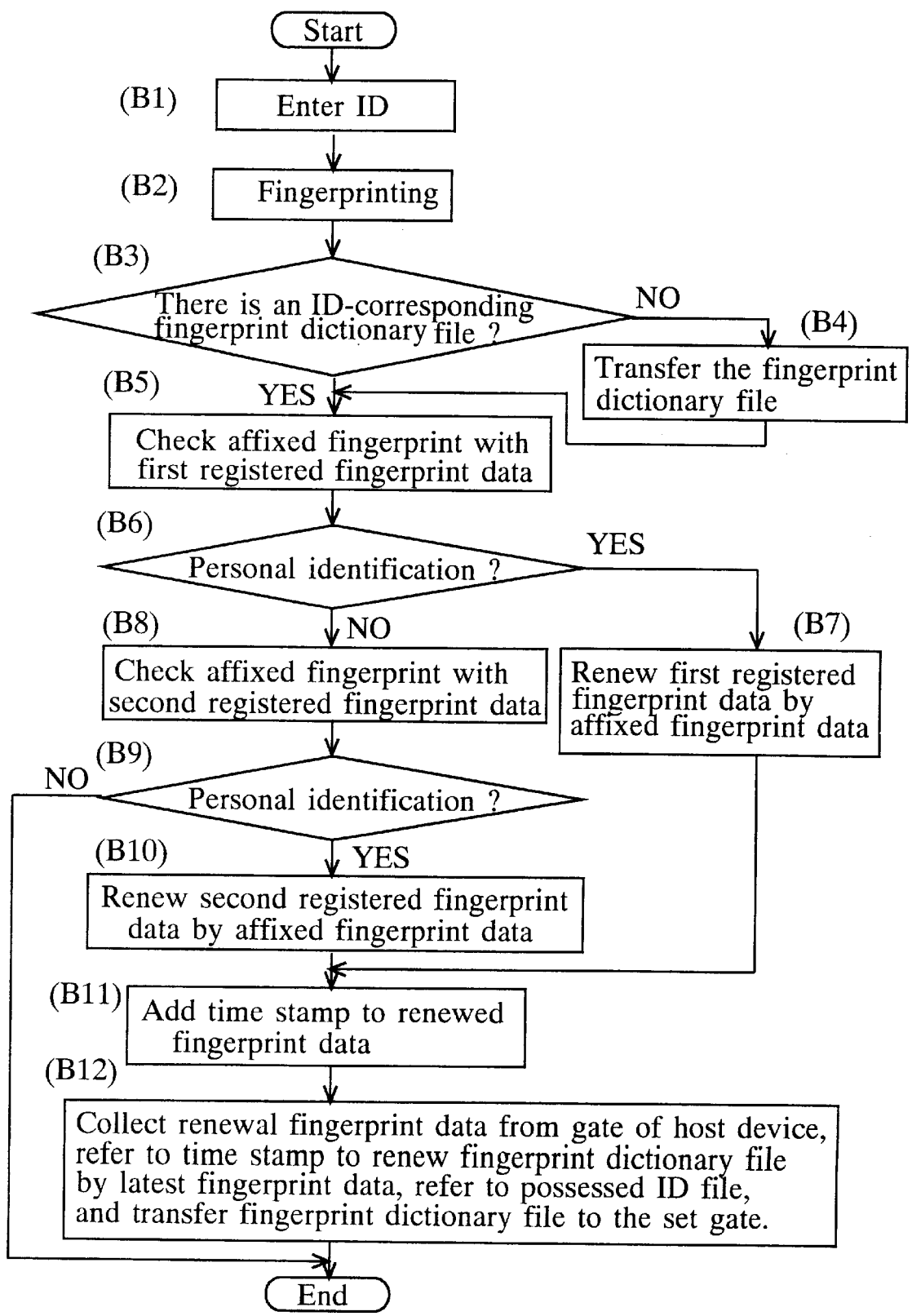
FIG. 22 is a flowchart of checking a fingerprint.

FIG. 22 is a flowchart of checking a fingerprint, in which first an ID is entered through the ten-key 75 at the gate for a room to be entered (B1), and a fingerprint is affixed to the fingerprinting unit 73 (B2). In this case, a message according to the operation order can be shown on the display unit 74. And, the control unit 71 judges whether or not registered fingerprint data corresponding to the entered ID is in the file 72 (B3), and if not, transfers the fingerprint dictionary file (B4). In other words, the address of the host device 61 is added, and a registered fingerprint data requiring signal containing the ID and the gate address is sent to the line 63 through the interface 78.

The host device 61 receives the registered fingerprint data requiring signal through the interface 67, reads the registered fingerprint data corresponding to the ID from the file 66, and sends to the line 63 through the interface 67 with the gate address added. The gate requiring the registered fingerprint data receives the registered fingerprint data through the interface 18 and stores in the file 12. Thus, download of the registered fingerprint data is completed.

And, the affixed fingerprint is checked with the first registered fingerprint data (B5), it is judged whether or not personal identification has been authenticated (B6), and if not authenticated, the affixed fingerprint is checked with the second registered fingerprint data (B8), it is judged whether or not personal identification has been authenticated (B9), and if not authenticated, fingerprint checking is terminated because personal identification can not be authenticated even by the second fingerprint checking, and, it is shown on the display unit 74 that checking has failed.

When personal identification is authenticated in step (B6), the first registered fingerprint data is renewed by the affixed fingerprint data (B7). And, when personal identification is authenticated in step (B9), the second registered fingerprint data is renewed by the affixed fingerprint data (B10). And, a time stamp according to the time of the clock unit 76 is added to the renewed fingerprint data (B11). In this case, date can also be contained in addition to time.

And, according to periodical collection of renewal fingerprint data from the host device 61, the control unit 71 refers to the time stamp added to the renewal registered fingerprint data of the file 72 or uses the flag already sent to the host device 61, identifies renewal registered fingerprint data not sent to the host device 61, and sends the renewal registered fingerprint data, the time stamp and the ID to the host device 61. The host device 61 renews the fingerprint dictionary file according to the ID of the collected renewal registered fingerprint data. In this case, the time stamp is referred to, and even when the renewal registered fingerprint data of a time stamp older than the time stamp already renewed is collected, renewal is not effected according to it.

As to the fingerprint dictionary file 82 shown in FIG. 21, the time stamp added to the collected renewal registered fingerprint data is referred to, and when the time stamp is latest, the first registered fingerprint data RD1 is renewed according to the second registered fingerprint data RD2, and the second registered fingerprint data RD2 is renewed according to the collected renewal recorded fingerprint data. Therefore, the fingerprint dictionary file 82 in the file 66 of the host device 61 stores the latest renewal registered fingerprint data and the previous renewal registered fingerprint data.

The host device 61, upon completion of renewing the fingerprint dictionary file 82, refers to the possessed ID file 83, and sends the renewed registered fingerprint data to the gate having the ID having the renewed registered fingerprint data (B12). Thus, without increasing the data transmission volume through the line 3 between the host device 61 and the respective gates 61-1 to 62-n, the registered fingerprint data stored in the fingerprint dictionary file of the file 33 according to the host device 61 can be determined to be identical with the registered fingerprint data which corresponds to the gate with the entering room determined.

In steps (B3) to (B11), in the same way of renewing the fingerprint dictionary file 82 of the file 66 in the host device 61, it can be controlled so that the second registered fingerprint data is renewed by the affixed fingerprint data, and the first registered fingerprint data is renewed by the second registering fingerprint data. And, as to the system using one registered fingerprint data corresponding to ID, a study function of renewing the registered fingerprint data by the affixed fingerprint data can be applied when personal identification is authenticated. And, a data transmission format between the host device 61 and the gates 62-1 to 62-n can be selected in accordance with the use of a public circuit or LAN for the line 63.

Embodiment 6

Figure 23:
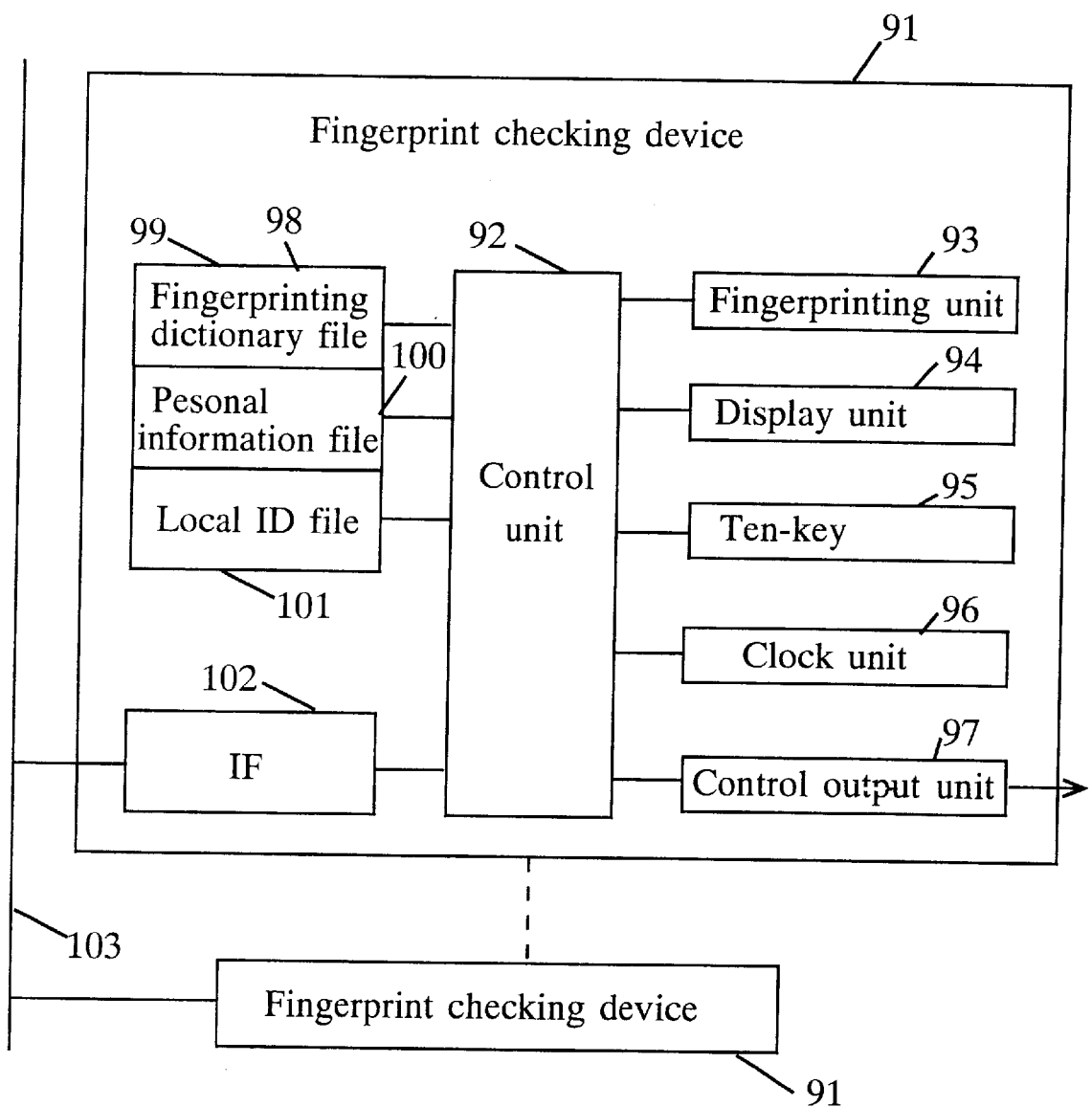
FIG. 23 is an explanatory diagram of an embodiment of a fingerprint checking device according to the invention.

FIG. 23 is an explanatory diagram in the embodiment of a fingerprint checking device according to the invention, in which reference numeral 91 denotes a fingerprint checking device, 92 a control unit, 93 a fingerprinting unit, 94 a display unit, 95 a ten-key, 96 a clock unit, 97 a control output unit, 98 a file, 99 a fingerprint dictionary file, 100 a personal information file, 101 a local ID file, 102 an interface (IF), and 103 a line such as a local area network (LAN) or public circuit.

Multiple fingerprint checking devices 91 are connected through the line 103, and an unillustrated host device is also connected to form the entrance/exit control system. In such a case, when personal identification is authenticated by checking a fingerprint, an unlocking signal is given to an unillustrated electric lock from the control output unit 7, and the lock is released to allow entrance. And, the host device has personal information such as name, post, desired room number, identification number (hereinafter called "ID") and registered fingerprint data in correspondence with the ID, and the personal information and the registered fingerprint data can be downloaded into the file 98 of the fingerprint checking device 91 through the line 103. And, such control means is already known.

Into the fingerprint dictionary file 99 of the file 98, the above-described registered fingerprint data is stored, and personal information is stored in the personal information file 100. The normal ID in the personal information and the registered fingerprint data in the fingerprint dictionary file 99 are mutually linked and stored, and the normal ID is entered from the ten-key 95, so that the control unit 92 can read the registered fingerprint data corresponding to the entered normal ID from the fingerprint dictionary file 99 and check with the affixed fingerprint. And, the local ID file 101 is for storing a local ID having the number of digits smaller than the ID used for registering a fingerprint, namely, the normal ID. This local ID is allocated so as not to overlap.

Figure 24:
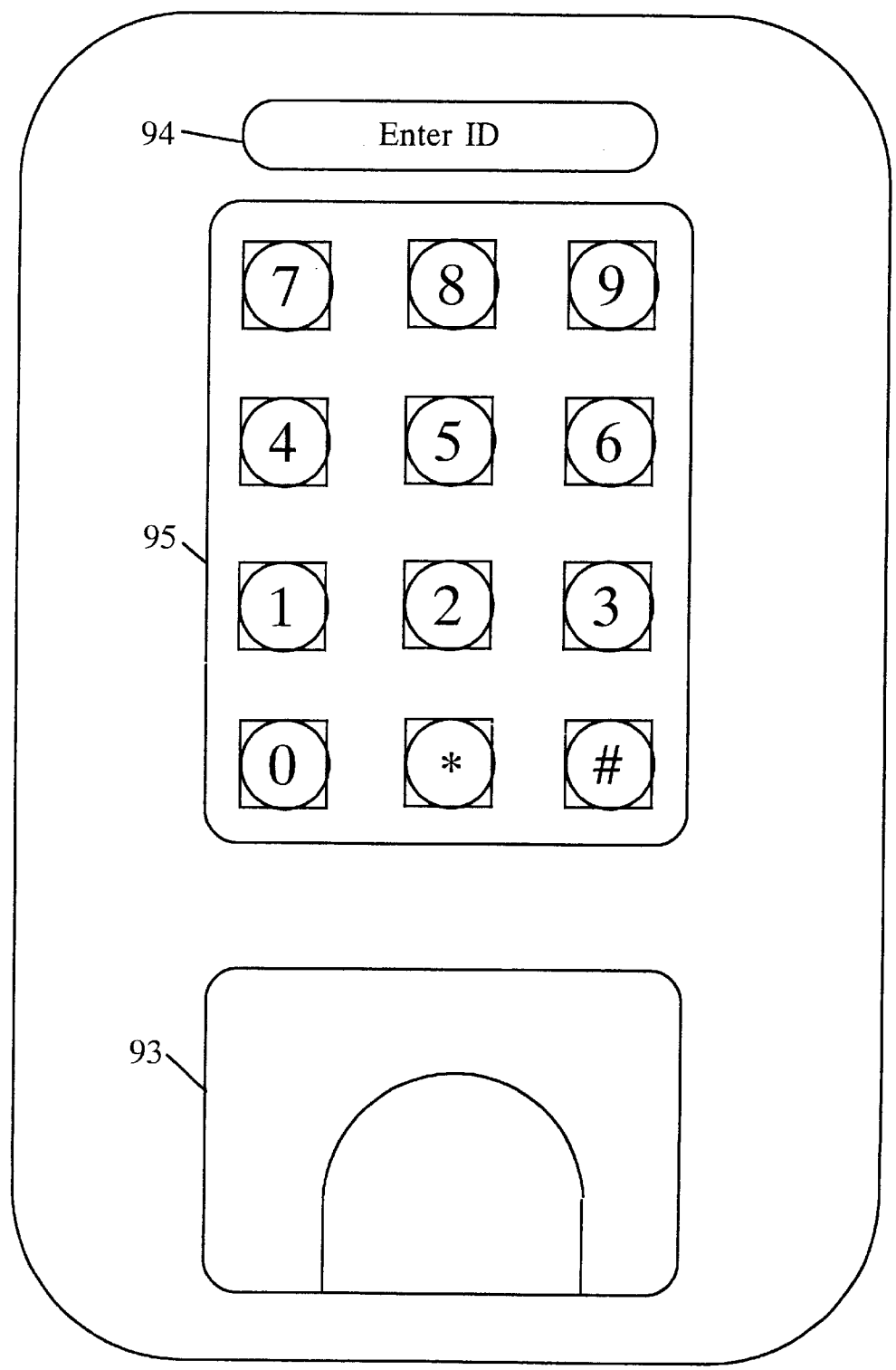
FIG. 24 is an explanatory diagram of a fingerprint affixing part, a ten-key and a display.

FIG. 24 is an explanatory diagram of the fingerprinting unit, ten-key and display unit, in which the fingerprinting unit 93 indicates a finger positioning stand, and an unillustrated CCD camera and a lighting source are positioned below it. And, the display unit 94 is made of a liquid crystal display panel, and a message "Enter ID." is displayed as shown in the drawing. It is also possible to display the position of a finger on the fingerprinting unit 93, so that a finger can be guided to a proper position. And, the ten-key 95 has function keys other than those illustrated.

Figure 25:
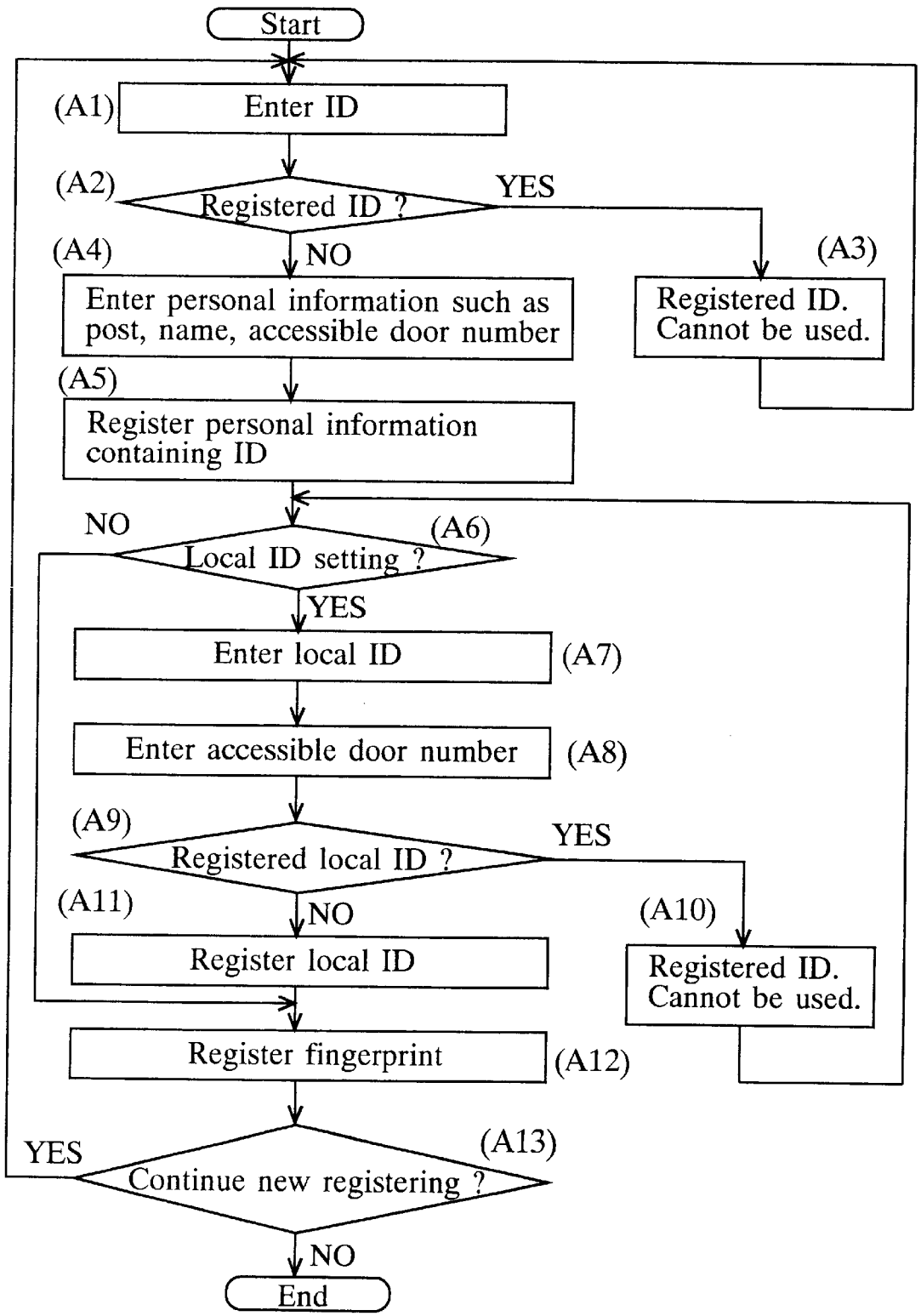
FIG. 25 is a flowchart of new registering.

FIG. 25 is a flowchart of new registering, showing that when there is provided the fingerprint registering unit of an unillustrated host device, a device dedicated for fingerprint registering, or a fingerprinting unit provided on the fingerprint checking device, the fingerprint registering and the local ID registering are effected by the fingerprint registering unit. First, an ID is entered (A1), it is judged whether or not the ID has been registered (A2), if it has been registered, it is displayed that it cannot be used because it has been registered and overlaps (A3), and processing returns to the first step.

If the entered ID has not been registered, personal information such as post, name and accessible door number is entered (A4), and personal information containing the ID is registered (A5). Then, it is judged whether or not it is local ID setting (A6), and if not, processing goes to fingerprint registering (A12). If it is local ID setting, a local ID is entered (A7), accessible door number is entered (A8), it is judged whether or not it is a registered local ID (A9), and if it is a registered local ID, it is displayed that it becomes an overlapped local ID (A10), and processing goes to step (A6) to allow the entry of another local ID.

If it is not a registered local ID, the entered local ID is registered (A11), and processing goes to fingerprint registering (A12). This fingerprint registering can apply some already known means, for example, an image obtained by picturing an affixed fingerprint is binarized, minutiae such as bifurcation points are extracted to prepare fingerprint data, such data is determined to be registered fingerprint data and stored in a file in connection with the ID. And, it is judged whether or not new registering is continued (A13), and if the new registering is continued, processing goes to step (A1), and if it is not continued, processing is terminated.

This local ID, if "0" is not allocated, can be a single digit when nine or less people want to enter a room. In such a case, the same local ID can be determined for a desired room. For example, when the normal ID is "32145" and the local ID "3" is determined for a plurality of rooms, the entry of the one-digit local ID and fingerprinting are sufficient, so that operability is improved remarkably.

When "0" and "00" are not allocated for the local ID, a 2-digit local ID can be allocated to 99 or smaller people who want to enter a room. And, as described above, when the maximum number of registered fingerprint data which can be stored in a single fingerprint checking device is 480, three digits are sufficient to allocate a local ID to them. Therefore, when a particular normal ID is allocated to at least 10000 people, the normal ID has at least five digits, but by allocating the local ID, the number of digits can be sufficient to be smaller than the normal ID, so that the entry of ID is easy for fingerprint checking.

Figure 26:
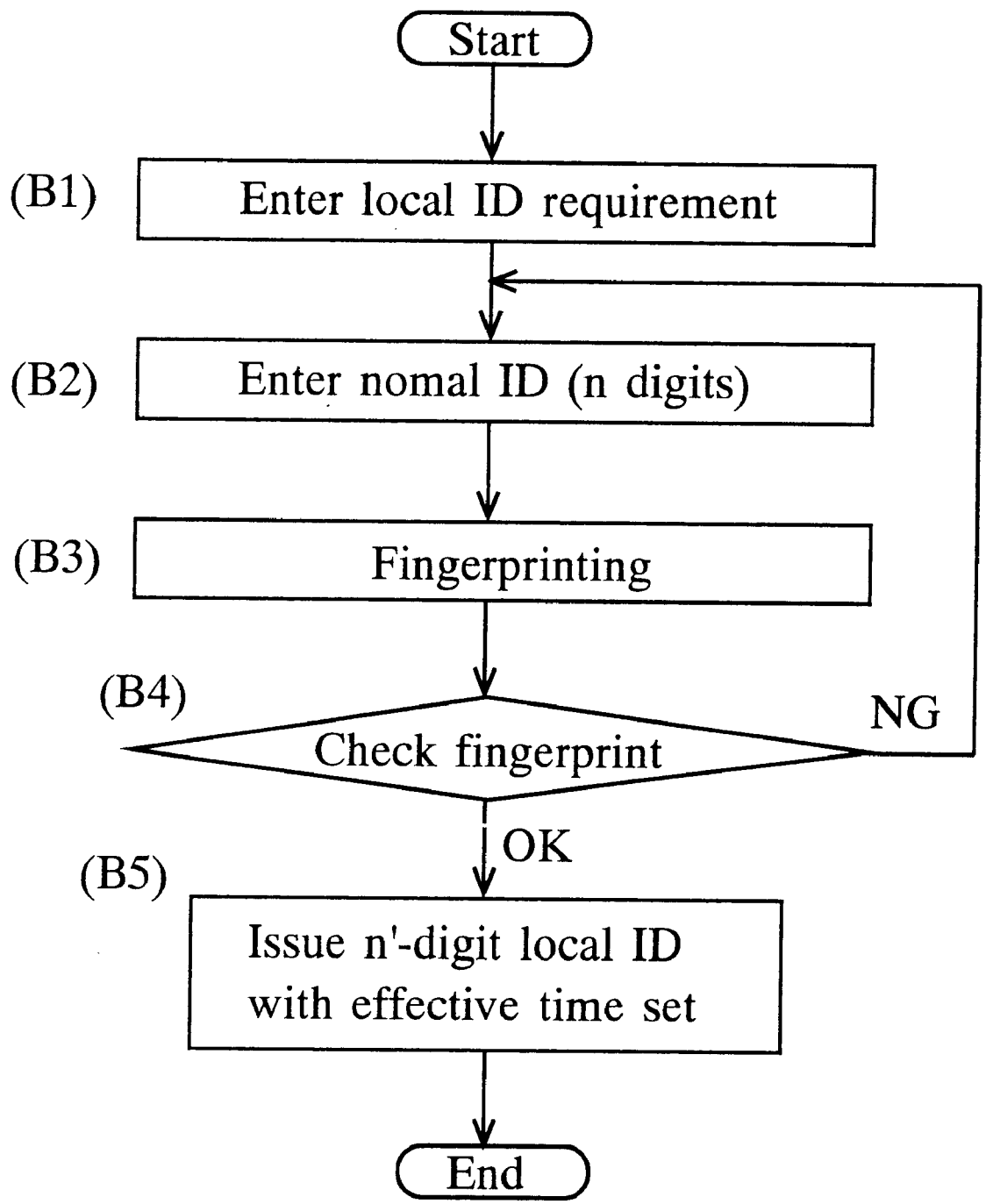
FIG. 26 is a flowchart of requiring a local ID.

FIG. 26 is a flowchart of requiring a local ID, showing that after registering an ID and a fingerprint, a local ID is set in the fingerprint checking device or a fingerprint registering device, and the effective period of the local ID is determined. In other words, the local ID requirement is entered (B1), and an n-digit normal ID is entered (B2). And, a fingerprint is affixed (B3), and it is checked to authenticate personal identification (B4). If the checked result is NG, it means that the entry of the normal ID is wrong or the subject person is not the right one for the normal ID, and processing goes to step (B2).

If the checked result is OK, an n-digit local ID with an effective time set is issued. In this case, it means that N<n, and the fingerprint checking side allocates the local ID while avoiding overlapping. And, the effective time also shows to previously determine by the fingerprint checking device, and various types of effective time setting means of a method which keeps all issued local IDs effective until the same time or a method which issues a local ID and keeps it effective for a prescribed period can be adopted according to the properties of the system.

Figure 27:
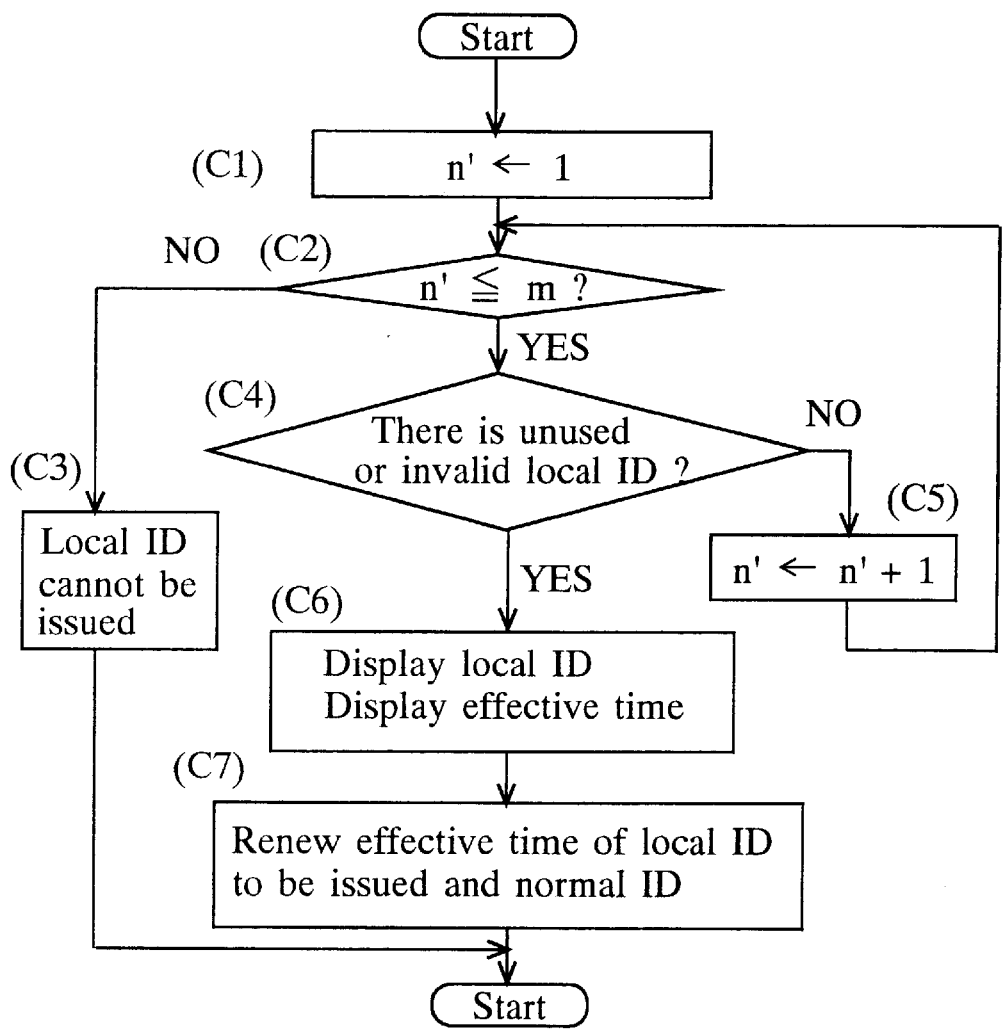
FIG. 27 is a flowchart of issuing a local ID having the maximum digits or below.

FIG. 27 shows a flowchart of issuing a local ID having the maximum digits or below, in which it is assumed that the normal ID has the number of digits n, the local ID has the number of digits n and the local ID has the maximum number of digits m, it is meaningless to issue the local ID having the number of digits n=m, so that the local ID having the number of digits n>m is issued. First, initialization is effected with the number of digits n of the local ID 1 (C1), it is judged whether or not the number of digits n of the local ID to be issued is equal to or less than the maximum number of digits m (C2), and if the number of digits n of the local ID is not equal to or less than the maximum number of digits m, the local ID cannot be issued (C3), and processing of issuing the local ID is terminated.

When the number of digits n of the local ID is equal to or less than the maximum number of digits m, it is judged whether or not there is any unused or invalid local ID (C4), and if there is not any, the number of digits n of the local ID is increased by one digit (n←n+1), and processing goes to step (C2). And, if there is, its local ID and effective time are displayed. Then, the effective time of the local ID to be issued and the normal ID corresponding to the local ID are renewed (C7).

For example, in the fingerprint checking device 91 shown in FIG. 23, a code or the like for the local ID requirement is entered from the ten-key 95, the normal ID is entered, and a fingerprint is affixed on the fingerprinting unit 93, the control unit 92 refers to the file 98 to check the fingerprint, and if personal identification is authenticated, refers to the local ID file 11, and issues the local ID by steps (C1) to (C7) of FIG. 27. The effective time at the time can be set according to the current time indicated by the clock unit 96. And, the effective time and the local ID are shown on the display unit 94, and it can be confirmed by entering through the ten-key 95 or the like.

Figure 28:
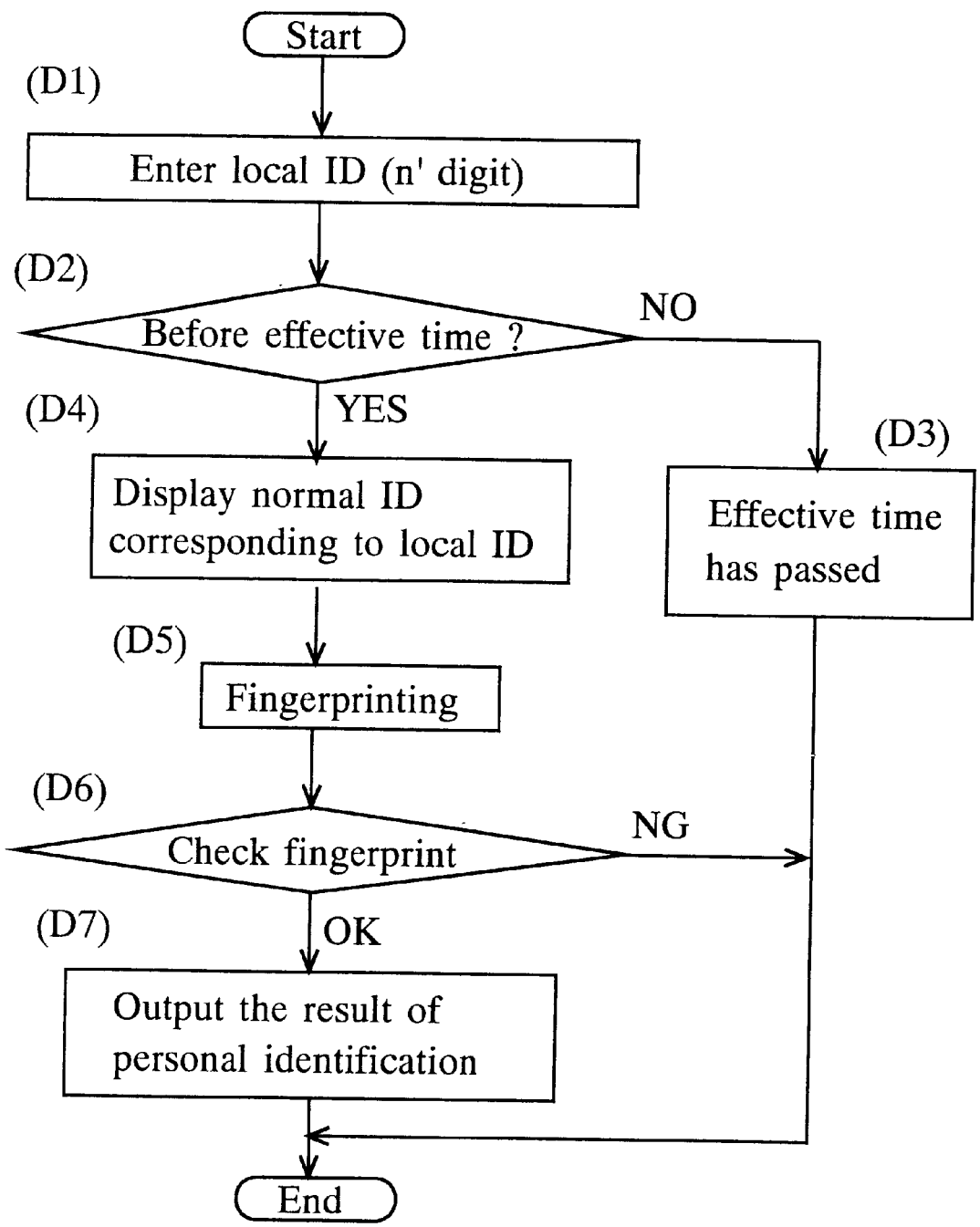
FIG. 28 is a flowchart of checking a fingerprint by entering a local ID.

FIG. 28 is a flowchart of checking a fingerprint by entering a local ID, in which when an n-digit local ID is entered through the ten-key 95 (D1), the control unit 92 refers to a local ID file 101 to read effective time information corresponding to the entered local ID, reads the current time information from the clock unit 96, and judges whether or not the entered local ID is before the effective time (D2).

If the effective time has passed, a message "Effective time has passed." is shown on the display unit 94 (D3), and processing is terminated. And, if within the effective time, the normal ID corresponding to the local ID is displayed on the display unit 94 (D4). Thus, it can be checked whether or not the entry of the local ID is wrong. This step can be omitted, and the instructions for fingerprinting can be displayed.

And, when a fingerprint is affixed on the fingerprinting unit 93 (D5), the control unit 92 which identifies the normal ID corresponding to the local ID reads registered fingerprint data corresponding to the normal ID from the fingerprint dictionary file 99, checks it with the affixed fingerprint, and if the checked result is NG, displays it on the display unit 94, and terminates processing, but if the checked result is OK, outputs the result of personal identification (D7), and sends an unlocking signal corresponding to the electric lock from the control output unit 97 for example.

The present invention is not limited to the above-described embodiments. For example, in the local ID registering process shown in FIG. 25, effective time can be set. Similarly, in the local ID issuing process shown in FIG. 27, an arbitrary local ID is entered, it is judged by the control unit 92 whether or not the pertinent local ID has been issued, the judged result is displayed on the display unit 94, and the entered local ID can be set in the local ID file in correspondence with the normal ID, or the entering can be made again. And, the registered fingerprint data stored in the fingerprint dictionary file 99 is linked with the normal ID stored in the personal information file 100, so that the local ID set in the local ID file and the normal ID are linked, the normal ID is determined from the entered local ID, the registered fingerprint data is read according to the normal ID, so that the fingerprint can be checked. But, by directly linking the local ID with the registered fingerprint data, the registered fingerprint data corresponding to the entered local ID can be read from the fingerprint dictionary file 99 to check the fingerprint.

Embodiment 7

Figure 29:
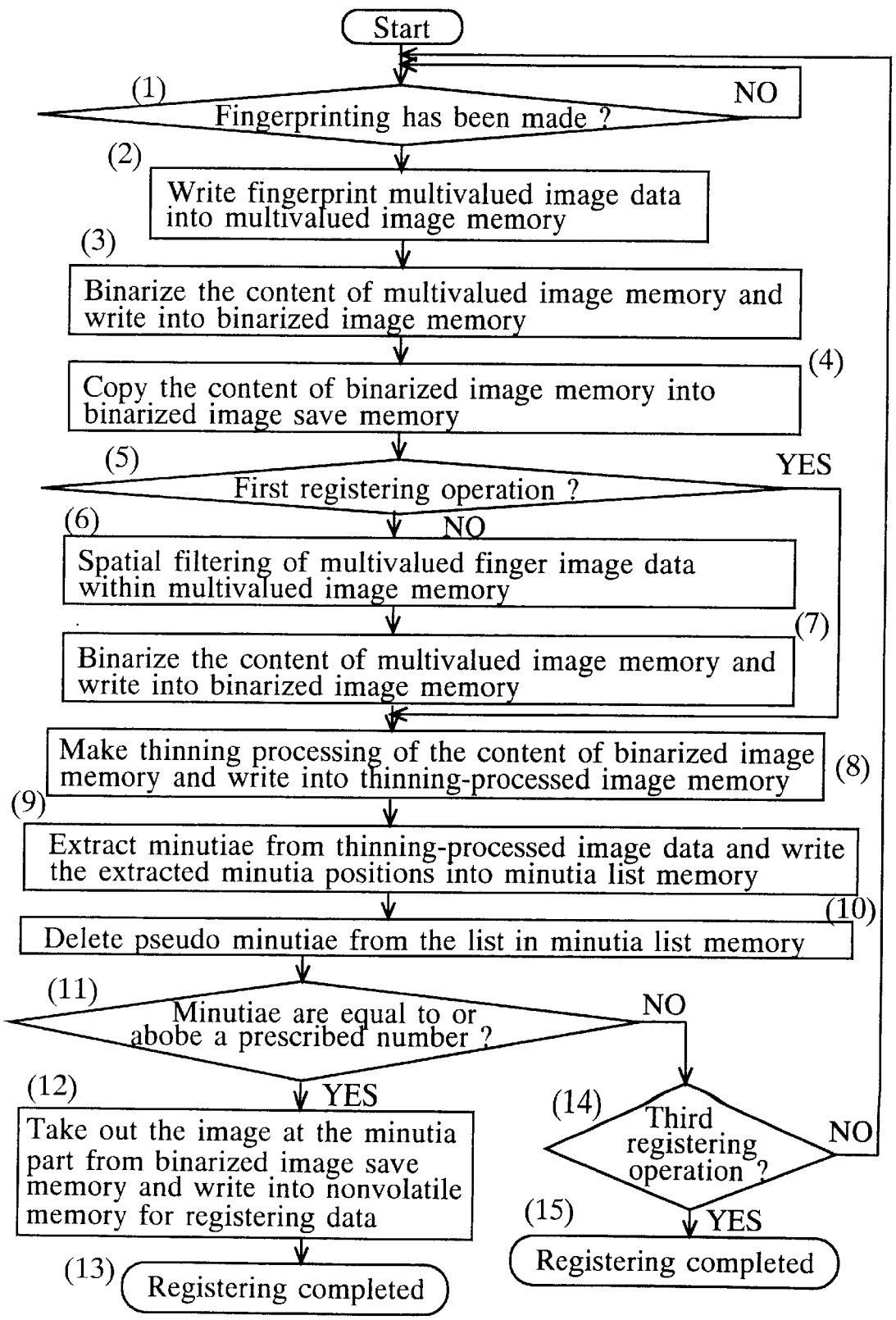
FIG. 29 is a flowchart of an embodiment of a fingerprint registering method according to the invention.
Figure 30:
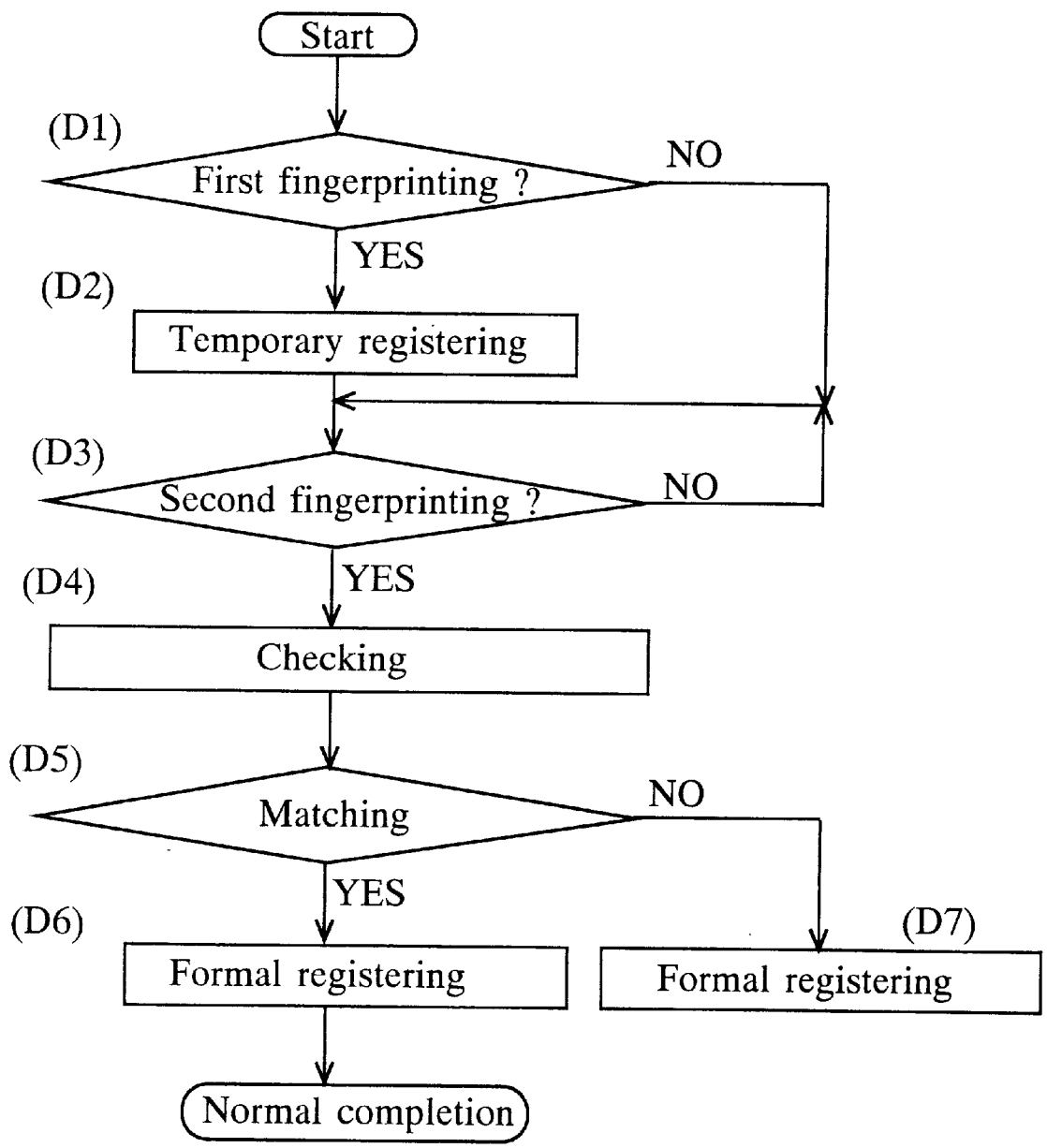
FIG. 30 is a flowchart of registering a fingerprint according to prior art.
Figure 45:
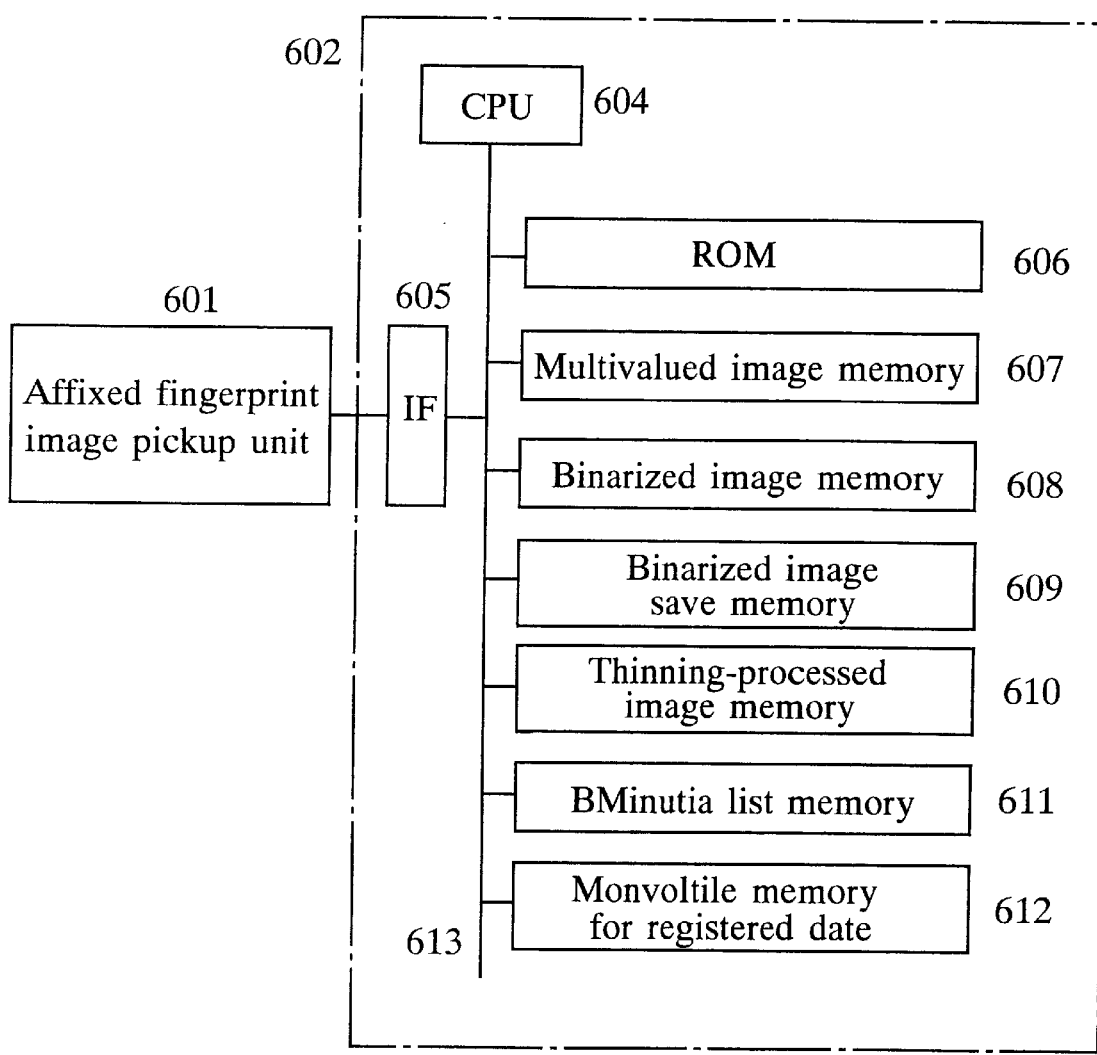
FIG. 45 is an explanatory diagram of a fingerprint checking device.

FIG. 29 is a flowchart of the embodiment of a fingerprint registering method according to the present invention, in which (1) to (15) show steps of registering a fingerprint. The fingerprint registering method will be described with reference to the structure shown in FIG. 45.

First, when registering of a fingerprint is started, it is judged whether or not fingerprinting has been made (1), if the average level in a prescribed range of the image signal by a fingerprint image pickup unit 111 is equal to or above a prescribed value, it is judged that fingerprinting has been made, and multivalued fingerprint image data obtained by A/D-converting the pictured image signal by an interface 115 is written into a multivalued image memory 117 (2). Multivalued image data in the content of the multivalued image memory 117 is binarized and written into a binarized image memory 118 (3), and the binarized image data in the content of the binarized image memory 118 is copied into a binarized image save memory 119 (4).

Then, it is judged whether or not the registering operation is for the first time (5), and if it is the first time, processing goes to thinning processing (8), the binarized image data in the content of the binarized image memory 118 is thinning-processed to change the ridge lines of the fingerprint into thin lines and written into a thinning-processed image memory 110, the thinning-processed image data is used to extract minutiae of ending points or bifurcation points of ridge lines, the extracted minutia points (coordinate information) are written into a minutia list memory 111 (9), the minutiae in a prescribed range, e.g., 0.5 mm, are deleted as pseudo minutiae from the minutia list memory 111 (10).

And, it is judged whether or not the remaining minutiae are equal to or above a prescribed number (11), and if they are equal to or above the prescribed number, the image at the minutia part is taken out of the binarized image save memory 119 based on the coordinate information of minutiae and written into a nonvolatile memory 112 for registering data (12). Thus, the fingerprint registering process is completed (13).

If the number of minutiae is less than the prescribed number, it is judged whether or not the number of registering operations is for the third time (13), and if it is the third time, registering is determined as failure. This number of times may be set to four or five. And, if it is not the third time, processing goes to step (1), and fingerprinting and registering steps (1) to (4) are performed. And, in this case, when the registering is not the first time in step (5) and the fingerprint image is judged to be defective, the spatial filtering is effected on the multivalued image data in the content of the multivalued image memory 117 (6). The multivalued image data undergone the spatial filtering is written into the multivalued image memory 117, and the content of the multivalued image memory 117 is renewed.

Figure 50A:
FIG. 50 is an explanatory diagram of a multivalued image of a fingerprint.

The above-described spatial filtering judges the direction of ridge lines and processes to connect the spaces of a prescribed number of picture elements or below in the direction of ridge lines. For example, the multivalued image data is binarized, one screen is divided into block areas having a prescribed number of picture elements, the direction of ridge lines in each block area is judged according to the picture element arrangement pattern in each block area, and the prescribed number of picture elements is expanded in the direction of ridge lines with respect to the multivalued image data to connect cracks or the like. Therefore, for example, the cracks in the multivalued image shown in FIG. 50(A) are connected as marked by f in FIG. 50(B) by the spatial filtering.

The multivalued image data which is through the spatial filtering in the multivalued image memory 7 is binarized and written into the binarized image memory 9 (7). Therefore, the content of the binarized image memory 9 written in step (3) is renewed. And, processing goes to step (8), and thinning processing, extraction of minutiae and deletion of pseudo minutiae are performed in steps (8) to (10), it is judged whether or not the remaining number of minutiae is equal to or above a prescribed number (11), and if it is so, the image at the minutia points is taken out of the binarized image save memory 119 based on the coordinate information of minutiae and written into the nonvolatile memory 112 for registering data (12). Thus, the fingerprint registering is completed (13).

If the number of remaining minutiae is not equal to or more than the prescribed number, it is judged whether or not the number of registering times is third (14), and if not, processing goes to step (1). If it is the third time, it is determined as registering failure (15). This number of registering times can be identified easily by providing a simple-structured counter.

Figure 46:
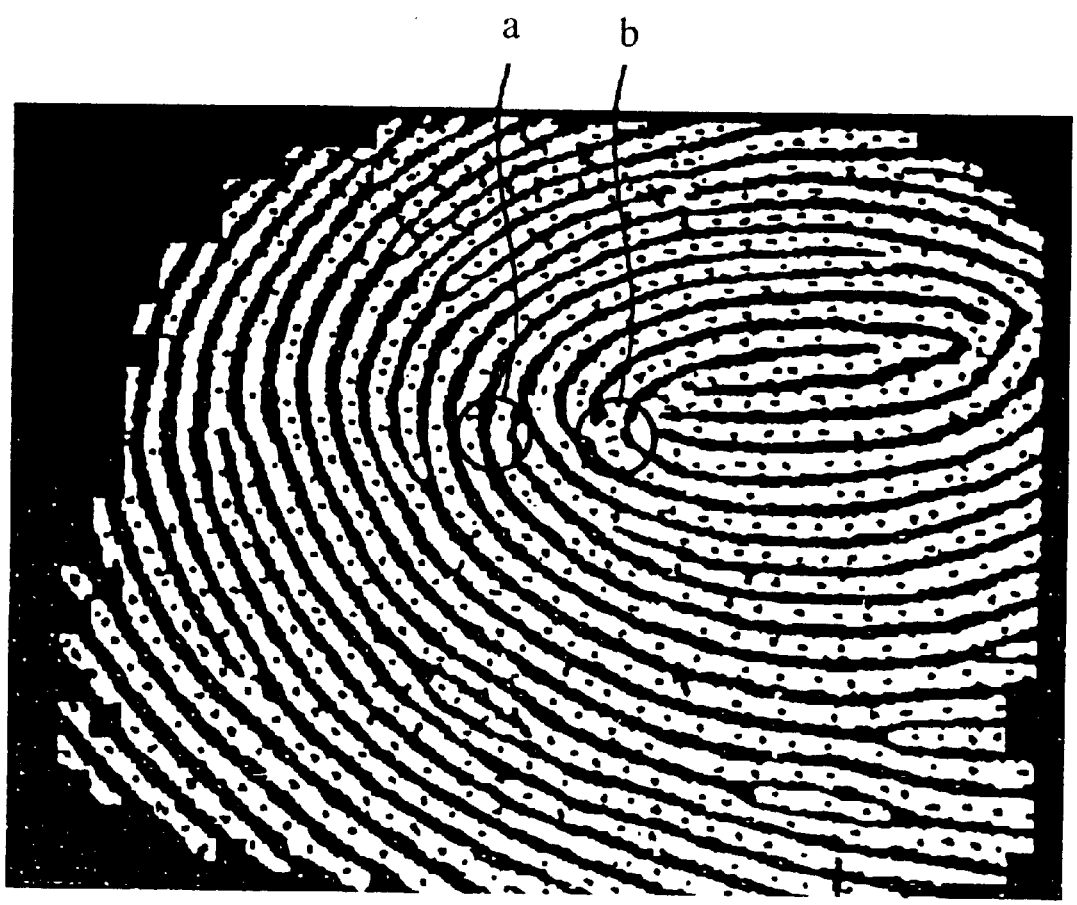
FIG. 46 is an explanatory diagram of a binarized image of a fingerprint.
Figure 47:
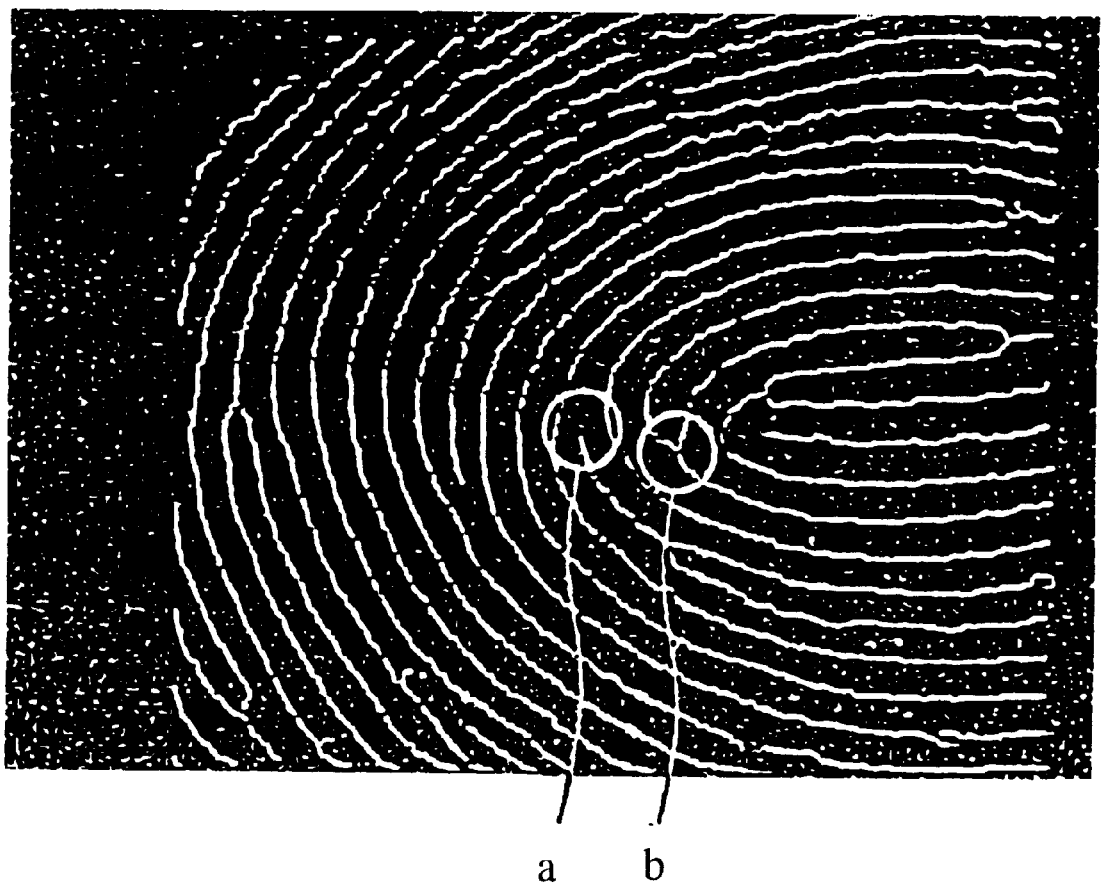
FIG. 47 is an explanatory diagram of a thinning-processed image of a fingerprint.
Figure 48A:
FIG. 48 is an explanatory diagram of a blurred fingerprint.
Figure 48B:
Figure 49A:
FIG. 49 is an explanatory diagram of a binarized image of a fingerprint.
Figure 49B:

When the pictured fingerprint image is relatively good, e.g., as shown in FIG. 46 (A), there are partial cracks but the prescribed number of minutiae can be obtained by deleting such cracks as pseudo minutiae, then the normal minutiae are registered, so that the fingerprint checking rate can be improved.

Figure 50B:

When the pictured fingerprint image is not good, e.g., when the multivalued image shown in FIG. 50(A) is binarized and thinning-processed to extract minutiae, the number of pseudo minutiae increases and the prescribed number or more of minutiae cannot be obtained by deleting the pseudo minutiae, then the spatial filtering is performed to obtain the multivalued image as shown in FIG. 50(B), for example. Then, it is binarized and thinning-processed to extract the minutiae. In this case, the number of pseudo minutiae is decreased, the deletion of the normal minutiae by the pseudo minutia deleting process can be avoided, a probability of obtaining the prescribed number or more of minutiae is enhanced, and a failure in registering the fingerprint can be prevented.

The prescribed number of minutiae in step (11) can be set to, e.g., 10 to 20, and it can be selected in accordance with the accuracy of fingerprint checking. The repeating frequency of registering operation, when the number of remaining minutiae is not equal to or more than the prescribed number, can be increased as required because identification can be made by means of a counter as described above.

INDUSTRIAL APPLICABILITY

The fingerprint registering method and fingerprint checking device according to the present invention have advantages that the average number of pseudo minutiae in registering windows is determined at the time of registering a fingerprint, the average number of pseudo minutiae is small when the fingerprint image has a good image quality while it is large when the image quality is not good, so that a numerical value can be used to indicate whether or not the fingerprint image is good; when it is equal to or less than a threshold, the fingerprint image can be judged to be registerable, and the probability of matching between the registered fingerprint with the affixed fingerprint is not lowered with the lapse of time.

And, even when multiple number of fingers are registered and all fingerprint images are NG because the average number of pseudo minutiae exceeds the threshold, a finger having the minimum average number of pseudo minutiae can be selected as the best finger and its fingerprint can be registered, so that by automatically selecting the best finger among fingers having chaps or many wrinkles, the application range of fingerprint checking can be expanded and the fingerprint checking can be made more accurate.

The fingerprint registering method and fingerprint checking entrance/exit control system according to the present invention requires to use a fingerprint registering key to register the fingerprints of at least two supervisors in the fingerprint registering device, allows to register a new fingerprint of a person by the fingerprint registering key and the matching of the fingerprints of the supervisors, and can be operated for other menus such as registering, renewal and deletion of a fingerprint for entrance/exit control and collection of entrance/exit record under double guards by the fingerprint registering key and the fingerprint matching of the supervisors, thereby improving security for entrance/exit control.

As to the supervisors, in renewing or deleting an attribute, when the remaining supervisor is one or less than a prescribed number, a request for renewing or deleting the attribute is rejected, so that the supervisors who are required at the time of registering, renewing or deleting a fingerprint are firmly secured, so that the fingerprint checking entrance/exit control system can be operated smoothly.

The fingerprint checking method according to the invention detects the direction of respective picture elements in respective blocks of a binarized fingerprint image by a direction detecting mask, converts the number of picture elements having picture elements added to correspond to the direction into a vector, adds respective vectors to determine respective direction components, determines the vector direction which becomes the maximum added value as the ridge line direction of the pertinent block, and can detect the ridge line direction for each block according to the flow of ridge lines as compared with prior art which judges as the ridge line direction a direction in which the number of picture elements merely corresponding to a direction is maximum. Therefore, when the spatial filtering is performed based on the ridge line direction to provide a multivalued image and it is binarized, the minutiae of the fingerprint can be accurately extracted from the binarized image, so that it is advantageous in improving the accuracy of checking a fingerprint.

The fingerprint checking method according to the present invention produces a conversion key number s based on an entered key number k and a content d at the n-th byte of registered fingerprint data, and inserts the conversion key number s at the m-th byte of the registered fingerprint data to store in a file, so that even when a fingerprint is registered by using the same key number k, it is substantially impossible to find where the conversion key number s is inserted when the values n, m are not known. Accordingly, the key number for checking a fingerprint does not match with respect to alteration or the like of fingerprint registering data, and it is advantageous in improving reliability in view of the entrance/exit control by checking a fingerprint and the operation control of the device or the like.

The fingerprint checking entrance/exit control system according to the present invention is an entrance/exit control system for distributed processing in which a host device and a plurality of gates are connected through a line and fingerprint checking is effected by each gate fingerprint checking unit, wherein registered fingerprint data is renewed by affixed fingerprint data at the time of personal identification, a time stamp for indicating the pertinent time is added and kept, renewal registered fingerprint data is sent upon a periodical requirement from the host device, the host device refers to the time stamp according to the collected renewal registered fingerprint data to renew the fingerprint dictionary file, and renewal registered fingerprint data corresponding to an ID is sent to the gates set to correspond to the ID, so that it has an advantage that registered fingerprint data at respective parts can be kept as the same.

The fingerprint checking device according to the present invention has advantages to allocate a local ID having the number of digits smaller than that of a normal ID to simplify the entry operation in checking a fingerprint and to improve operability. And, by setting effective time for the local ID, the local ID allocated to a person who often uses temporarily can be allocated to other persons after the lapse of effective time, thus the local ID having the less number of digits can be used effectively.

The fingerprint registering method according to the present invention processes assuming that the fingerprint image is good in a first fingerprint registering operation, and if the number of minutiae remaining after deleting pseudo minutiae is less than a prescribed number, judges that the fingerprint image is NG, and operates to register again. In such a case, the spatial filtering is effected to make a fingerprint image which has a less number of pseudo minutiae, so that the finger registering operation seldom fails and the fingerprint matching rate can be improved by registering normal minutiae.

What is claimed is:

1. A fingerprint checking method which registers fingerprint data derived from extraction of minutiae from a fingerprint, checks said registered fingerprint data with fingerprint data for checking an affixed fingerprint, and authenticates personal identification if they match, wherein a conversion key number is produced by a previously defined function from an entered key number and the content at a prescribed byte in said registered fingerprint data, said conversion key is inserted for storage, at a prescribed byte in said registered fingerprint data, and a key number entered at the time of checking the fingerprint is checked with a key number reconstructed from said conversion key number inserted at the prescribed byte of said registered fingerprint data, and the checking fingerprint data obtained from the affixed fingerprint is checked with said registered fingerprint data.

2. The fingerprint checking method according to claim 1, wherein said entered key number and the content at the n-th byte of said registered fingerprint data are added or subtracted to produce a conversion key number, said conversion key number is inserted at the m-th byte of said registered fingerprint data to store in a file, the content at said n-th byte is subtracted or added with respect to said conversion key number inserted at the m-th byte in said registered fingerprint data at checking the fingerprint to reconstruct the key number, and said reconstructed key number is checked with the entered key number.

3. A fingerprint checking method for checking a fingerprint during a fingerprint registration process, which:

produces a conversion key number by computing a content d at n-th byte of a fingerprint data in a fingerprint registration data storing file and a key number set in a key number setting register with a function previously defined, in which the computing is done with a computing unit as one of an adder, a subtracter, a multiplier, and a divider, and inserts said conversion key number at the m-th byte of the fingerprint data.

\* \* \* \* \*